(12) United States Patent
Aiba et al.

(10) Patent No.: US 10,903,225 B2
(45) Date of Patent: Jan. 26, 2021

(54) STORAGE DEVICE AND MANUFACTURING METHOD FOR THE SAME

(71) Applicant: Toshiba Memory Corporation, Minato-ku (JP)

(72) Inventors: Issui Aiba, Kuwana (JP); Kentaro Matsunaga, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 48 days.

(21) Appl. No.: 16/233,158

(22) Filed: Dec. 27, 2018

(65) Prior Publication Data

US 2020/0091243 A1 Mar. 19, 2020

(30) Foreign Application Priority Data

Sep. 19, 2018 (JP) ................................. 2018-175449

(51) Int. Cl.
*H01L 27/11578* (2017.01)
*H01L 27/24* (2006.01)
*H01L 45/00* (2006.01)

(52) U.S. Cl.
CPC .... *H01L 27/11578* (2013.01); *H01L 27/2436* (2013.01); *H01L 27/2481* (2013.01); *H01L 45/04* (2013.01); *H01L 45/1206* (2013.01); *H01L 45/1233* (2013.01); *H01L 45/1253* (2013.01)

(58) Field of Classification Search
CPC ......... H01L 27/11286; H01L 27/11293; H01L 45/1253
See application file for complete search history.

(56) References Cited

U.S. PATENT DOCUMENTS

| 8,735,299 | B2 | 5/2014 | Watanabe et al. |
| 9,685,408 | B1 | 6/2017 | Jiang et al. |
| 2016/0343725 | A1* | 11/2016 | Jung ................... H01L 27/1157 |
| 2017/0077139 | A1* | 3/2017 | Iguchi ................. H01L 21/4846 |

FOREIGN PATENT DOCUMENTS

| JP | 11-150259 | 6/1999 |
| JP | 2011-167780 | 9/2011 |
| JP | 5840973 | 1/2016 |
| JP | 2017-191937 | 10/2017 |

\* cited by examiner

*Primary Examiner* — Cheung Lee
(74) *Attorney, Agent, or Firm* — Oblon, McClelland, Maier & Neustadt, L.L.P.

(57) ABSTRACT

A storage device according to embodiments includes a substrate, a stacked body, a first region, a second region, and first to nth electrodes. The stacked body is provided on the substrate and having first to nth (n is an integer of 3 or more) conductive layers stacked in a direction perpendicular to a surface of the substrate. The first region includes a part of the stacked body, and has a first step structure including the first to the nth conductive layers. The second region includes a part of the stacked body, and has a second step structure different from the first step structure including at least a part of the first to nth conductive layers. The first to nth electrodes are provided in the first region and connected to the first to nth conductive layers and extend in a direction perpendicular to the surface of the substrate.

8 Claims, 45 Drawing Sheets

FIG.13A
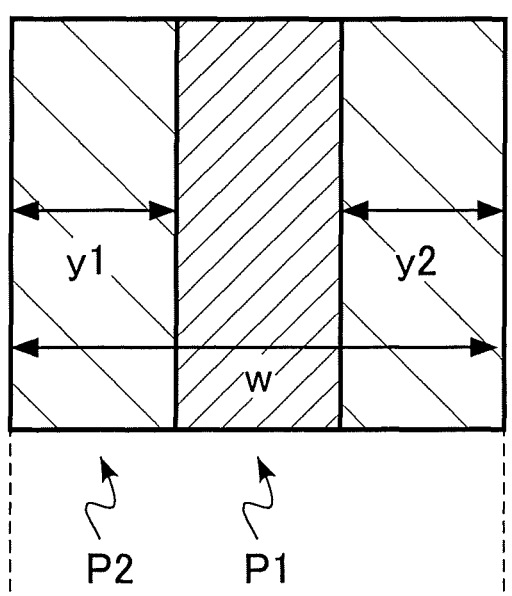
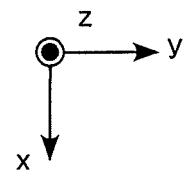
FIG.13B
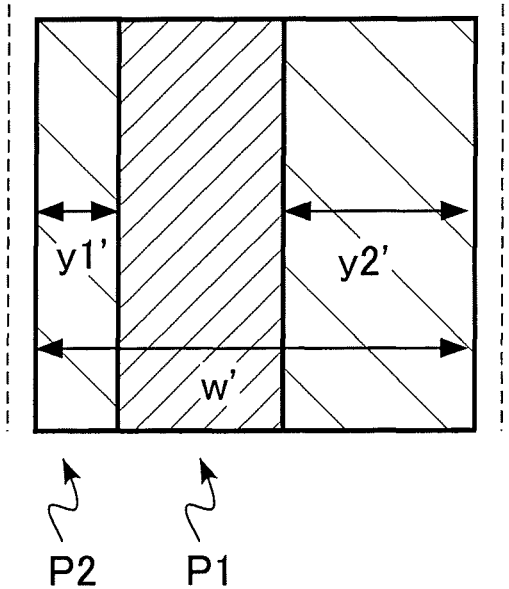
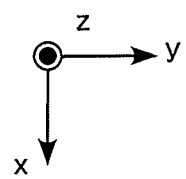

FIG.17
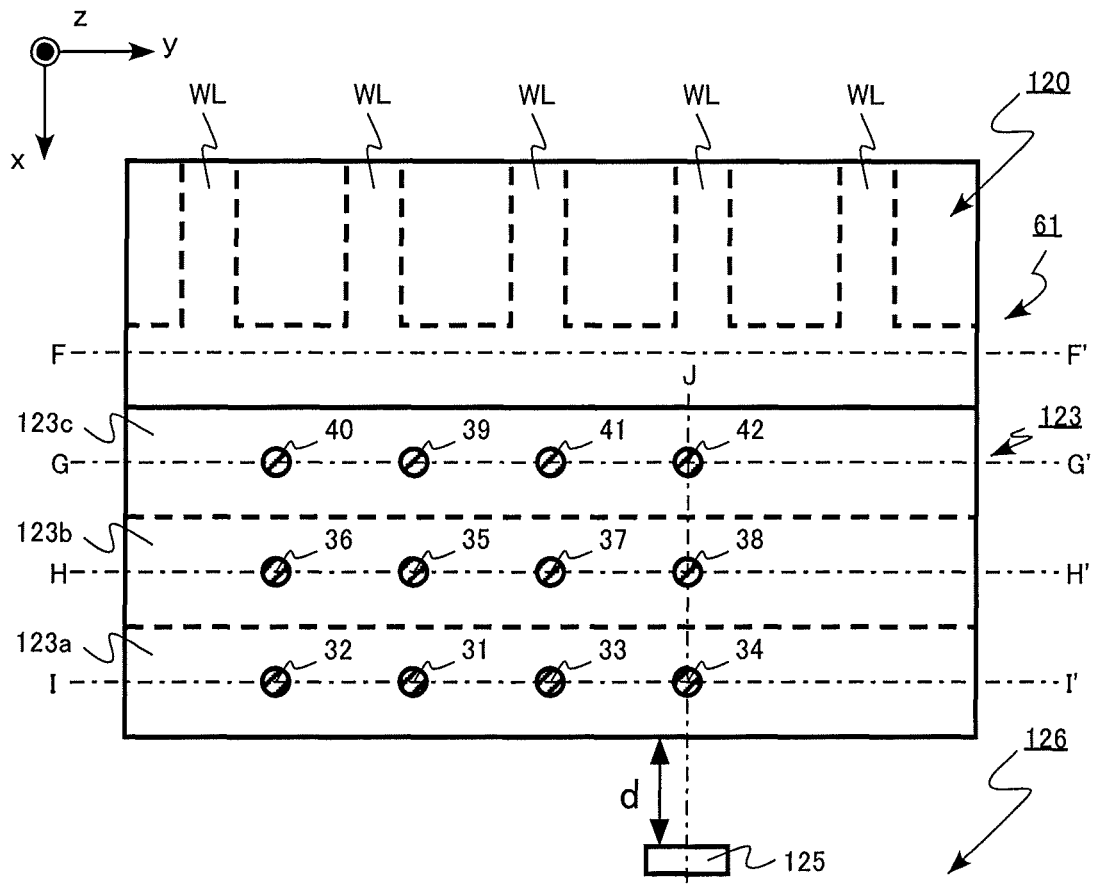
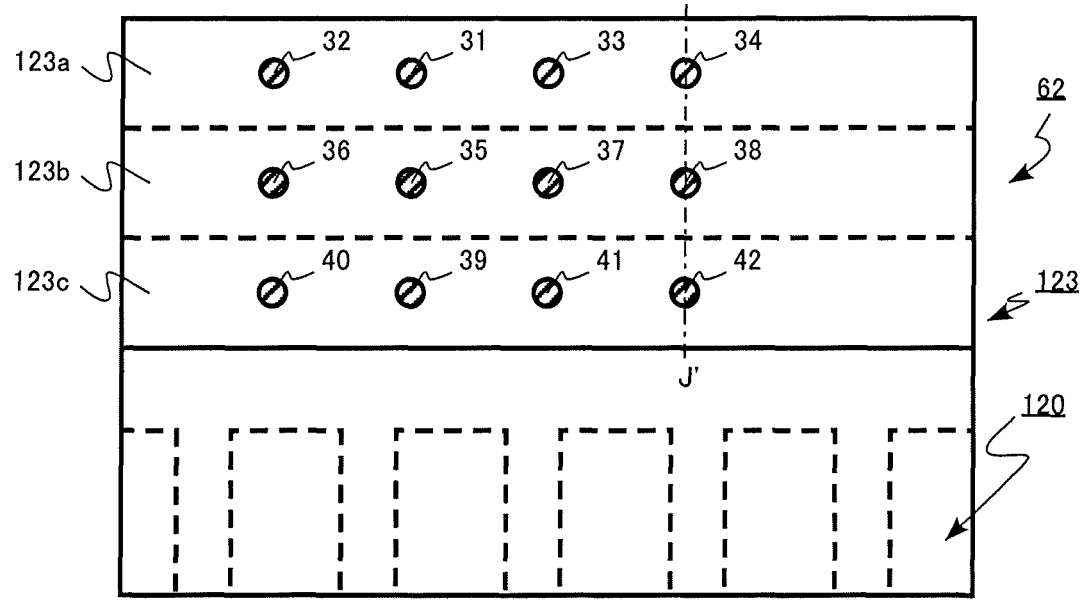

STORAGE DEVICE AND MANUFACTURING METHOD FOR THE SAME

CROSS-REFERENCE TO RELATED APPLICATION

This application is based upon and claims the benefit of priority from Japanese Patent Application No. 2018-175449, filed on Sep. 19, 2018, the entire contents of which are incorporated herein by reference.

FIELD

Embodiments described herein relate generally to a storage device and a storage device manufacturing method.

BACKGROUND

A three-dimensional memory in which memory cells are three-dimensionally disposed has been put into practical use in order to achieve large integration of storage devices. In a three-dimensional memory, it is necessary to form contact electrodes for applying a voltage or a current to stacked conductive layers.

The contact electrodes are connected to the conductive layers drawn out from a memory cell array in a contact region adjacent to the memory cell array. An increase in the area of the contact region is undesirable since it leads to an increase in chip area. In particular, as the number of conductive layers to be stacked increases due to large integration, the number of contact electrodes and the area of the contact region also increases. In order to reduce the chip area of a three-dimensional memory, it is desired to reduce the area of the contact region.

BRIEF DESCRIPTION OF THE DRAWINGS

FIGS. 13A and 13B are explanatory views of examples of a measuring method using a mark region;

FIG. 17 is a schematic diagram of a memory cell array, a contact region, and a mark region according to the second embodiment;

DETAILED DESCRIPTION

Figure 1:
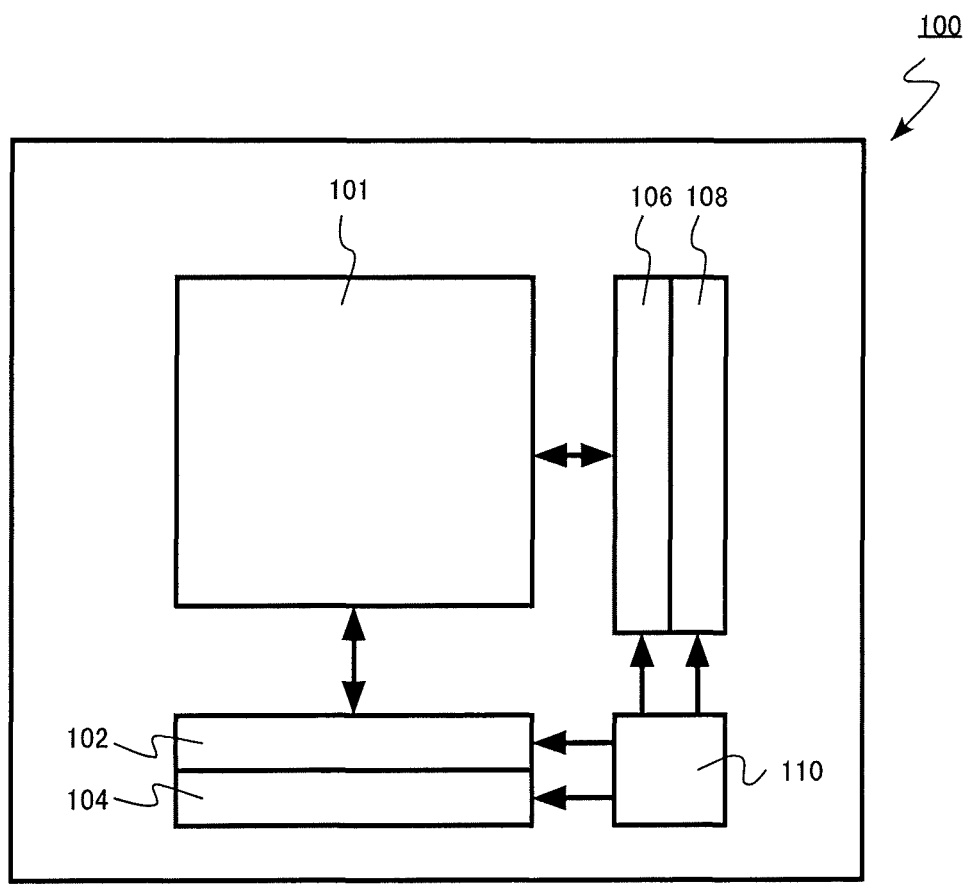
FIG. 1 is a block diagram of a storage device according to a first embodiment.

A storage device according to embodiments includes a substrate; a stacked body provided on the substrate, and the stacked body having first to nth (n is an integer of 3 or more) conductive layers stacked in a direction perpendicular to a surface of the substrate; a first region including one part of the stacked body, and the first region having a first step structure including the first to the nth conductive layers; a second region including another part of the stacked body, the second region having a second step structure including at least a part of the first to the nth conductive layers, and the second step structure being different from the first step structure; and first to nth electrodes provided in the first region, the first to nth electrodes connected to the first to nth conductive layers, and the first to nth electrodes extending in a direction perpendicular to the surface of the substrate.

Embodiments of the present disclosure will be described below with reference to the drawings. In description below, same or similar members will be denoted by same reference characters, and description of members already described will be appropriately omitted.

In the present specification, the terms "above" and "bottom" are used for convenience. "Above" or "bottom" is a term indicating a relative positional relationship within a drawing and is not a term that defines a positional relationship with respect to gravity.

Hereinafter, a storage device according to the embodiments described herein will be described with reference to the drawings.

First Embodiment

A storage device according to a first embodiment includes a substrate, a stacked body, a first region, a second region, and first to nth electrodes. The stacked body is provided on the substrate and having first to nth (n is an integer of 3 or more) conductive layers stacked in a direction perpendicular to a surface of the substrate. The first region includes a part of the stacked body, and the first to nth conductive layers have a first step structure in the first region. The second region includes a part of the stacked body, and at least a part of the first to nth conductive layers have a second step structure different from the first step structure in the second region. The first to nth electrodes are provided in the first region and connected to the first to the nth conductive layers and extend in a direction perpendicular to the surface of the substrate.

n is an integer of 3 or more. For example, n is an integer of 4 or more.

In the first embodiment, the case of n=8 will be described as an example.

FIG. 1 is a block diagram of the storage device according to the first embodiment. The storage device of the first embodiment has a vertical Bit Line structure. For example, it is a resistance change type memory (Resistive Random Access Memory: ReRAM) having a vertical Bit Line structure. A resistance change type memory 100 of the first embodiment is, for example, a semiconductor chip.

As indicated in FIG. 1, the resistance change type memory 100 includes a memory region 101, a word line driver circuit 102, a row decoder circuit 104, a sense amplifier circuit 106, a column decoder circuit 108, and a control circuit 110.

Figure 2:
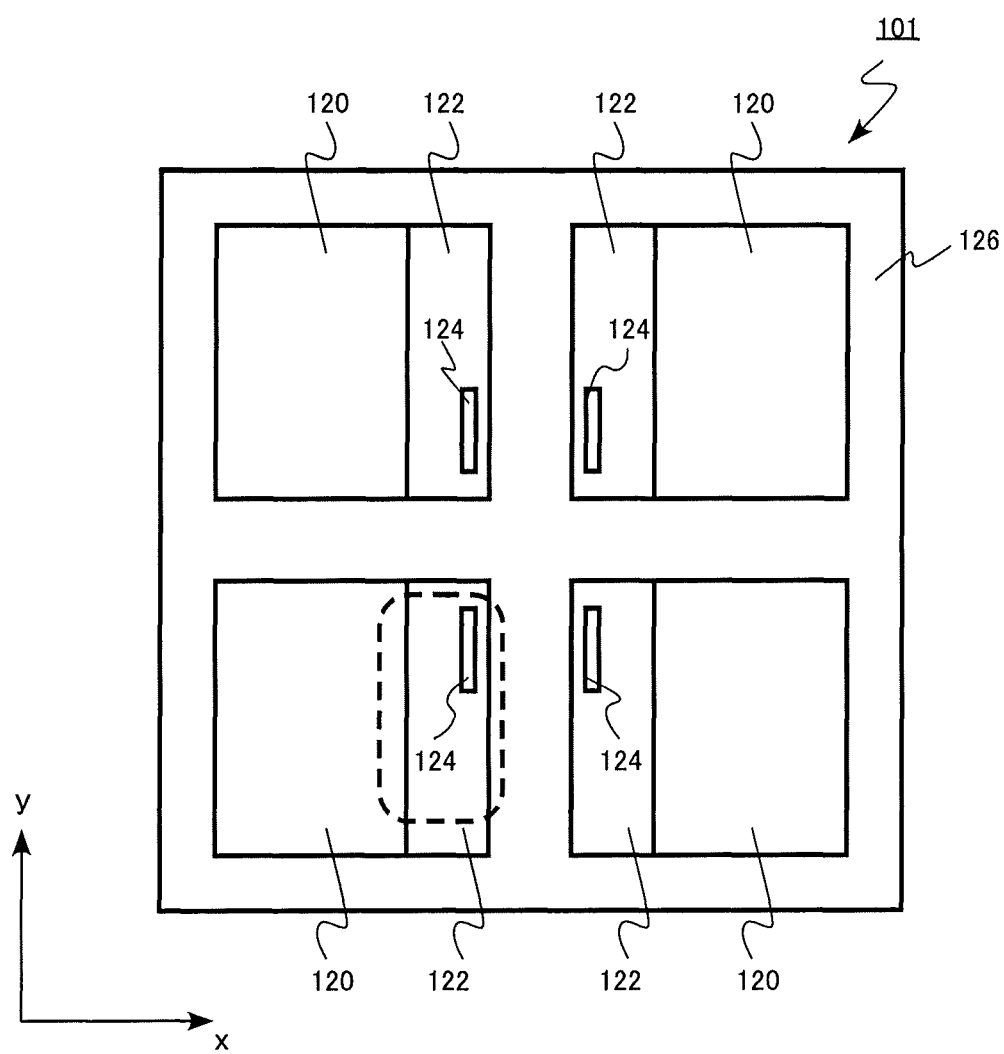
FIG. 2 is a schematic view of a memory region of the storage device according to the first embodiment.

FIG. 2 is a schematic diagram of the memory region 101 of the storage device of the first embodiment. The memory region 101 of the resistance change type memory 100 has a memory cell array 120, a contact region 122 (first region), a mark region 124 (second region), and a stacked body peripheral portion 126 (peripheral portion). The resistance change type memory 100 has, for example, four memory cell arrays 120 and four contact regions 122. The contact region 122 is provided adjacent to the memory cell array 120. The mark region 124 is provided so as to be surrounded by the contact region 122, for example.

Figure 3:
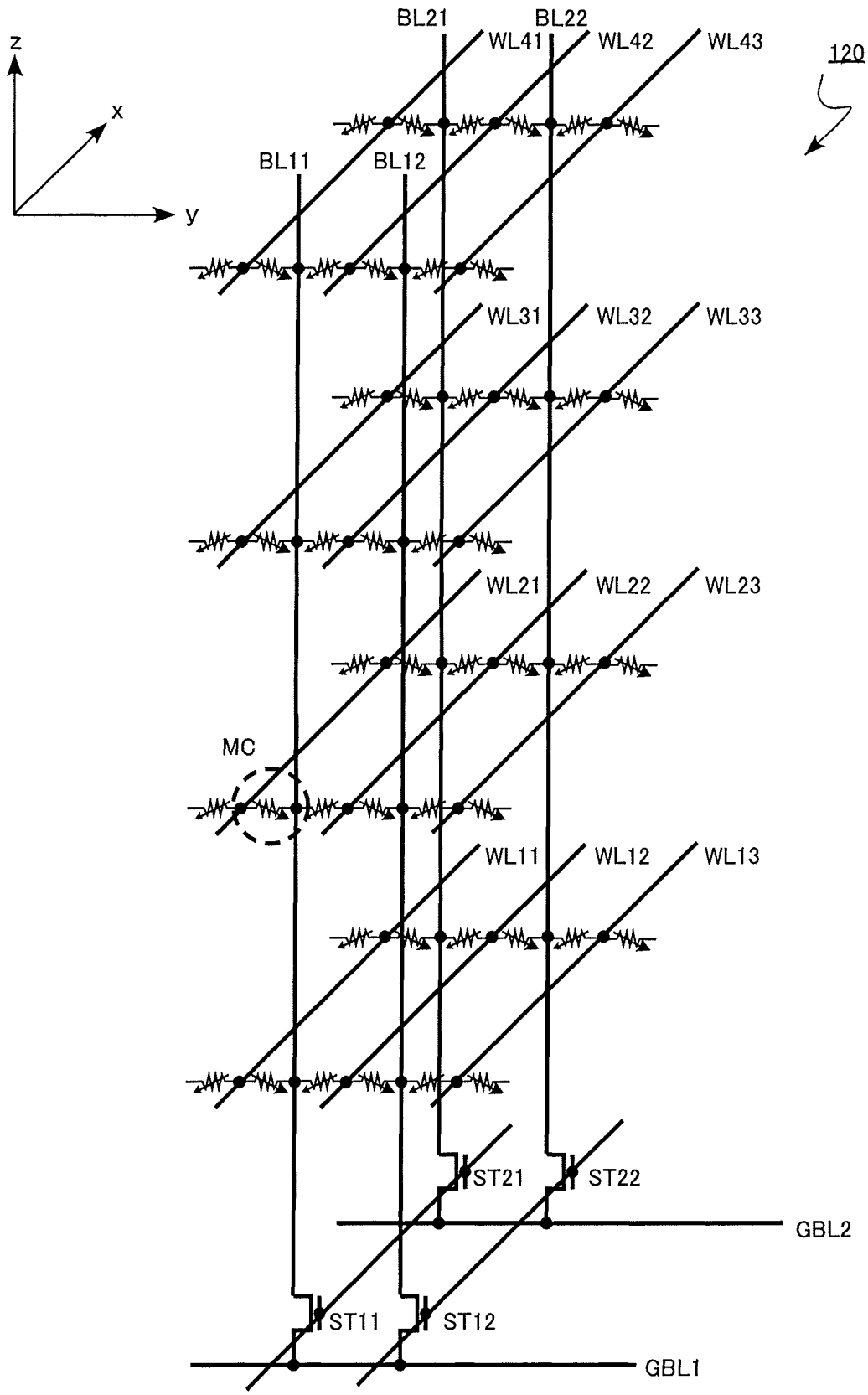
FIG. 3 is an equivalent circuit diagram of a memory cell array according to the first embodiment.

FIG. 3 is an equivalent circuit diagram of the memory cell array 120 according to the first embodiment. FIG. 3 schematically indicates a wiring structure in the memory cell array. The memory cell array 120 of the first embodiment has a three-dimensional structure in which memory cells MC are three-dimensionally disposed.

As indicated in FIG. 3, a plurality of memory cells MC is three-dimensionally disposed in the memory cell array 120. In FIG. 3, a region surrounded by a broken line is one memory cell MC. The memory cell MC is a two-terminal resistance change element. The memory cell MC includes a resistance change layer.

The memory cell array 120 includes, for example, a plurality of word lines WL (WL11, WL12, WL13, WL21, WL22, WL23, WL31, WL32, WL33, WL41, WL42, and WL43) and a plurality of bit lines BL (BL11, BL12, BL21, and BL22). The word lines WL are examples of a conductive layer.

The word lines WL extend in the x direction (first direction). The word lines WL are disposed side by side in the y direction (second direction). The bit lines BL extend in the z direction (third direction). The word lines WL cross the bit lines BL vertically. The memory cells MC are disposed at intersections of the word lines WL and the bit lines BL. A region surrounded by a broken line is one memory cell MC. A resistance change layer of the memory cell MC is provided between the word line WL and the bit line BL.

A plurality of the word lines WL is electrically connected to the row decoder circuit 104. A contact region 122 is provided between the memory cell array 120 and the row decoder circuit 104. In the contact region 122, a contact electrode for applying a current to the word line WL is formed.

A plurality of the bit lines BL is connected to the sense amplifier circuit 106. Selection transistors ST (ST11, ST21, ST12, and ST22) and global bit lines GBL (GBL1 and GBL2) are provided between a plurality of the bit lines BL and the sense amplifier circuit 106. The global bit lines GBL extend in the y direction.

The row decoder circuit 104 has a function of selecting the word line WL according to an input row address signal. The word line driver circuit 102 has a function of applying a predetermined voltage to the word line WL selected by the row decoder circuit 104.

The column decoder circuit 108 has a function of selecting the bit line BL according to an input column address signal. The sense amplifier circuit 106 has a function of applying a predetermined voltage to the bit line BL selected by the column decoder circuit 108. In addition, the sense amplifier circuit 106 has a function of amplifying by detecting a current flowing between the selected word line WL and the selected bit line BL.

The control circuit 110 has a function of controlling the word line driver circuit 102, the row decoder circuit 104, the sense amplifier circuit 106, the column decoder circuit 108, and other circuits (not illustrated).

Circuits such as the word line driver circuit 102, the row decoder circuit 104, the sense amplifier circuit 106, the column decoder circuit 108, and the control circuit 110 include, for example, a transistor and a wiring layer using a semiconductor substrate (not illustrated).

Figure 4:
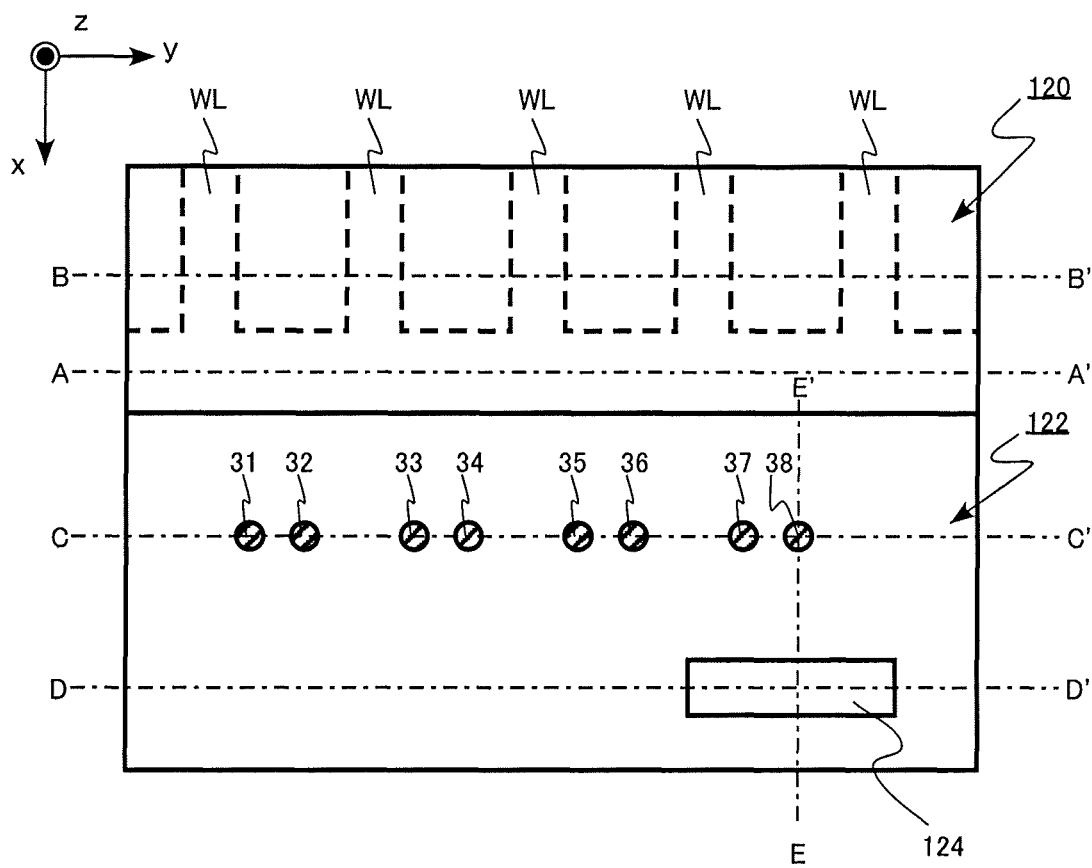
FIG. 4 is a schematic diagram of a memory cell array, a contact region, and a mark region according to the first embodiment.

FIG. 4 is a schematic diagram of the memory cell array 120, the contact region 122, and the mark region 124 of the first embodiment. FIG. 4 is a top view of a region surrounded by a dotted line in FIG. 2.

Figure 5A:
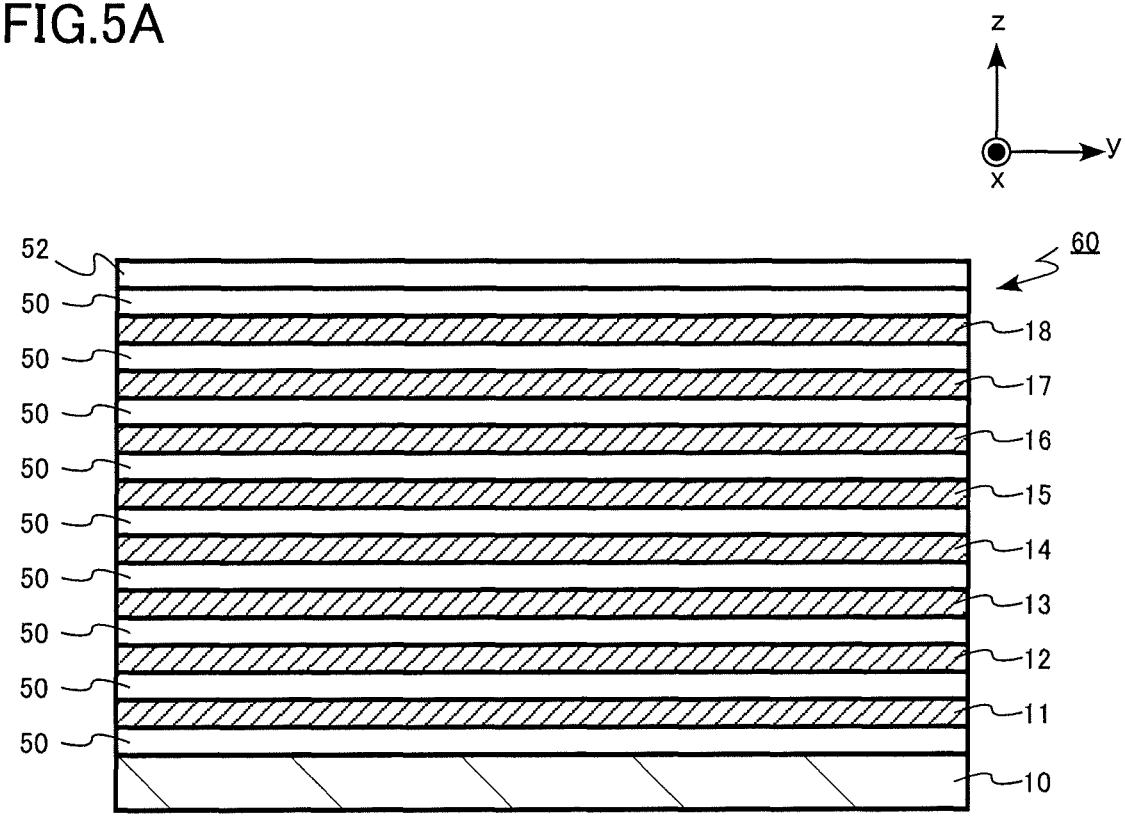
FIGS. 5A and 5B are schematic cross-sectional views of the memory cell array according to the first embodiment.
Figure 5B:
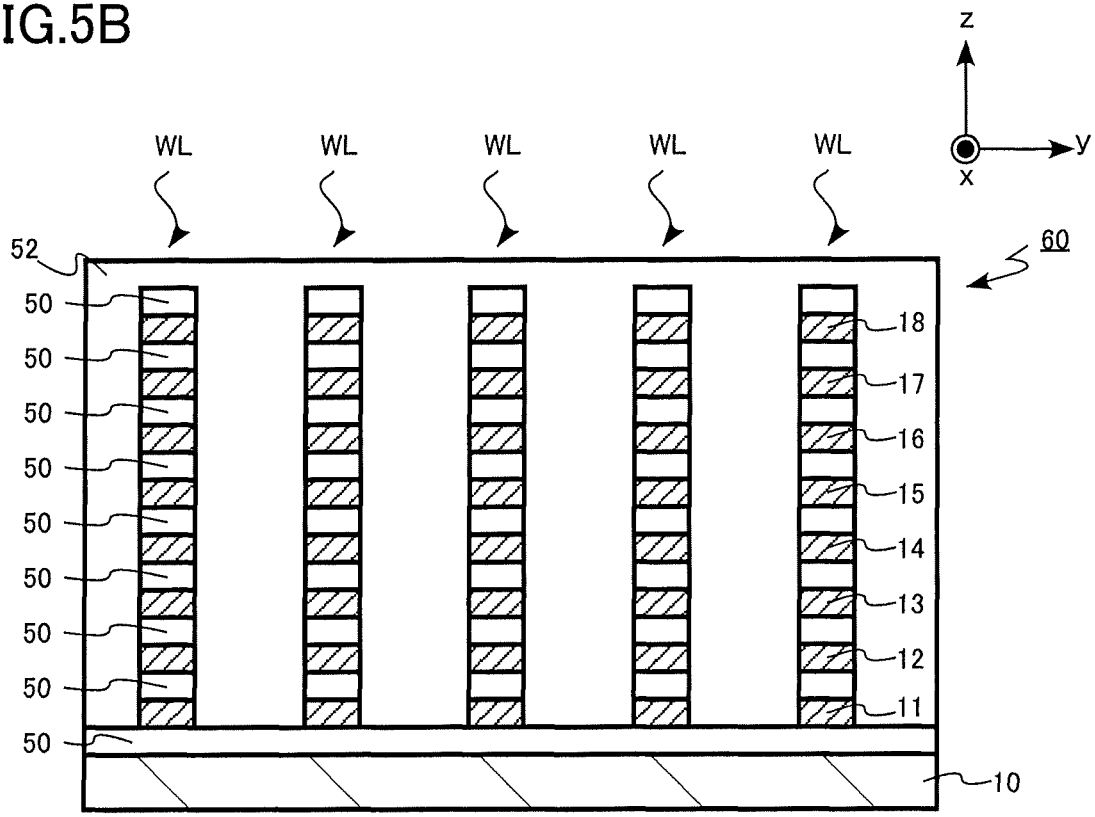

FIGS. 5A and 5B are schematic cross-sectional views of the memory cell array 120 of the first embodiment. FIG. 5A is a cross-sectional view taken along line AA' of FIG. 4. FIG. 5B is a cross-sectional view taken along line BB' of FIG. 4.

Figure 6A:
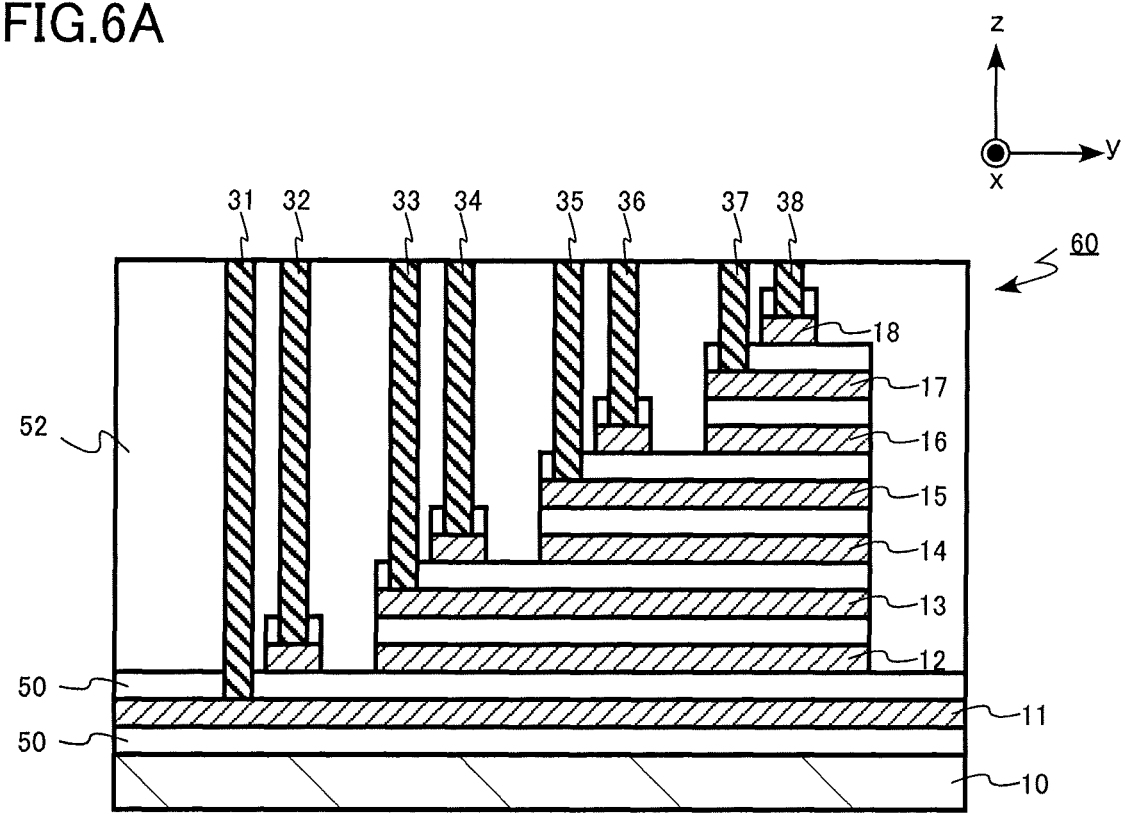
FIGS. 6A and 6B are schematic cross-sectional views of the contact region according to the first embodiment.
Figure 6B:
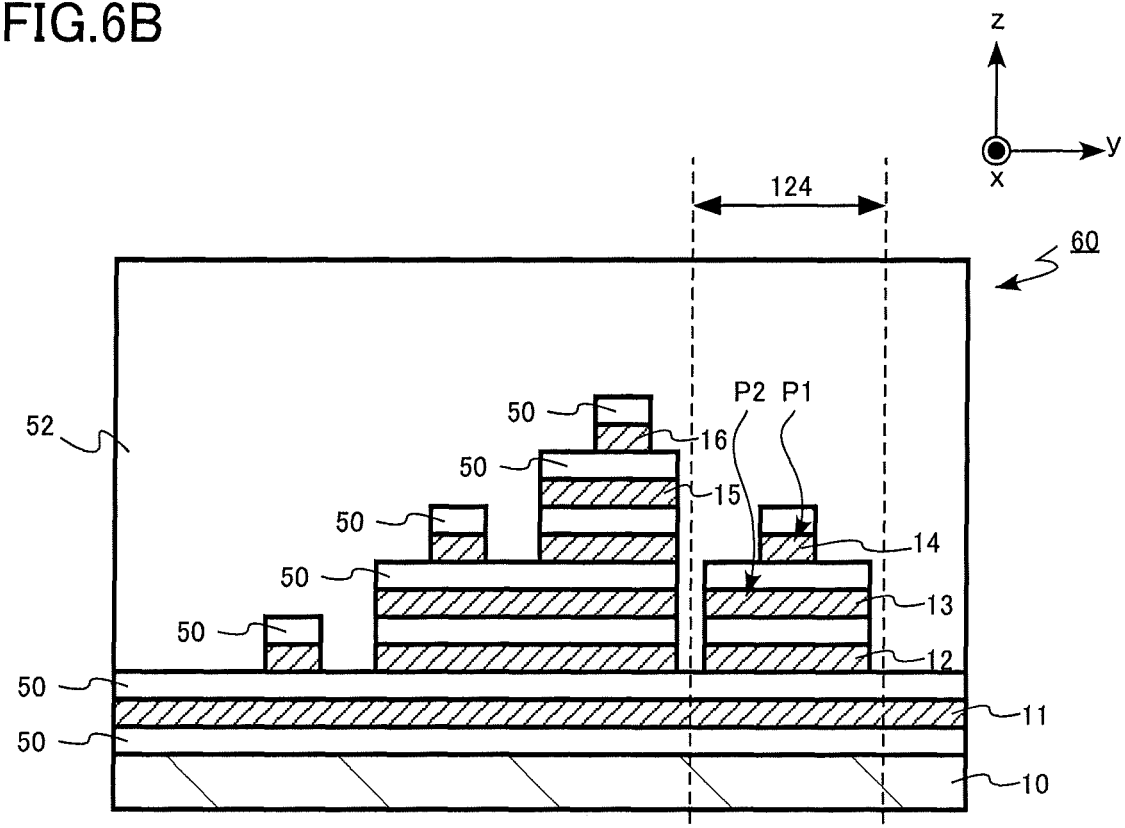

FIGS. 6A and 6B are schematic cross-sectional views of the contact region 122 of the first embodiment. FIG. 6A is a cross-sectional view taken along line CC' of FIG. 4. FIG. 6B is a cross-sectional view taken along line DD' of FIG. 4. FIG. 6B includes a cross section of the mark region 124.

Figure 7:
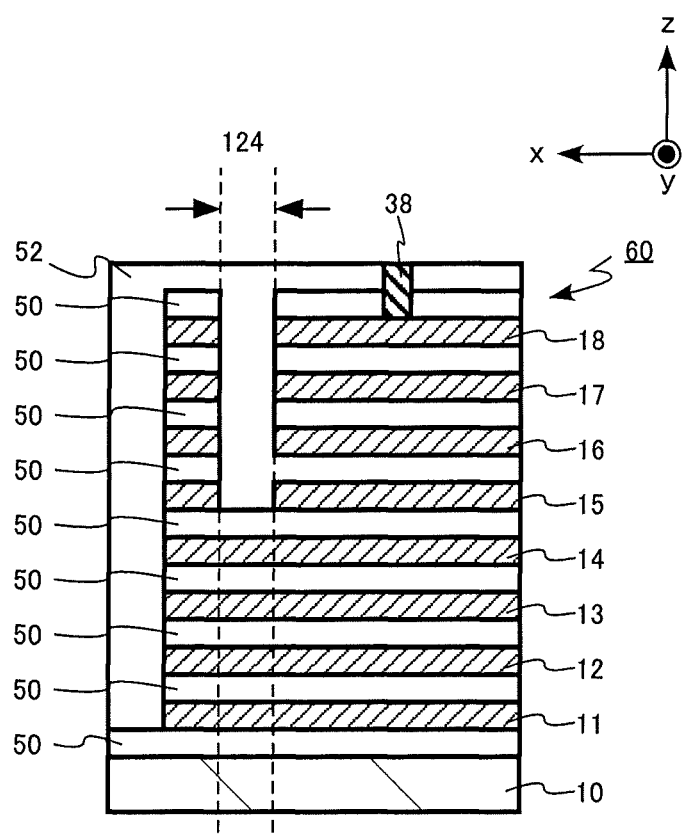
FIG. 7 is a schematic cross-sectional view of the contact region according to the first embodiment.

FIG. 7 is a schematic cross-sectional view of the contact region 122 according to the first embodiment. FIG. 7 is a cross-sectional view taken along line EE' in FIG. 4. FIG. 7 includes a cross section of the mark region 124.

The memory cell array 120 includes a substrate 10, a first conductive layer 11, a second conductive layer 12, a third conductive layer 13, a fourth conductive layer 14, a fifth conductive layer 15, a sixth conductive layer 16, a seventh conductive layer 17, an eighth conductive layer 18, first insulating layers 50, and a second insulating layer 52.

The contact region 122 includes the substrate 10, the first conductive layer 11, the second conductive layer 12, the third conductive layer 13, the fourth conductive layer 14, the fifth conductive layer 15, the sixth conductive layer 16, the seventh conductive layer 17, the eighth conductive layer 18, a first contact electrode 31, a second contact electrode 32, a third contact electrode 33, a fourth contact electrode 34, a fifth contact electrode 35, a sixth contact electrode 36, a seventh contact electrode 37, an eighth contact electrode 38, the first insulating layers 50, and the second insulating layer 52.

The mark region 124 includes the substrate 10, the first conductive layer 11, the second conductive layer 12, the third conductive layer 13, the fourth conductive layer 14, the fifth conductive layer 15, the first insulating layers 50, and the second insulating layer 52.

The substrate 10 is, for example, a semiconductor substrate. The semiconductor substrate 10 is, for example, a single crystal silicon substrate.

The first conductive layer 11, the second conductive layer 12, the third conductive layer 13, the fourth conductive layer 14, the fifth conductive layer 15, the sixth conductive layer 16, the seventh conductive layer 17, and the eighth conductive layer 18 are examples of the first to nth conductive layers.

The first to eighth conductive layers 11 to 18 are stacked in the z direction perpendicular to a surface of the substrate 10. The first to eighth conductive layers 11 to 18 are parallel to the x direction and the y direction.

The first insulating layers 50 are interposed between the first to eighth conductive layers 11 to 18. The first to eighth conductive layers 11 to 18 and the first insulating layers 50 are included in the stacked body 60.

The stacked body 60 includes at least one layer of the first to eighth conductive layers 11 to 18 which are physically continuous with portions of the first to eighth conductive layers 11 to 18 forming the word lines WL in the memory cell array 120. For example, a portion extending in the x direction or the y direction of only one layer of the first conductive layer 11 forming the word lines WL in the memory cell array 120 corresponds to the stacked body 60.

The first to eighth conductive layers 11 to 18 are, for example, metals or semiconductors containing conductive impurities. The metal is, for example, tungsten (W), titanium nitride (TiN), or tungsten nitride (WN). The semiconductor containing a conductive impurity is, for example, n-type or p-type polycrystalline silicon.

A part of the first to eighth conductive layers 11 to 18 are patterned in the memory cell array 120 to form a plurality of the word lines WL.

The first insulating layers 50 are, for example, silicon oxide, silicon nitride, or silicon oxynitride. The first insulating layer 50 is, for example, a stacked structure of a material selected from silicon oxide, silicon nitride, and silicon oxynitride.

The second insulating layer 52 covers the first to eighth conductive layers 11 to 18 and the first insulating layers 50. The second insulating layer 52 is, for example, silicon oxide.

The contact region 122 is located at an end portion of the stacked body 60.

The contact region 122 includes the first contact electrode 31, the second contact electrode 32, the third contact electrode 33, the fourth contact electrode 34, the fifth contact electrode 35, the sixth contact electrode 36, the seventh contact electrode 37, and the eighth contact electrode 38. The first to eighth contact electrodes 31 to 38 are examples of the first to nth electrodes.

In the contact region 122, the first to eighth conductive layers 11 to 18 have a first step structure. The first to eighth contact electrodes 31 to 38 are connected to the first to eighth conductive layers 11 to 18, respectively.

The first to eighth contact electrodes 31 to 38 are connected to eighth conductive layers 11 to 18 at flat portions (hereinafter referred to as terraces) of the first step structure of the first to eighth conductive layers 11 to 18. The first to eighth contact electrodes 31 to 38 extend in the z direction perpendicular to a surface of the substrate 10 in the second insulating layer 52.

The first to eighth contact electrodes 31 to 38 are, for example, metals. The metal is, for example, tungsten (W), titanium nitride (TiN), or tungsten nitride (WN).

The mark region 124 is located at an end portion of the stacked body 60. The mark region 124 is surrounded by the contact region 122. In the mark region 124, at least a part of the first to eighth conductive layers 11 to 18 have a second step structure.

The second step structure is different from the first step structure. "Two step structures are different" means that at least two step structures are discontinuous in the x or y direction. The mark region 124 is a discontinuous unique area with the contact region 122. That is, the regularity of the step structure is different between the mark region 124 and the contact region 122.

The mark region 124 has a measurement mark. The measurement mark is composed of, for example, a first pattern P1 and a second pattern P2. The first pattern P1 is formed of the fourth conductive layer 14. The second pattern P2 is formed of the third conductive layer 13.

The third conductive layer 13 is an example of the kth conductive layer. The fourth conductive layer 14 is an example of the (k+1)th conductive layer.

The first pattern P1 and the second pattern P2 extend in the x direction. The width in the y direction of the first pattern P1 is narrower than the width in the y direction of the second pattern P2.

In the mark region 124, the fifth conductive layer 15 to the eighth conductive layer 18 are not included. The fifth conductive layer 15 to the eighth conductive layer 18 are disposed on both sides of the mark region 124 in the x direction. The mark region 124 has a recessed shape in an xz cross section.

The first pattern P1 and the second pattern P2 are measurement marks for measuring misalignment and dimensions in a lithography process or those obtained by transferring the measurement marks through a subsequent manufacturing process.

Next, a storage device manufacturing method according to the first embodiment will be described. FIGS. 8A, 8B, 9A, 9B, 10A, 10B, 11A, 11B, 12A, 12B, 14A, 14B, 15A, and 15B are schematic cross-sectional views in the process of manufacturing the storage device according to the first embodiment. FIGS. 8A, 9A, 10A, 11A, 12A, 14A, and 15A are cross sections corresponding to CC' cross section of FIG. 4. FIGS. 8B, 9B, 10B, 11B, 12B, 14B, and 15B are cross sections corresponding to DD' cross section of FIG. 4. FIGS. 13A and 13B are explanatory views of an example of a measurement method using the mark region 124.

A storage device manufacturing method according to the first embodiment includes forming first to nth (n is an integer of 3 or more) conductive layers stacked in a direction perpendicular to the surface of a substrate on the substrate; forming a first region having a first step structure including the first to nth conductive layers by using a plurality of lithography processes and a plurality of etching processes; forming an electrode connected to at least one of the first to nth conductive layers in the first region, the electrode extending in a direction perpendicular to the surface of the substrate; forming a first pattern on the pth (3≤p≤n) conductive layer by first lithography process being one of the plurality of lithography processes and one of the plurality of etching process; covering the first pattern with a resist in the second lithography process being another one of the plurality of lithography processes; forming a second pattern in the qth (q≤p−1) conductive layer by another one of the plurality of etching process after covering the first pattern with a resist; and providing an opening portion in a resist pattern so as to expose a first end portion of the first pattern and a second end portion of the second pattern in the third lithography process being the other one of the plurality of lithography processes.

In addition, the storage device manufacturing method according to the first embodiment includes forming, on a substrate, first to nth (n is an integer of 3 or more) conductive layers stacked in a direction perpendicular to a surface of the substrate; forming a first region having a first step structure including the first to nth conductive layers by using first to mth (m is an integer of 3 or more and n or less) lithography processes and a plurality of etching processes; forming an electrode connected to at least one of the first to nth conductive layers in the first region, the electrode extending in a direction perpendicular to a surface of the substrate; forming a first pattern on the pth (3≤p≤n) conductive layer by the sth (1≤s≤m−2) lithography process and one of the plurality of etching processes; covering the first pattern with a resist in the (s+1)th lithography process; forming a second pattern in the (p−1)th conductive layer by another one of the etching process after covering the first pattern with a resist; and providing an opening portion in a resist pattern so as to expose a first end portion of the first pattern and a second end portion of the second pattern in the (s+2)th lithography process.

n is an integer of 3 or more. For example, n is an integer of 4 or more.

Hereinafter, the case where the first lithography process is the sth lithography process (1≤s≤m−2), the second lithography process is the (s+1)th lithography process, and the third lithography process is the (s+2)th lithography process will be described as an example. That is, the case where the first lithography process, the second lithography process, and the third lithography process are three continuous lithography processes will be described as an example. However, each of the first lithography process, the second lithography process, and the third lithography process is not necessarily continuous.

Further, hereinafter, the case where the qth (q≤p−1) conductive layer is the (p−1)th conductive layer will be described as an example. That is, the case where the pth conductive layer and the qth conductive layer are vertically adjacent conductive layers will be described as an example. However, another conductive layer may be included between the pth conductive layer and the qth conductive layer.

The case where n=8, m=3, s=1, and p=8 will be described below as an example.

Among manufacturing methods of the resistance change type memory 100, methods of manufacturing the contact region 122 and the mark region 124 will be described in detail below.

Figure 8A:
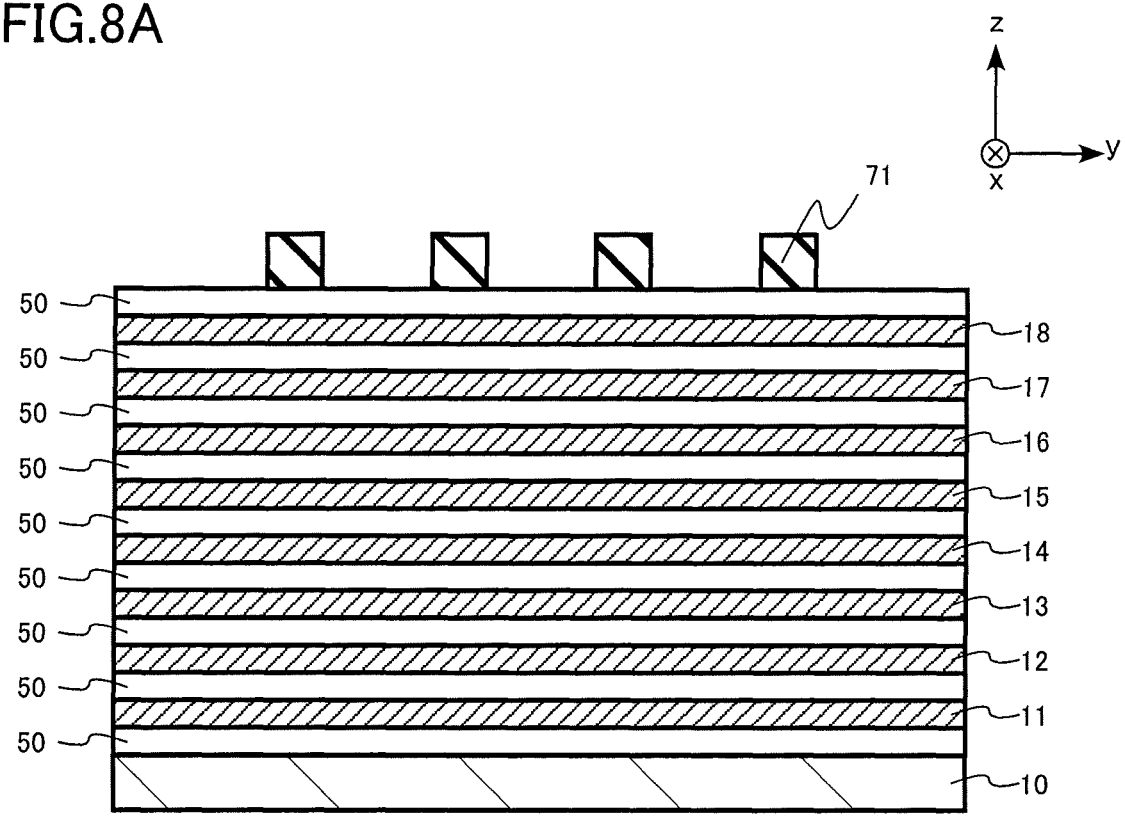
FIGS. 8A and 8B are schematic cross-sectional views in the process of manufacturing the storage device according to the first embodiment.
Figure 8B:
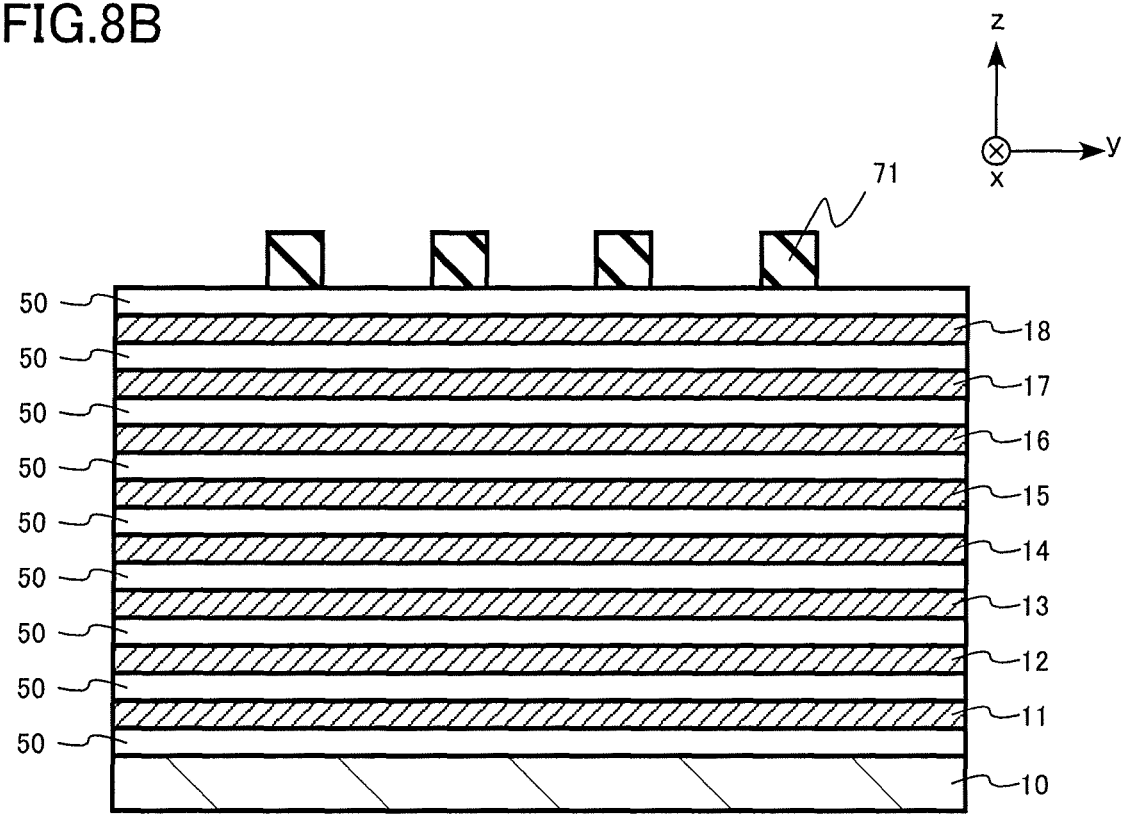

First, the first to eighth conductive layers 11 to 18 are stacked on the substrate 10 in the z direction perpendicular to a surface of the substrate 10 so as to interpose the first insulating layer 50 between them. Next, in the first lithography process, a first resist 71 is patterned (FIGS. 8A and 8B). For forming the first insulating layer 50 and the first to eighth conductive layers 11 to 18, for example, a chemical vapor deposition method (CVD method) is used.

Figure 9A:
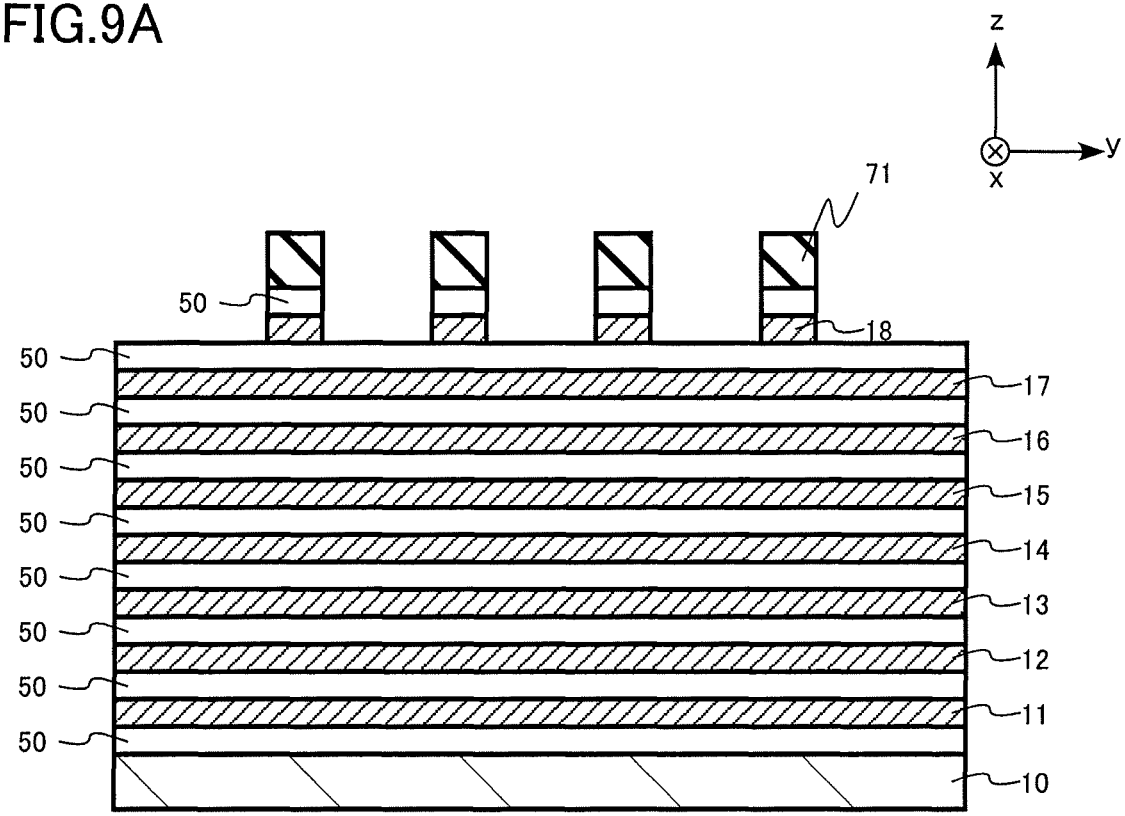
FIGS. 9A and 9B are schematic cross-sectional views in the process of manufacturing the storage device according to the first embodiment.
Figure 9B:
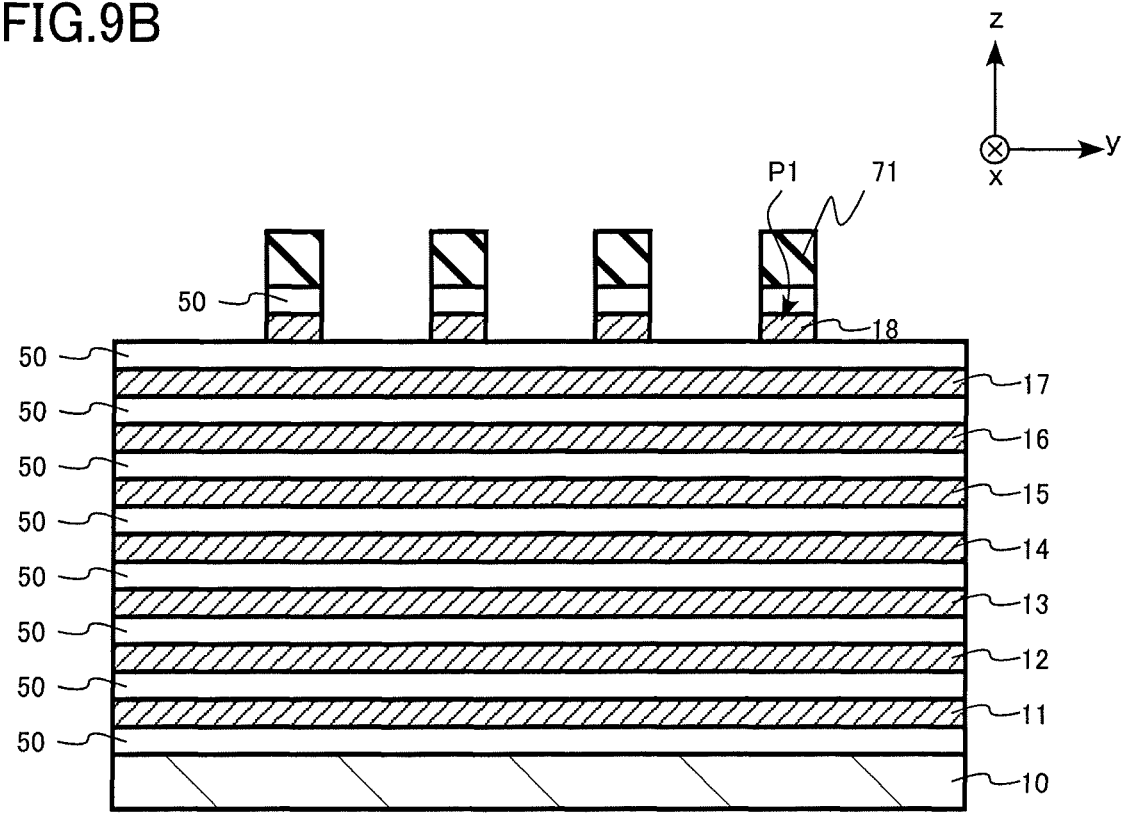

Next, in the first etching process, the eighth conductive layer 18 is etched using the first resist 71 as a mask. For etching, for example, a reactive ion etching method (RIE method) is used. By the first etching process, the first pattern P1 is formed on the eighth conductive layer 18 (FIGS. 9A and 9B).

Figure 10A:
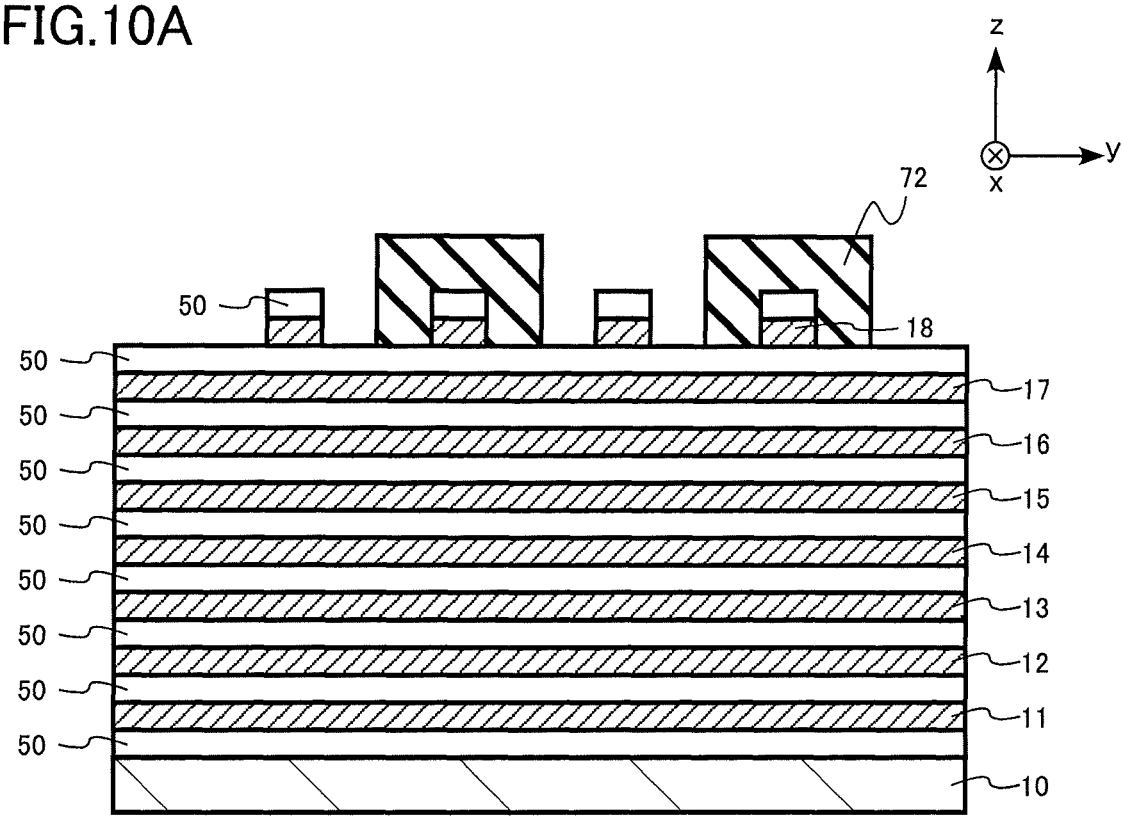
FIGS. 10A and 10B are schematic cross-sectional views in the process of manufacturing the storage device according to the first embodiment.
Figure 10B:
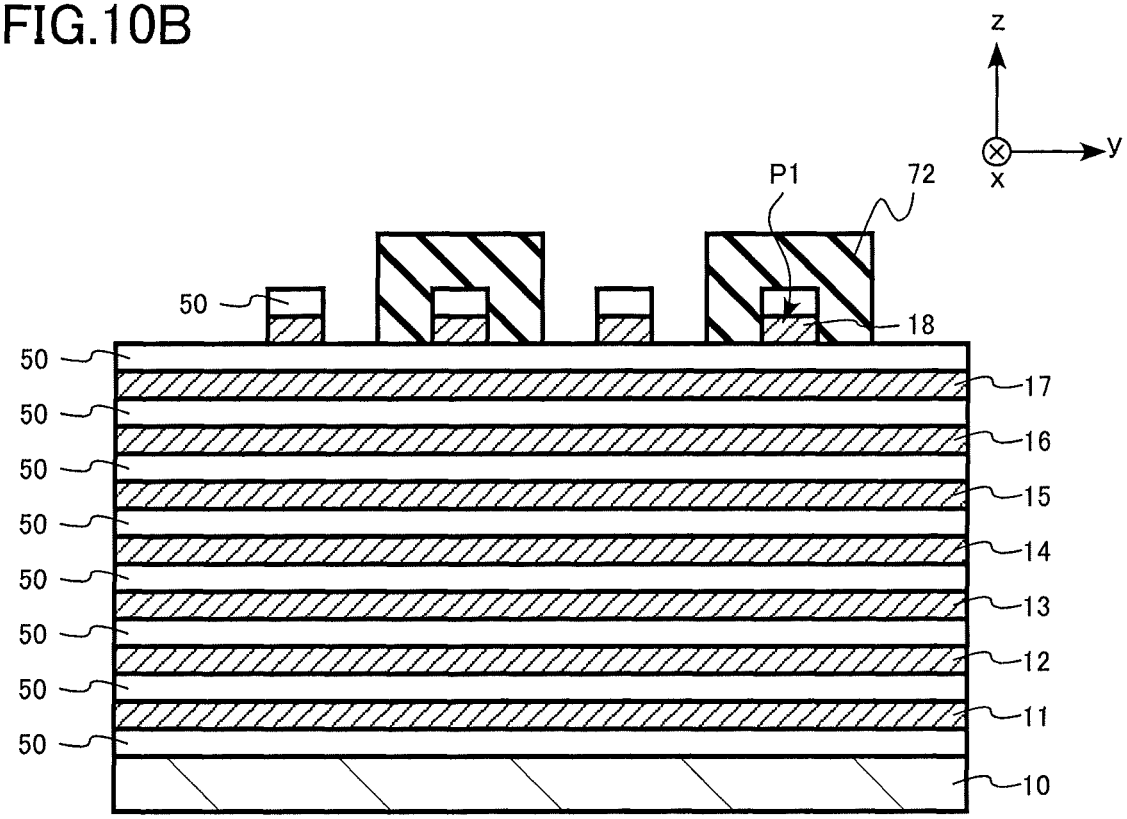

Next, the first resist 71 is removed, and in the second lithography process, a second resist 72 is patterned (FIGS. 10A and 10B). At this time, the first pattern P1 is covered with the second resist 72.

Figure 11A:
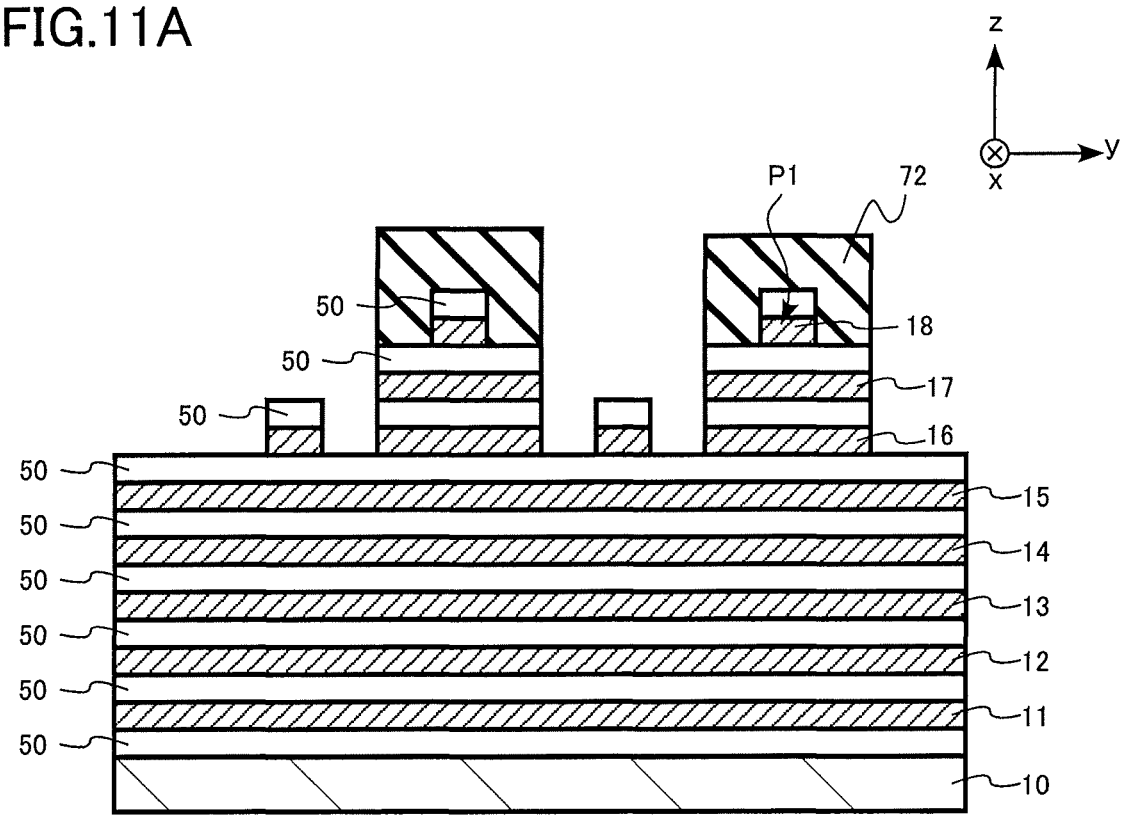
FIGS. 11A and 11B are schematic cross-sectional views in the process of manufacturing the storage device according to the first embodiment.
Figure 11B:
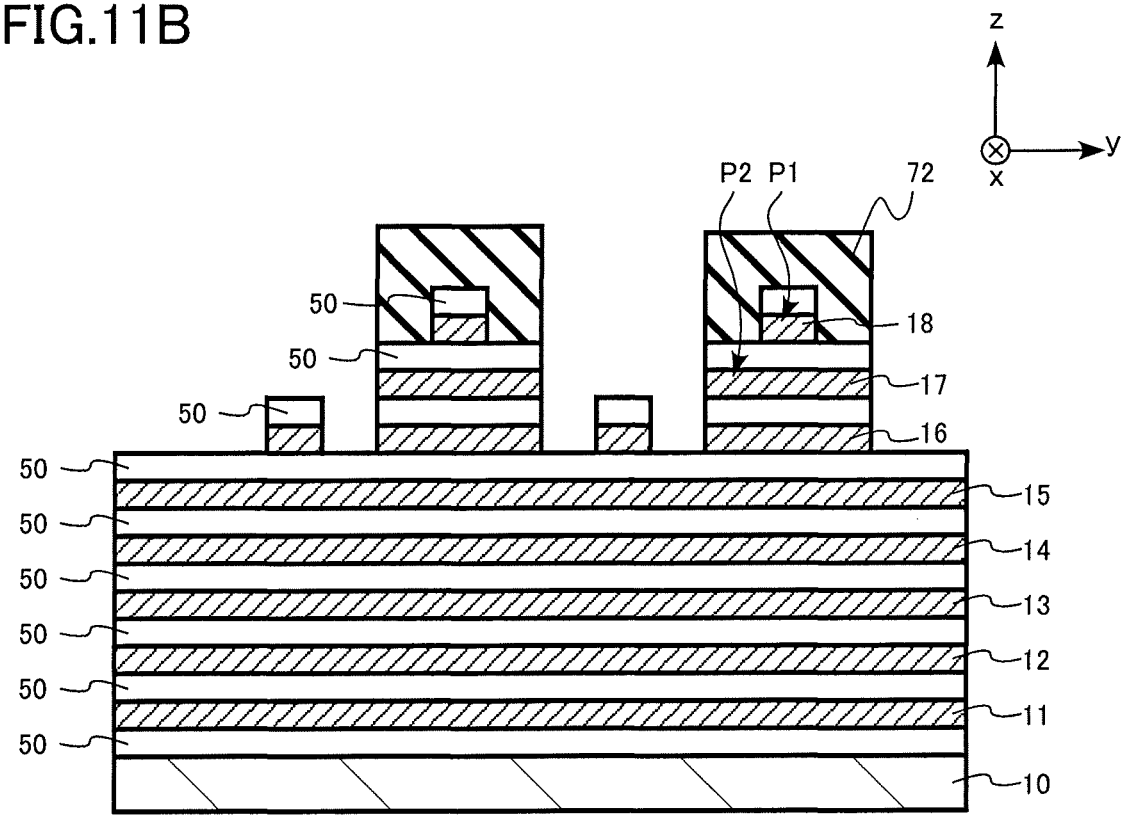

Next, in the second etching process, while using the second resist 72 as a mask, the seventh conductive layer 17 and the sixth conductive layer 16 are etched. By the second etching process, the second pattern P2 is formed on the seventh conductive layer 17 (FIGS. 11A and 11B).

Figure 12A:
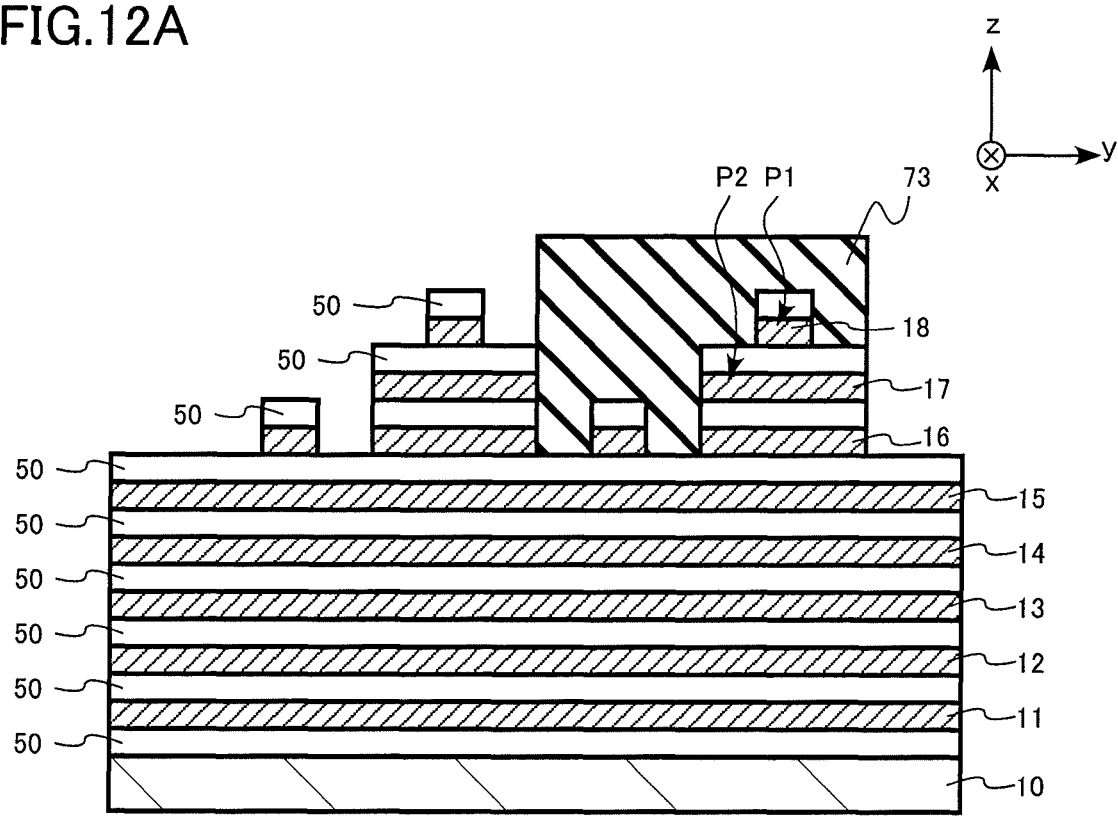
FIGS. 12A and 12B are schematic cross-sectional views in the process of manufacturing the storage device according to the first embodiment.
Figure 12B:
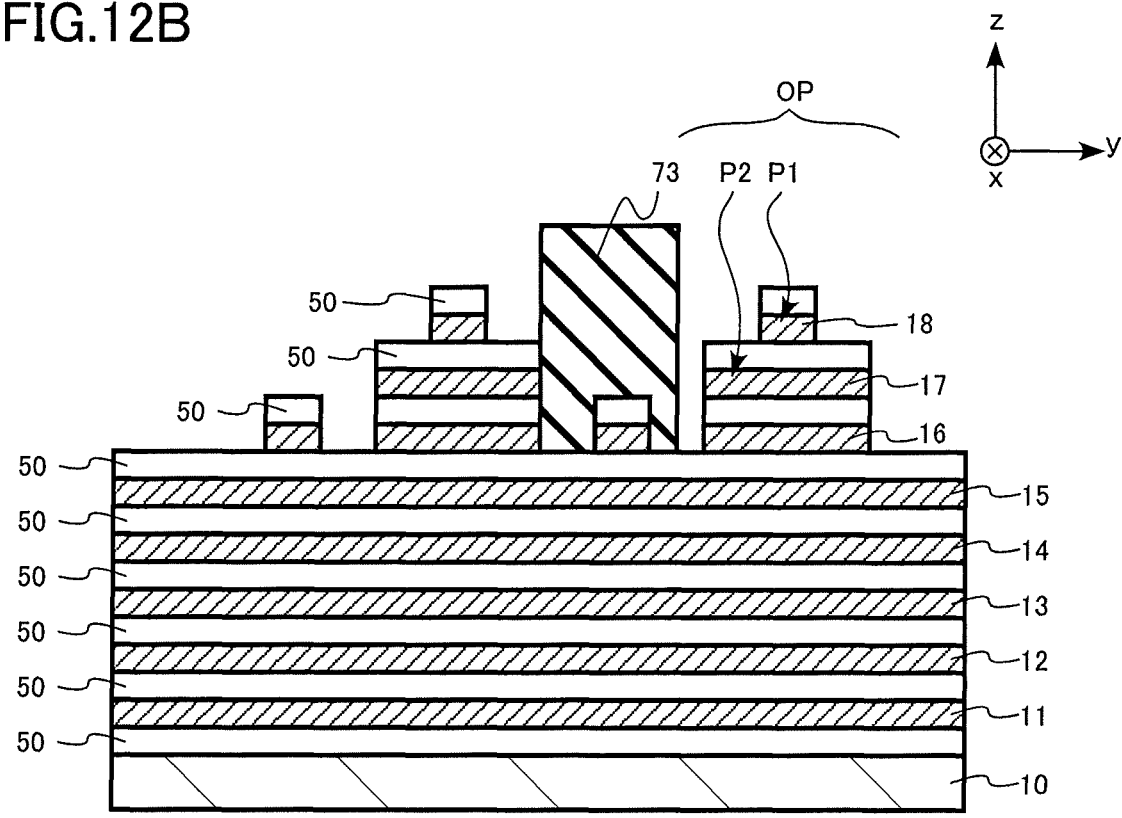

Next, the second resist 72 is removed, and in the third lithography process, the third resist 73 is patterned (FIGS. 12A and 12B). At this time, in the mark region 124, an opening portion OP is provided in the resist pattern such that an end portion of the first pattern P1 (first end portion) and an end portion of the second pattern P2 (second end portion) are exposed. The opening portion OP is provided in the resist pattern such that both end portions in the y direction of the first pattern P1 and both end portions in the y direction of the second pattern are exposed. The opening portion OP is, for example, a slit-like pattern.

Next, the dimensions of the first pattern P1 and the second pattern of the mark region 124 are measured, and the misalignment amount of the second pattern with respect to the first pattern is calculated. Then, for example, a correction value for pattern alignment in the second lithography process is calculated from the calculated misalignment amount.

The calculated correction value for pattern alignment is fed back to the second lithography process of another substrate. That is, during the second lithography process of another substrate, pattern alignment is corrected using the correction value of the above-described pattern alignment.

Further, for example, a dimension deviation amount from a design value is calculated using a measurement value of the second pattern. Then, for example, a correction value of the exposure amount in the second lithography process is calculated from the calculated dimension deviation amount.

For dimension measurement, for example, Critical Dimension-Scanning Electron Microscope (CD-SEM) can be used.

The calculated correction value is fed back to the second lithography process of another substrate. That is, during the second lithography process of another substrate, correction of pattern dimension is performed using the exposure amount correction value.

FIGS. 13A and 13B are explanatory views of an example of a measurement method using the mark region 124. FIGS. 13A and 13B are top views of the first pattern P1 and the second pattern P2 exposed to the opening portion OP of the mark region 124 after the third lithography process.

FIG. 13A shows a design pattern, and FIG. 13B shows an actual processed pattern. For example, as illustrated in FIG. 13A, the first pattern P1 is located at the center of the second pattern P2 in design. That is, y1=y2. Further, a design value of the width of the second pattern P2 in the y direction is a width d.

For example, in the case where alignment of the second pattern with respect to the first pattern in the y direction occurs in an actual processing pattern, the misalignment amount comes to $\Delta y'/2=(y2'-y1')/2$. Therefore, by measuring y2' and y1', the misalignment amount of the second pattern with respect to the first pattern can be calculated.

Further, for example, by measuring a width w' of the second pattern with the actual processing pattern, it is possible to calculate a dimension deviation amount from a design width w.

Figure 14A:
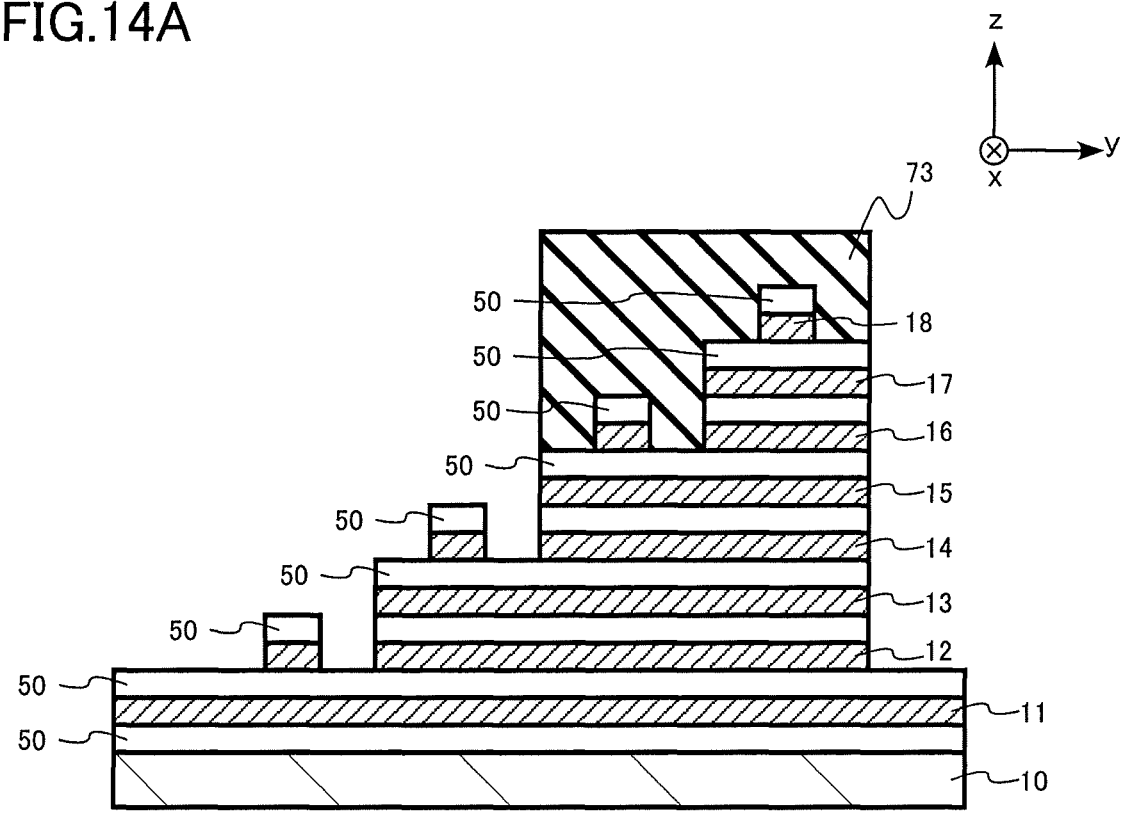
FIGS. 14A and 14B are schematic cross-sectional views in the process of manufacturing the storage device according to the first embodiment.
Figure 14B:
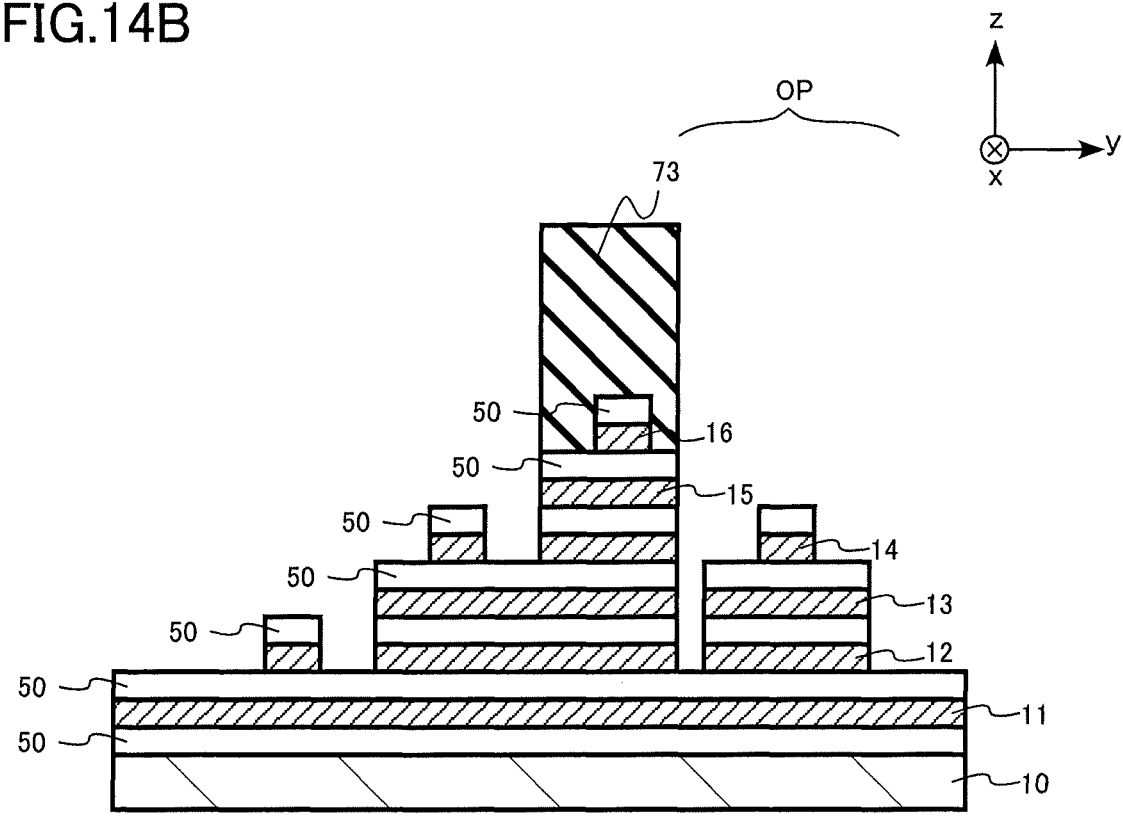

Next, in the third etching process, the fifth conductive layer 15, the fourth conductive layer 14, the third conductive layer 13, and the second conductive layer 12 are etched by using the third resist 73 as a mask (FIGS. 14A and 14B).

Figure 15A:
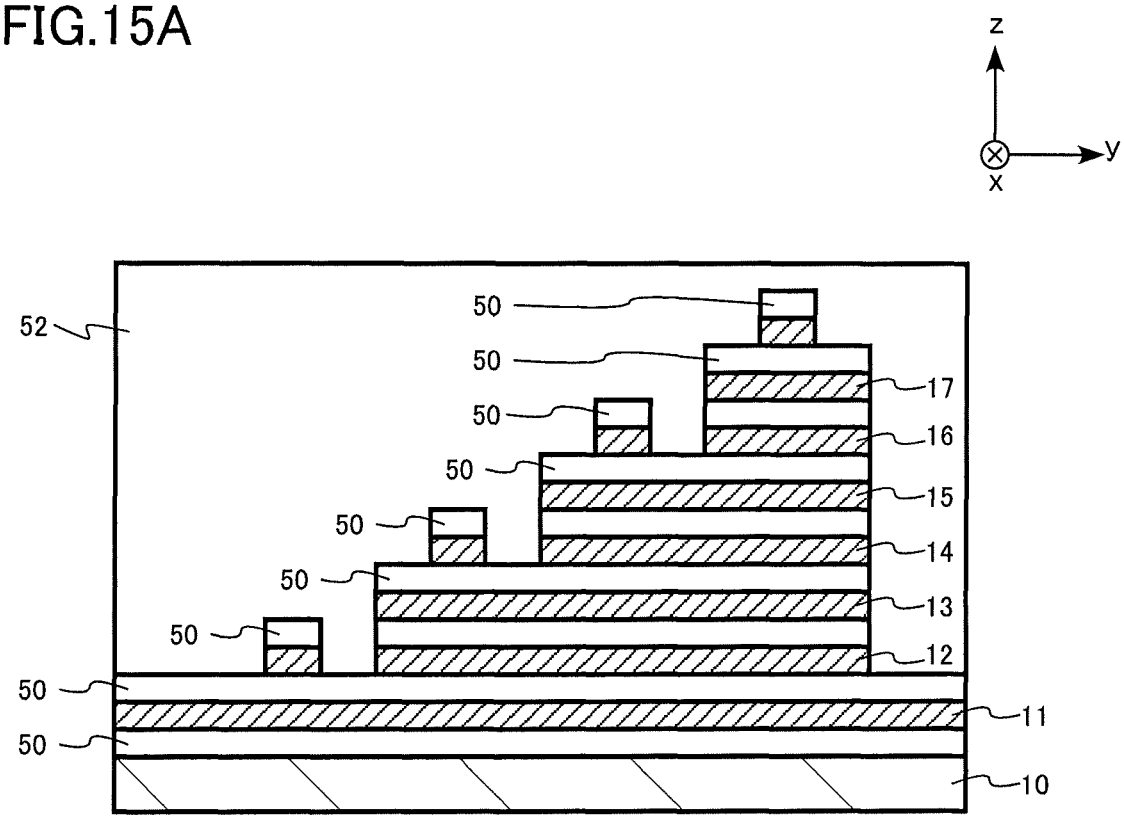
FIGS. 15A and 15B are schematic cross-sectional views in the process of manufacturing the storage device according to the first embodiment.
Figure 15B:
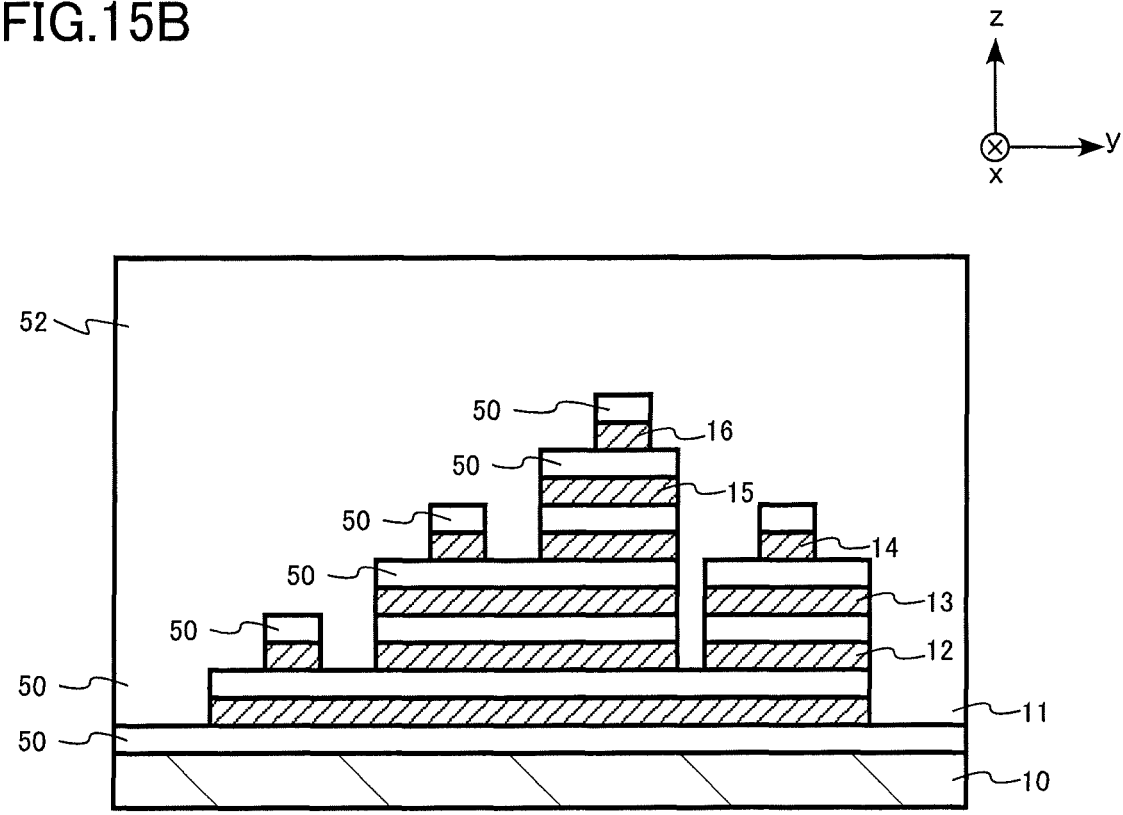

Next, the third resist 73 is removed, and the second insulating layer 52 is deposited (FIGS. 15A and 15B). Thereafter, contact holes are formed in the second insulating layer 52 using a known process technique, and the first to eighth contact electrodes 31 to 38 are formed.

According to the above-described manufacturing method, the first to eighth conductive layers have a step structure formed by using the first to third lithography processes and the first to third etching processes. With the above-described manufacturing method, it is possible to form eight terraces for connecting contact electrodes to the first to eighth conductive layers in three lithography processes.

According to the above-described manufacturing method, the contact region 122 and the mark region 124 of the first embodiment illustrated in FIGS. 4, 6A, 6B, and 7 are formed.

Functions and effects of the storage device according to the first embodiment will be described below.

In a resistance change type memory having a three-dimensional memory cell array, it is necessary to form a contact electrode for applying a voltage or a current to stacked conductive layers. A contact electrode is connected to a conductive layer drawn out from a memory cell array at a contact region adjacent to the memory cell array. An increase in the area of the contact region is undesirable since it leads to an increase in chip area. In particular, as the number of conductive layers to be stacked increases due to high integration, the number of contact electrodes also increases, and therefore it is desirable to reduce the area of the contact region.

In order to reduce the area of the contact region, it is effective to reduce the width of the terrace (hereinafter referred to as the terrace width) where the contact electrode is connected to the conductive layer. However, when the amount of misalignment in the lithography process of the conductive layer forming the terrace increases, the amount of misalignment from a designed position of the terrace increases. If the misalignment amount from the designed position of the terrace becomes large, a short circuit between the contact electrode and the conductive layer occurs, and a resistance change type memory may be defective.

For example, a distance between the conductive layer adjacent to the contact electrode and the contact electrode becomes narrow, and a short circuit between the adjacent conductive layer and the contact electrode may occur. Further, for example, the contact electrode protrudes from an end portion of the terrace, and a short circuit may occur between the conductive layer of the lower layer and the contact electrode.

Therefore, in order to reduce the area of the contact region, it is important to precisely control alignment of the conductive layer forming the terrace in the lithography process and to form the terrace at a predetermined position.

Furthermore, in the memory of a three-dimensional structure having a stacked body in which a large number of conductive layers are stacked as in the resistance change type memory of the first embodiment, the position of each conductive layer is displaced by the stress of the stacked body. For this reason, for example, if the alignment in the lithography process is controlled using a measurement mark provided on a dicing line far from the stacked body, there is a problem that the misalignment in the contact region provided in the stacked body is not reflected and the misalignment amount in the contact region is increased. This problem becomes more severe as the number of stacked conductive layers increases.

In the resistance change type memory of the first embodiment, in the stage of the (s+2)th lithography process, the amount of misalignment between the first pattern formed in the sth lithography process and the sth etching process and the second pattern formed in the (s+1)th lithography process and the (s+1)th etching process is measured.

By measuring the misalignment amount between the first pattern and the second pattern, it is possible to calculate the misalignment amount for the sth lithography process in the (s+1)th lithography process. From the calculated misalignment amount, it becomes possible to calculate a correction value of pattern alignment in the (s+1)th lithography process.

The calculated correction value for pattern alignment is fed back to the (s+1)th lithography process of another substrate. That is, during the (s+1)th lithography process of another substrate, pattern alignment is corrected using the correction value of the above-described pattern alignment. Therefore, the pattern alignment accuracy of the (s+1)th lithography process with respect to the sth lithography process is improved. Therefore, it is possible to precisely control the positioning of a terrace and to form a terrace at a predetermined position.

The first pattern and the second pattern are usually covered with a resist in the (s+2)th lithography process and cannot be used as measurement marks in the (s+2)th lithography process. In particular, both end portions in the y direction of the first pattern and both end portions in the y direction of the second pattern are not normally exposed at the same time.

By providing the opening portion OP in a resist pattern such that both end portions in the y direction of the first pattern and both end portions in the y direction of the second pattern are exposed in the (s+2)th lithography process, it becomes possible to measure the misalignment amount between the first pattern and the second pattern.

The mark region 124 having the first pattern and the second pattern as measurement marks is located at a position surrounded by the contact region 122. Therefore, in the measurement result, misalignment in the contact region 122 is reflected directly, and the misalignment amount of the contact region 122 can be highly accurately controlled.

In addition, since the first pattern and the second pattern are patterns after etching, measurement accuracy in dimension measurement is high compared with, for example, the resist pattern. Therefore, it is possible to precisely control positioning of a terrace.

Further, according to the first embodiment, it is possible to measure the first pattern and the second pattern after processing in the lithography process immediately after the formation of the second pattern. Thus, for example, the first pattern and the second pattern are patterns before exposure to subsequent etching processes. Therefore, the first pattern shape and the second pattern shape are not rounded by the subsequent etching processes, such that highly accurate dimension measurement becomes possible.

Further, according to the first embodiment, the first pattern and the second pattern after processing are measured in the lithography process immediately after the formation of the second pattern. In the lithography process, dimension measurement for a resist and dimension measurement for obtaining the misalignment amount of a resist are usually performed. Therefore, it is unnecessary to add another process for dimension measurement other than the lithography process. Therefore, it is possible to suppress an increase in the manufacturing process.

Although the mark region 124 is surrounded by the contact region 122 as an example, the mark region 124 may not necessarily be surrounded by the contact region 122. For example, the mark region 124 may be provided at the end portion on the y direction side of the memory cell array 120.

According to the first embodiment, the first pattern and the second pattern after processing are measured in the lithography process immediately after the formation of the second pattern. In the lithography process, dimension measurement for a resist and dimension measurement for obtaining the misalignment amount of a resist are usually performed. Therefore, it is unnecessary to add another process for dimension measurement other than the lithography process. Therefore, it is possible to suppress an increase in the manufacturing process.

Further, although the case of measuring the misalignment in the y direction using the mark region 124 has been described as an example, the misalignment in the x direction may be measured using the mark region 124. In that case, for example, it is possible to make the first pattern P1 and the second pattern P2 a pattern extending in the y direction.

In addition, the mark region 124 can be provided at different positions for different lithography processes.

As described above, according to the storage device and the storage device manufacturing method according to the first embodiment, it is possible to reduce the area of the contact region by precisely controlling the alignment in the lithography process for forming a step structure of the contact region. Therefore, it is possible to provide a storage device capable of reducing chip area.

Second Embodiment

A storage device according to the second embodiment, includes a substrate; a first stacked body provided on the substrate, and the first stacked body having first to nth (n is an integer of 3 or more) conductive layers stacked in a direction perpendicular to a surface of the substrate; a region including a part of the first stacked body, and the region having a step structure including the first to nth conductive layers; a portion provided in a peripheral portion of the first stacked body, and the portion having a projected shape or a recessed shape provided on the same plane as a plane including the first conductive layer or on a side closer to the substrate than the plane including the first conductive layer; and first to nth electrodes provided in the region, the first to nth electrodes connected to the first to nth conductive layers, and the first to nth electrodes extending in a direction perpendicular to the surface of the substrate.

In addition, the storage device according to the second embodiment is further provided with a second stacked body provided on the substrate and having first to xth (x=n) conductive layers stacked in a direction perpendicular to the surface of the substrate.

n is an integer of 3 or more. n is, for example, 4 or more. Hereinafter, the case where n=12 and x=12 will be described as an example.

The storage device according to the second embodiment is different from the storage device of the first embodiment in that a mark region (portion) is provided on the same plane as the first conductive layer or on the side closer to the substrate than the first conductive layer and the number of stacked conductive layers is different. Hereinafter, description of contents already described in the first embodiment may be partially omitted.

The storage device according to the second embodiment is a resistance change type memory. A memory cell array 120 of the second embodiment has a three-dimensional structure in which memory cells MC are three-dimensionally disposed.

Figure 16:
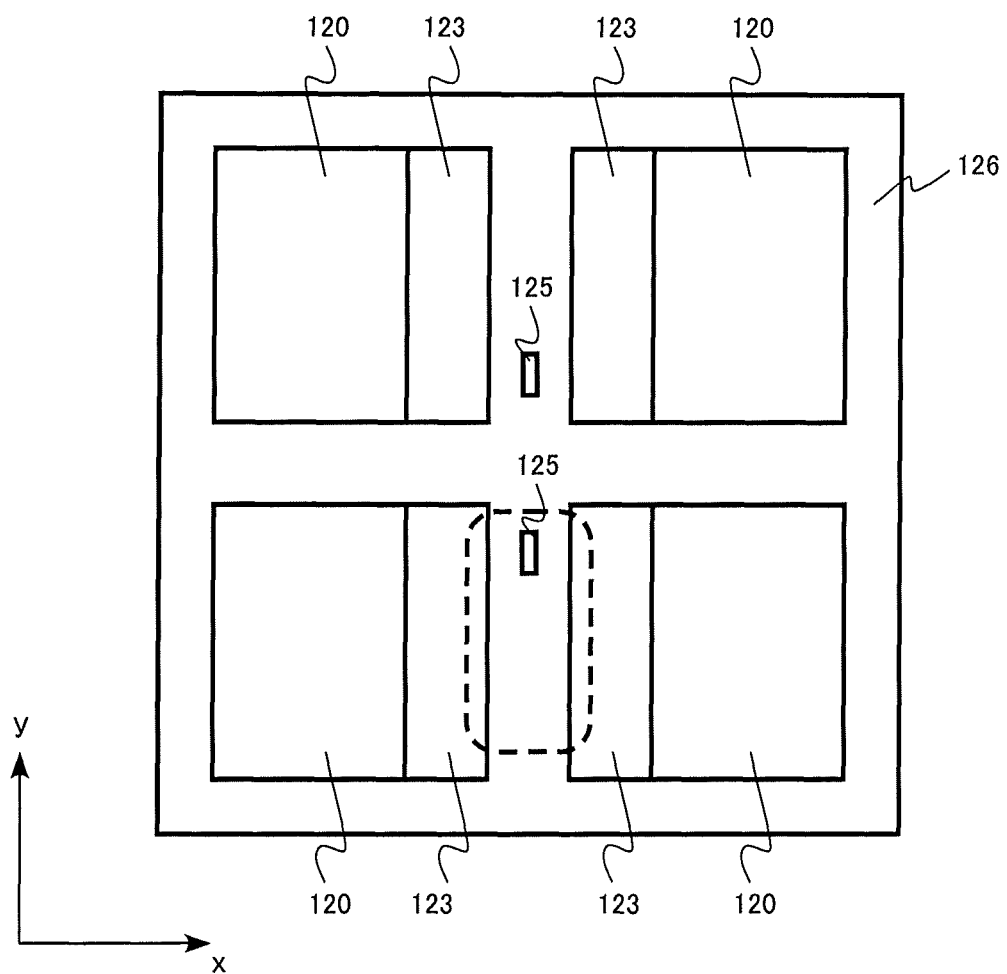
FIG. 16 is a schematic view of a memory region of a storage device according to a second embodiment.

FIG. 16 is a schematic diagram of a memory region of the storage device of the second embodiment. The memory region of the resistance change type memory according to the second embodiment has a memory cell array 120, a contact region 123 (region), a mark region 125 (portion), and a stacked body peripheral portion 126 (peripheral portion). The resistance change type memory has, for example, four memory cell arrays 120 and four contact regions 123. The contact region 123 is provided adjacent to the memory cell array 120. The mark region 125 is located between the two memory cell arrays 120. The mark region 125 is located between the two contact regions 123. The mark region 125 is provided in the stacked body peripheral portion 126 (peripheral portion).

FIG. 17 is a schematic diagram of the memory cell array 120, the contact region 123, and the mark region 125 of the second embodiment. FIG. 17 is a top view of a region surrounded by a dotted line in FIG. 16.

Figure 18:
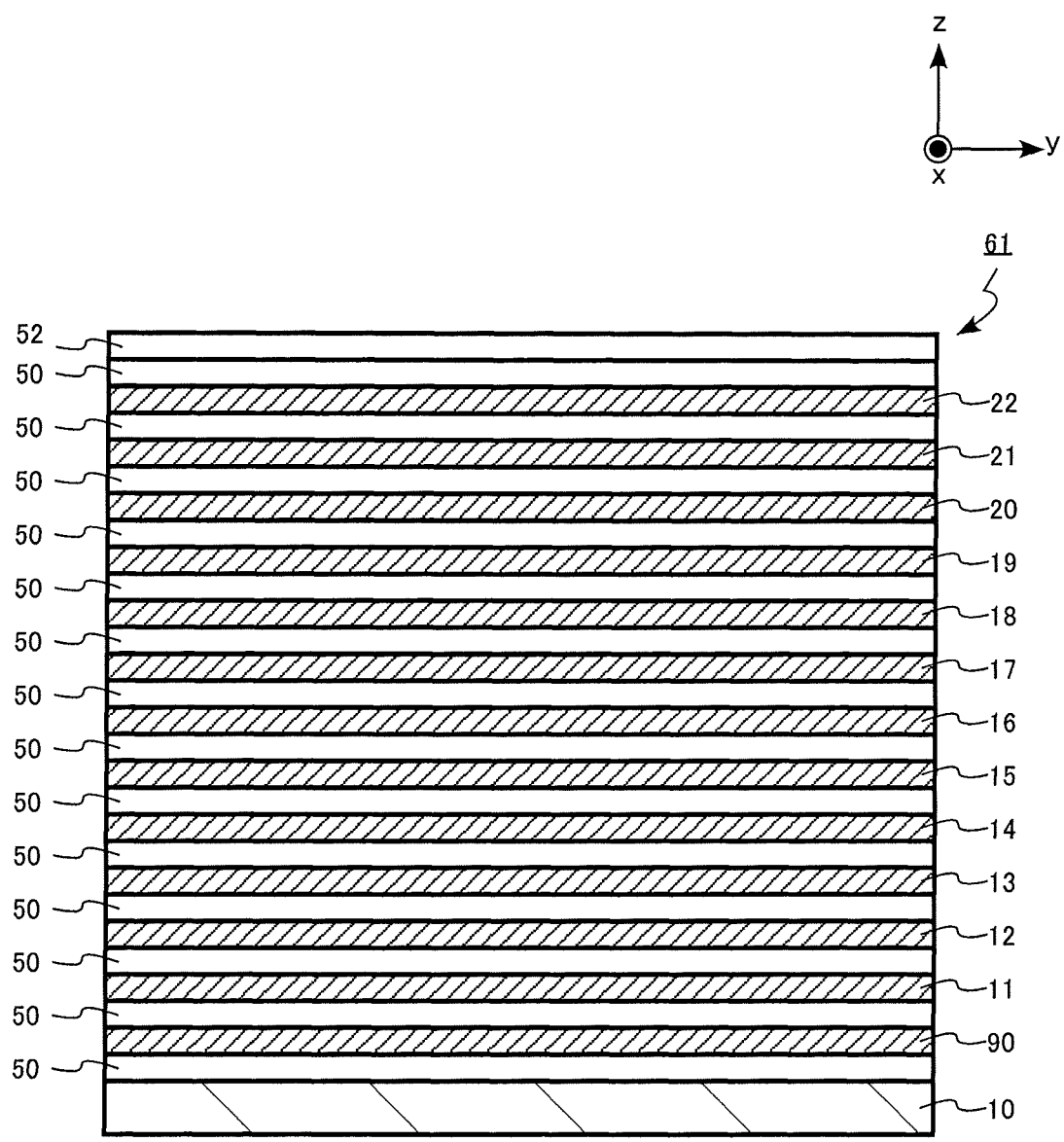
FIG. 18 is a schematic cross-sectional view of a memory cell array according to the second embodiment.

FIG. 18 is a schematic cross-sectional view of the memory cell array 120 according to the second embodiment. FIG. 18 is a sectional view taken along line FF' of FIG. 17.

Figure 19:
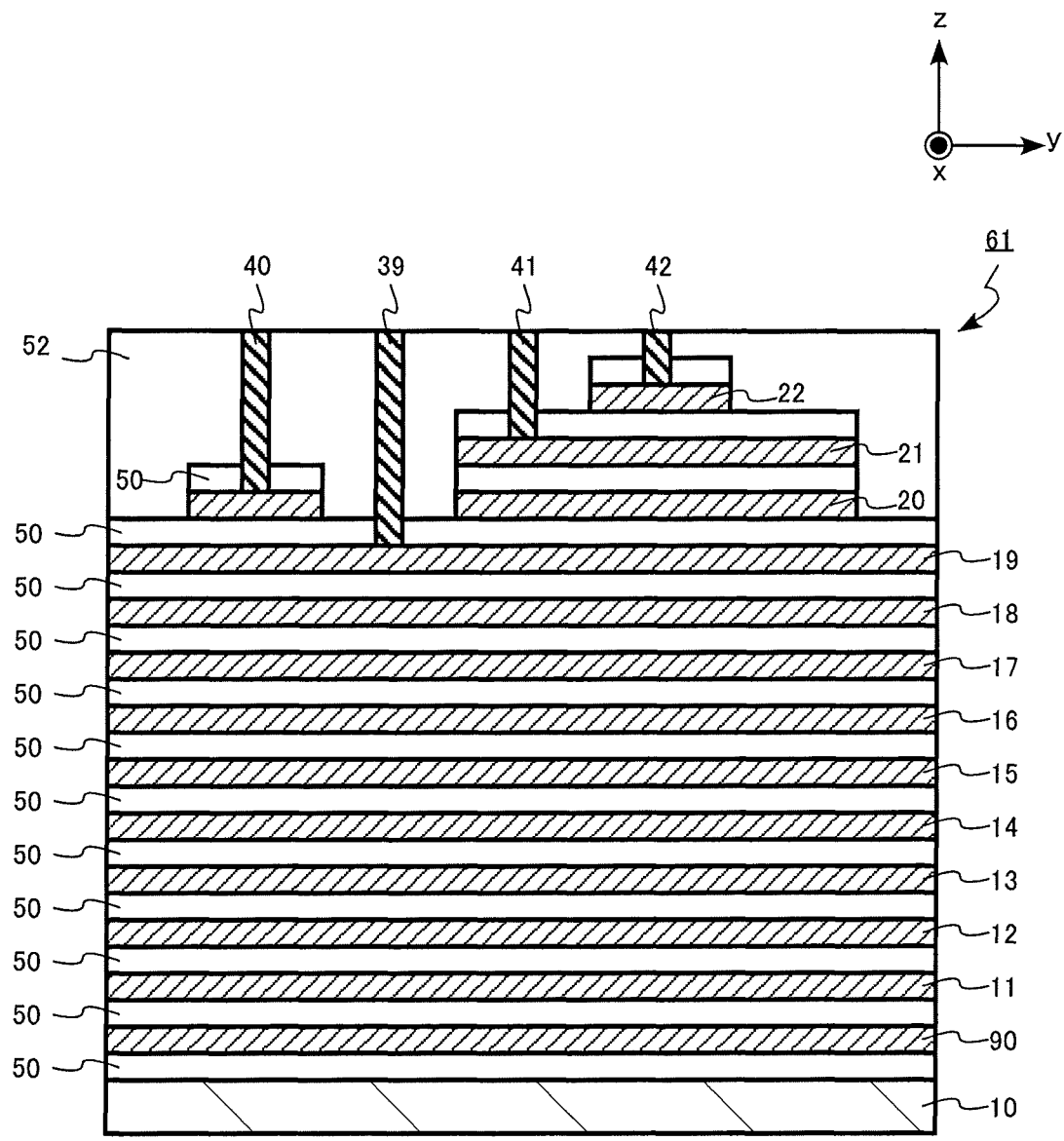
FIG. 19 is a schematic cross-sectional view of the contact region according to the second embodiment.
Figure 20:
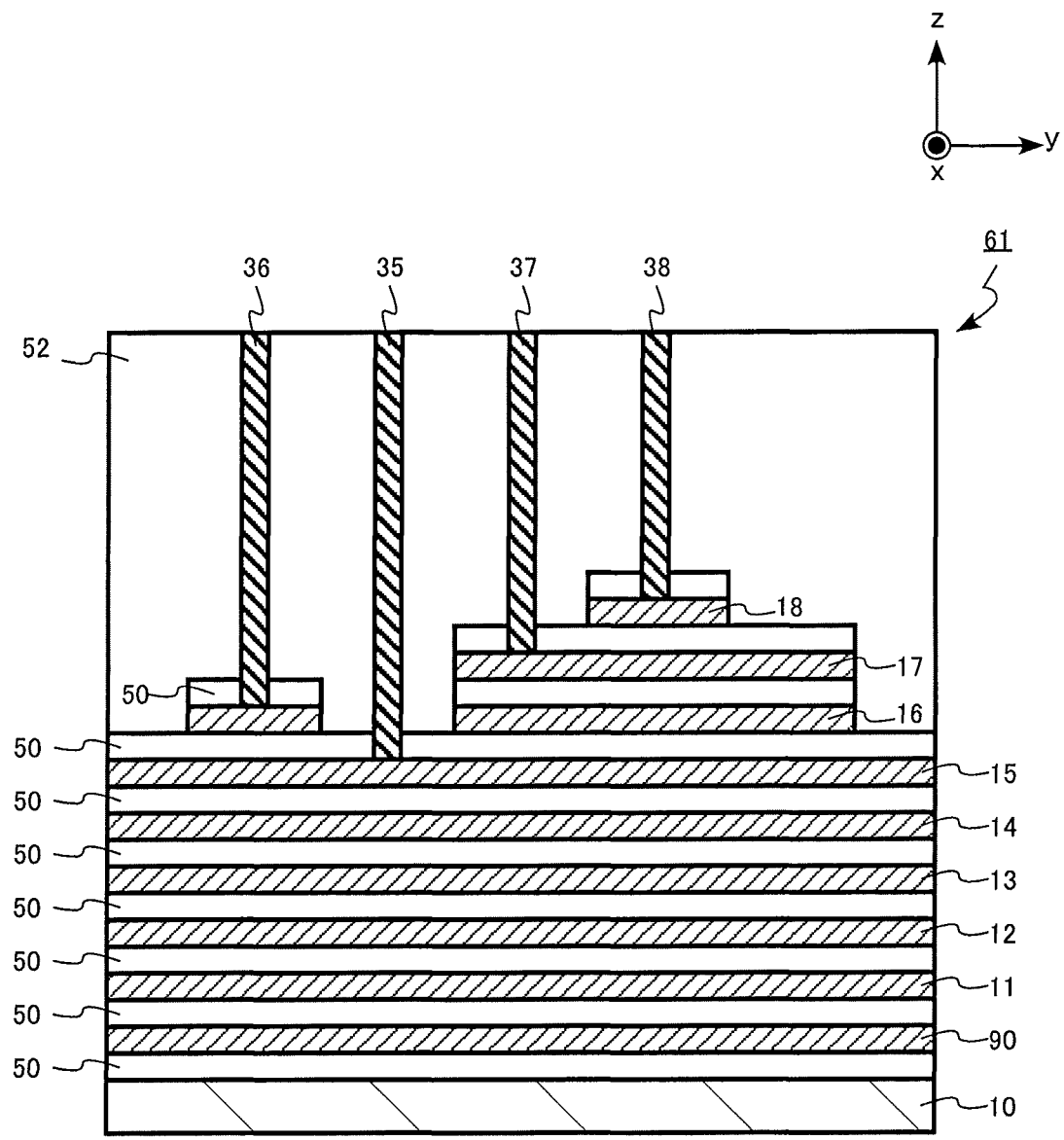
FIG. 20 is a schematic cross-sectional view of the contact region according to the second embodiment.
Figure 21:
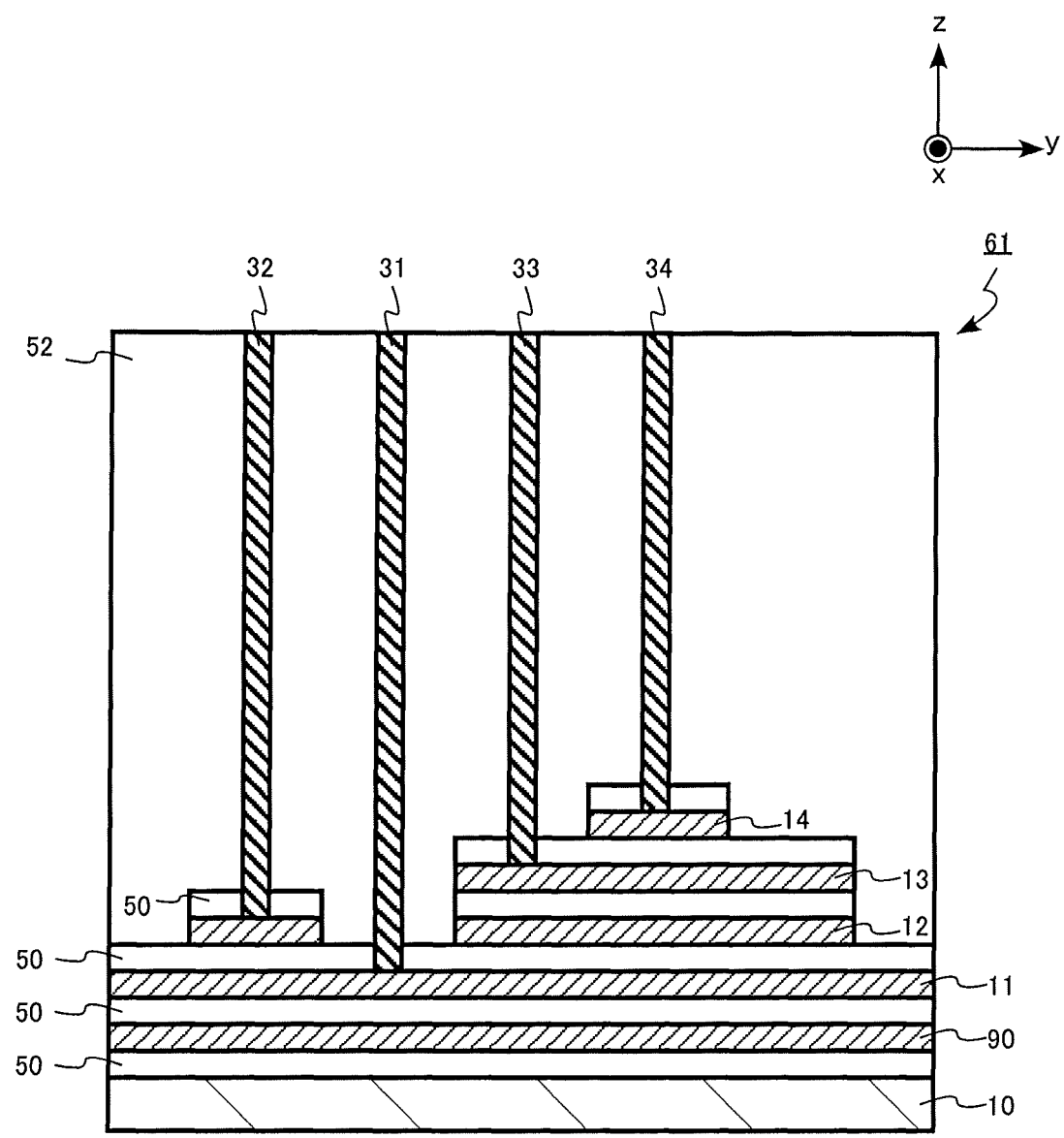
FIG. 21 is a schematic cross-sectional view of the contact region according to the second embodiment.

FIGS. 19, 20, and 21 are schematic cross-sectional views of the contact region 123 according to the second embodiment. FIG. 19 is a sectional view taken along line GG' of FIG. 17. FIG. 20 is a cross-sectional view taken along line HH' of FIG. 17. FIG. 21 is a cross-sectional view taken along line II' of FIG. 17. FIG. 19 is a cross-sectional view of a third region 123c. FIG. 20 is a cross-sectional view of a second region 123b. FIG. 21 is a cross-sectional view of a first region 123a.

Figure 22:
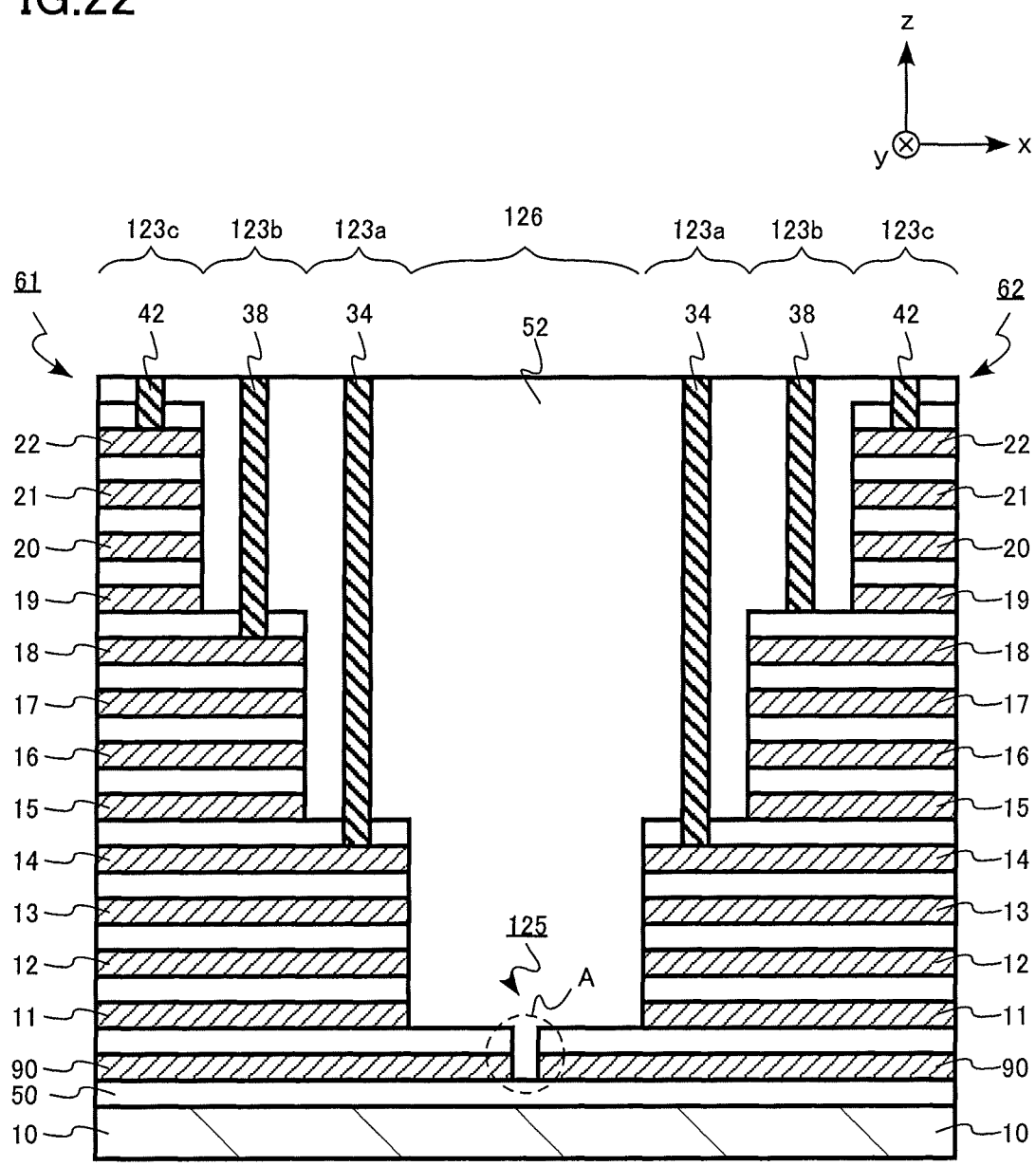
FIG. 22 is a schematic cross-sectional view of the contact region, the mark region, and the peripheral portion of a stacked body according to the second embodiment.

FIG. 22 is a schematic cross-sectional view of the contact region 123, the mark region 125, and the stacked body peripheral portion 126 according to the second embodiment. FIG. 22 is a cross-sectional view taken along line JJ' of FIG. 17.

The memory cell array 120 includes a substrate 10, a first conductive layer 11, a second conductive layer 12, a third conductive layer 13, a fourth conductive layer 14, a fifth conductive layer 15, a sixth conductive layer 16, a seventh conductive layer 17, an eighth conductive layer 18, a ninth conductive layer 19, a tenth conductive layer 20, an eleventh conductive layer 21, a twelfth conductive layer 22, first insulating layers 50, a second insulating layer 52, and a dummy conductive layer 90.

The contact region 123 includes the substrate 10, the first conductive layer 11, the second conductive layer 12, the third conductive layer 13, the fourth conductive layer 14, the fifth conductive layer 15, the sixth conductive layer 16, the seventh conductive layer 17, the eighth conductive layer 18, the ninth conductive layer 19, the tenth conductive layer 20, the eleventh conductive layer 21, the twelfth conductive layer 22, a first contact electrode 31, a second contact electrode 32, a third contact electrode 33, a fourth contact electrode 34, a fifth contact electrode 35, a sixth contact electrode 36, a seventh contact electrode 37, an eighth contact electrode 38, a ninth contact electrode 39, a tenth contact electrode 40, an eleventh contact electrode 41, a twelfth contact electrode 42, the first insulating layers 50, the second insulating layer 52, and the dummy conductive layer 90. The contact region 123 includes the first region 123a, the second region 123b, and the third region 123c.

The mark region 125 and the stacked body peripheral portion 126 include the substrate 10, the first insulating layer 50, the second insulating layer 52, and the dummy conductive layer 90.

The substrate 10 is, for example, a semiconductor substrate. The semiconductor substrate 10 is, for example, a single crystal silicon substrate.

The first conductive layer 11, the second conductive layer 12, the third conductive layer 13, the fourth conductive layer 14, the fifth conductive layer 15, the sixth conductive layer 16, the seventh conductive layer 17, the eighth conductive layer 18, the ninth conductive layer 19, the tenth conductive layer 20, the eleventh conductive layer 21, and the twelfth conductive layer 22 are examples of the first to nth conductive layers and the first to xth conductive layers.

The first to twelfth conductive layers 11 to 22 are stacked in the z direction perpendicular to a surface of the substrate 10. The first to twelfth conductive layers 11 to 22 are parallel to the x direction and the y direction.

The dummy conductive layer 90 is provided between the substrate 10 and the first conductive layer 11. The dummy conductive layer 90 is, for example, a conductor made of the same material as the first to twelfth conductive layers 11 to 22. The same material means, for example, that combinations of constituent elements are equal.

The first insulating layers 50 are interposed between the first to twelfth conductive layers 11 to 22. The first to twelfth conductive layers 11 to 22 and the first insulating layer 50 constitute a first stacked body 61 and a second stacked body 62. The first stacked body 61 and the second stacked body 62 are provided so as to sandwich the stacked body peripheral portion 126 between them.

The first stacked body 61 includes at least one layer of the first to twelfth conductive layers 11 to 22 which are physically continuous with portions of the first to twelfth conductive layers 11 to 22 forming word lines WL in the memory cell array 120. For example, a portion extending in the x direction or the y direction of only one layer of the first conductive layer 11 forming the word lines WL in the memory cell array 120 corresponds to the first stacked body 61.

The second stacked body 62 includes at least one layer of the first to twelfth conductive layers 11 to 22 which are physically continuous with portions of the first to twelfth conductive layers 11 to 22 forming word lines WL in the memory cell array 120. For example, a portion extending in the x direction or the y direction of only one layer of the first conductive layer 11 forming the word lines WL in the memory cell array 120 corresponds to the second stacked body 62.

The first to twelfth conductive layers 11 to 22 are patterned in the memory cell array 120 to form a plurality of the word lines WL.

The second insulating layer 52 covers the first to twelfth conductive layers 11 to 22 and the first insulating layers 50.

The contact region 123 is located at end portions of the first stacked body 61 and the second stacked body 62.

The contact region 123 includes the first region 123a, the second region 123b, and the third region 123c. The third region 123c, the second region 123b, and the first region 123a are disposed in this order from the memory cell array 120 toward the stacked body peripheral portion 126.

Each of the first region 123a, the second region 123b, and the third region 123c has a step structure. The first region 123a, the second region 123b, and the third region 123c have a step structure having a step in the y direction. In addition, the step structure of the first region 123a is positioned closer to the substrate 10 than the step structure of the second region 123b. The step structure of the second region 123b is positioned closer to the substrate 10 than the step structure of the third region 123c.

The contact region 123 includes the first contact electrode 31, the second contact electrode 32, the third contact electrode 33, the fourth contact electrode 34, the fifth contact electrode 35, the sixth contact electrode 36, the seventh contact electrode 37, the eighth contact electrode 38, the ninth contact electrode 39, the tenth contact electrode 40, the eleventh contact electrode 41, and the twelfth contact electrode 42. The first to twelfth contact electrodes 31 to 42 are examples of the first to nth electrodes.

The first contact electrode 31, the second contact electrode 32, the third contact electrode 33, and the fourth contact electrode 34 are located in the first region 123a. The first contact electrode 31, the second contact electrode 32, the third contact electrode 33, and the fourth contact electrode 34 are respectively connected to the first conductive layer 11, the second conductive layer 12, the third conductive layer 13, and the fourth conductive layer 14.

The fifth contact electrode 35, the sixth contact electrode 36, the seventh contact electrode 37, and the eighth contact electrode 38 are located in the second region 123b. The fifth contact electrode 35, the sixth contact electrode 36, the seventh contact electrode 37, and the eighth contact electrode 38 are respectively connected to the fifth conductive layer 15, the sixth conductive layer 16, the seventh conductive layer 17, and the eighth conductive layer 18.

The ninth contact electrode 39, the tenth contact electrode 40, the eleventh contact electrode 41, and the twelfth contact electrode 42 are located in the third region 123c. The ninth contact electrode 39, the tenth contact electrode 40, the eleventh contact electrode 41, and the twelfth contact electrode 42 are respectively connected to the ninth conductive layer 19, the tenth conductive layer 20, the eleventh conductive layer 21, and the twelfth conductive layer 22.

The first to twelfth contact electrodes 31 to 42 are connected to the first to twelfth conductive layers 11 to 22 at the flat portions (terraces) of the step structure of the first to twelfth conductive layers 11 to 22. The first to twelfth contact electrodes 31 to 42 extend in the z direction perpendicular to a surface of the substrate 10 in the second insulating layer 52.

The mark region 125 is provided in a peripheral portion of the first stacked body 61, that is, in the stacked body peripheral portion 126. The mark region 125 is provided between the first stacked body 61 and the second stacked body 62.

The mark region 125 has a recessed shape A. The recessed shape A is, for example, a groove provided in the dummy conductive layer 90. The pattern seen from an upper surface of the recessed shape A is, for example, a rectangular shape.

The dummy conductive layer 90 is present on the side of the recessed shape A. The dummy conductive layer 90 is, for example, a conductor made of the same material as the first to twelfth conductive layers 11 to 22. A distance d between the contact region 123 and the mark region 125 is, for example, 10 μm or less. The distance d between the contact region 123 and the mark region 125 is, for example, 5 μm or less. The distance d between the contact region 123 and the mark region 125 is, for example, 1 μm or less.

The recessed shape A is provided closer to the substrate 10 than the first conductive layer 11.

The recessed shape A provided in the mark region 125 functions as a measurement mark. The recessed shape A provided in the mark region 125 functions as, for example, an alignment measurement mark (overlay mark) or a dimension measurement mark (Critical Dimension measurement mark) in a lithography process.

Next, a storage device manufacturing method according to the second embodiment will be described. FIGS. 23, 24, 25, 26, 27, 28, 29, 30, 31, 32, 33, 34, 35, and 36 are schematic cross-sectional views in the process of manufacturing the storage device according to the second embodiment. FIGS. 23, 24, 30, 31, 32, 33, 34, 35, and 36 are cross sections corresponding to JJ' cross section of FIG. 17. FIGS. 25, 26, 27, 28, and 29 are cross sections corresponding to GG' cross section of FIG. 17.

A storage device manufacturing method according to the second embodiment includes forming a plurality of conductive layers stacked in a direction perpendicular to the surface of a substrate on the substrate; forming a projected shape or a recessed shape by processing one of the plurality of conductive layers; forming a region having a step structure including at least a part of the conductive layers by using a plurality of lithography processes and a plurality of etching processes after forming the portion; and forming an electrode connected to at least one of the plurality of conductive layers of the region, the electrode extending in a direction perpendicular to the surface of the substrate, wherein the portion is not covered with a resist in at least one of the lithography processes.

In addition, the storage device manufacturing method according to the second embodiment includes forming, on the substrate, first to nth (n is an integer of 4 or more) conductive layers stacked in a direction perpendicular to a surface of the substrate, forming a portion having a recessed shape by processing the nth conductive layer, forming a region in which first to (n−1)th conductive layers have a step structure by using a plurality of lithography processes and a plurality of etching processes, and forming first to (n−1)th electrodes connected to the first to (n−1)th conductive layers in the region and extending in a direction perpendicular to the surface of the substrate, and the portion is not covered with a resist in at least a part of the lithography processes.

In the storage device manufacturing method according to the second embodiment, a region having a step structure is also formed in the nth conductive layer. In addition, the nth electrode is formed.

Hereinafter, the case where n=12 will be described as an example.

Among manufacturing methods of a resistance change type memory according to the second embodiment, methods of manufacturing the contact region 123 and the mark region 125 will be described in detail below.

Figure 23:
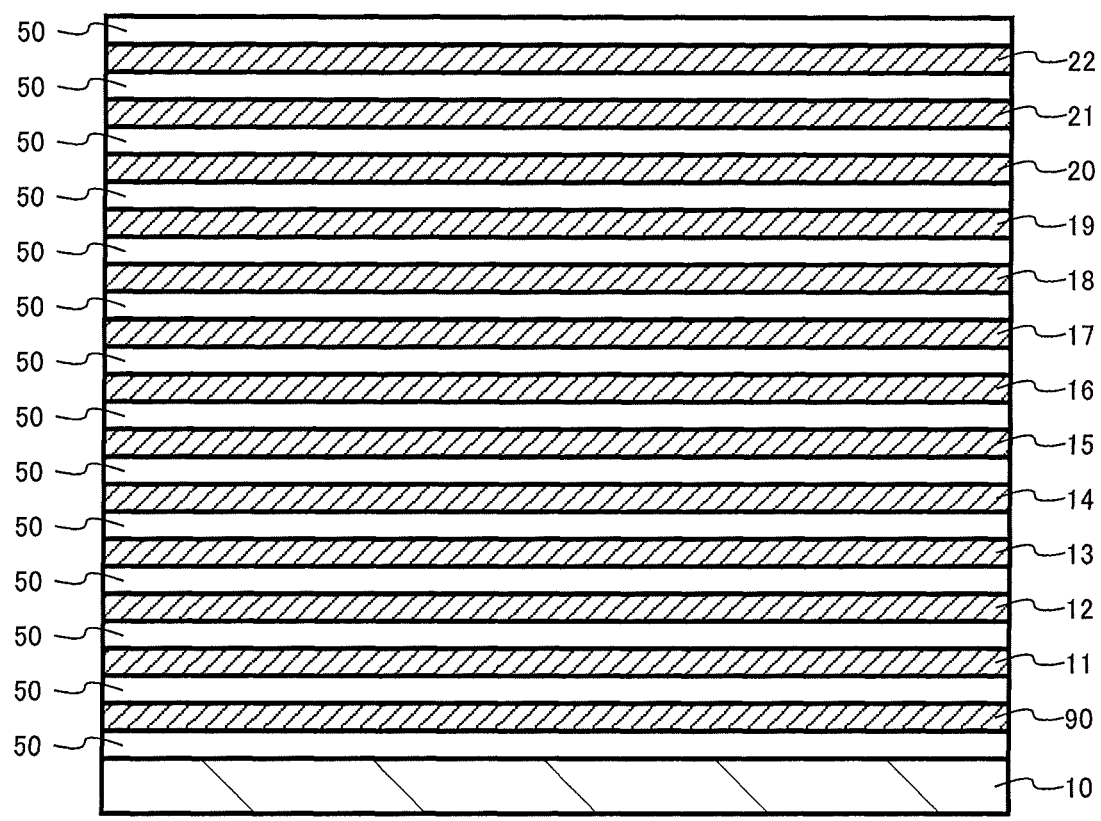
FIG. 23 is a schematic cross-sectional view in the process of manufacturing the storage device according to the second embodiment.

First, the dummy conductive layer 90 and the first to twelfth conductive layers 11 to 22 are stacked on the substrate 10 in the z direction perpendicular to a surface of the substrate 10 so as to sandwich the first insulating layer 50 between them (FIG. 23).

Figure 24:
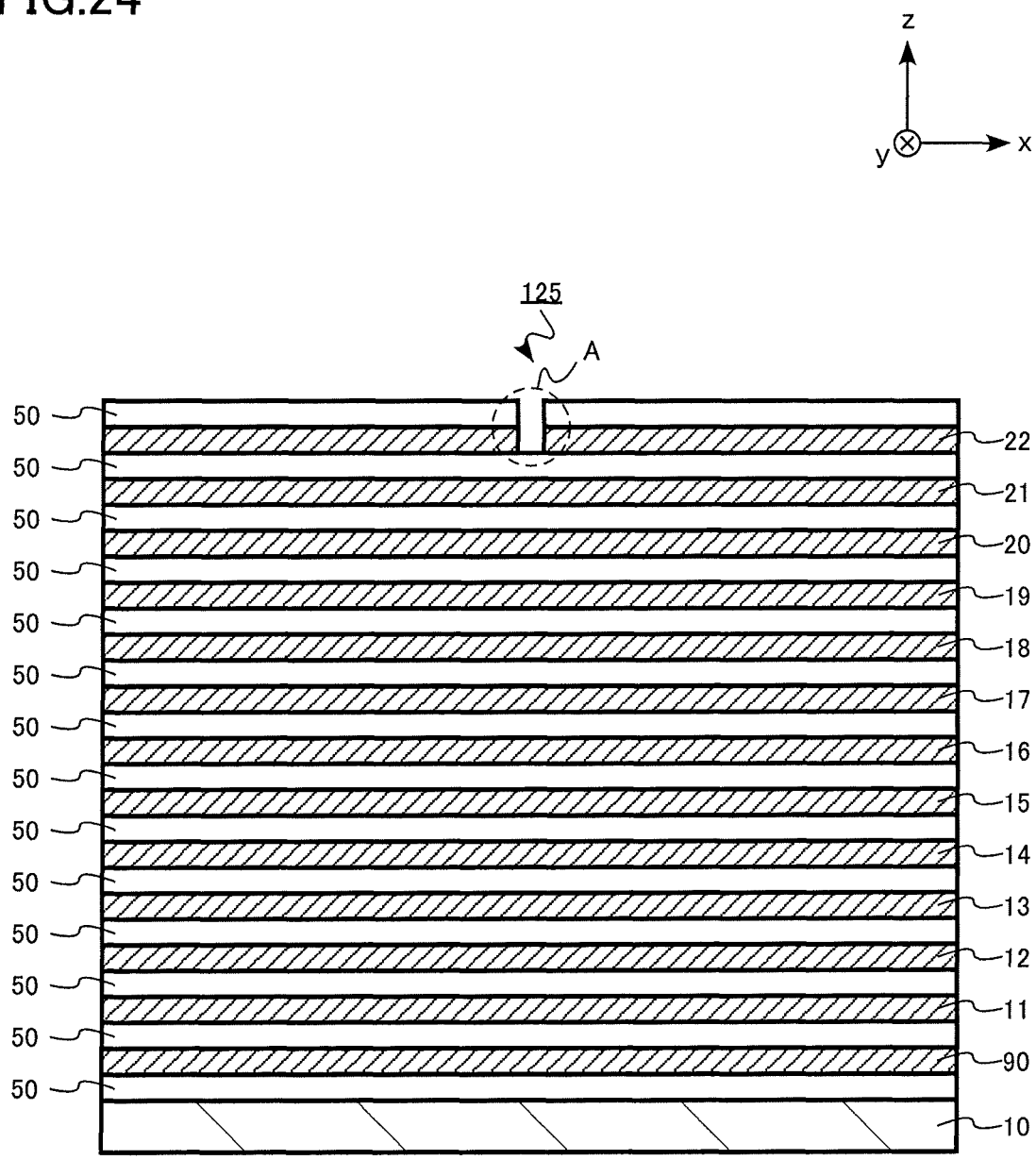
FIG. 24 is a schematic cross-sectional view in the process of manufacturing the storage device according to the second embodiment.

Next, by a known lithography process and etching process, the mark region 125 (portion) including the recessed shape A is formed in the twelfth conductive layer 22 (FIG. 24). The recessed shape A is provided in a region to be the stacked body peripheral portion 126. The pattern seen from an upper surface of the recessed shape A is, for example, a rectangular shape.

Figure 25:
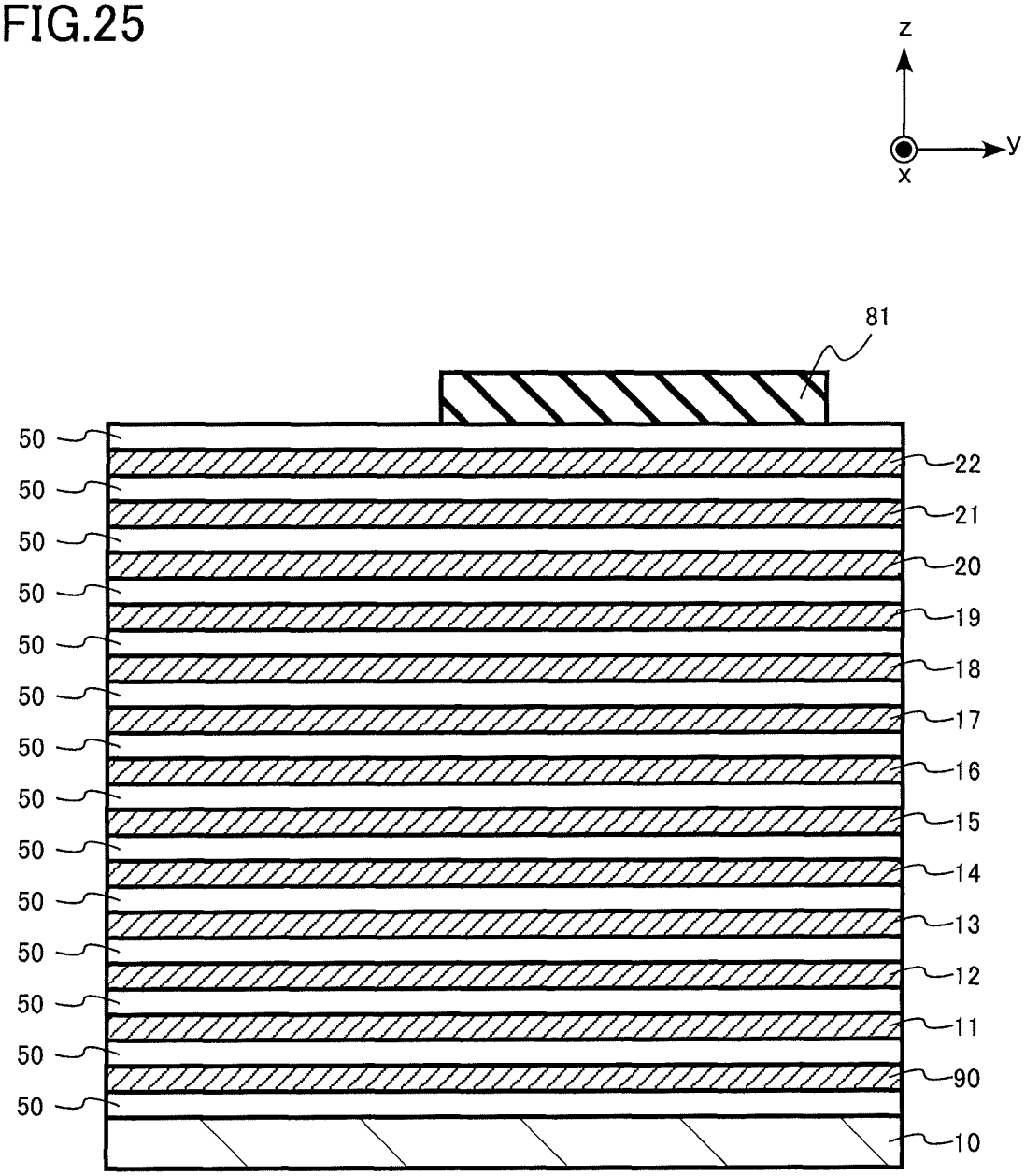
FIG. 25 is a schematic cross-sectional view in the process of manufacturing the storage device according to the second embodiment.

Next, a resist 81 is patterned on the twelfth conductive layer 22 in the lithography process (FIG. 25).

Figure 26:
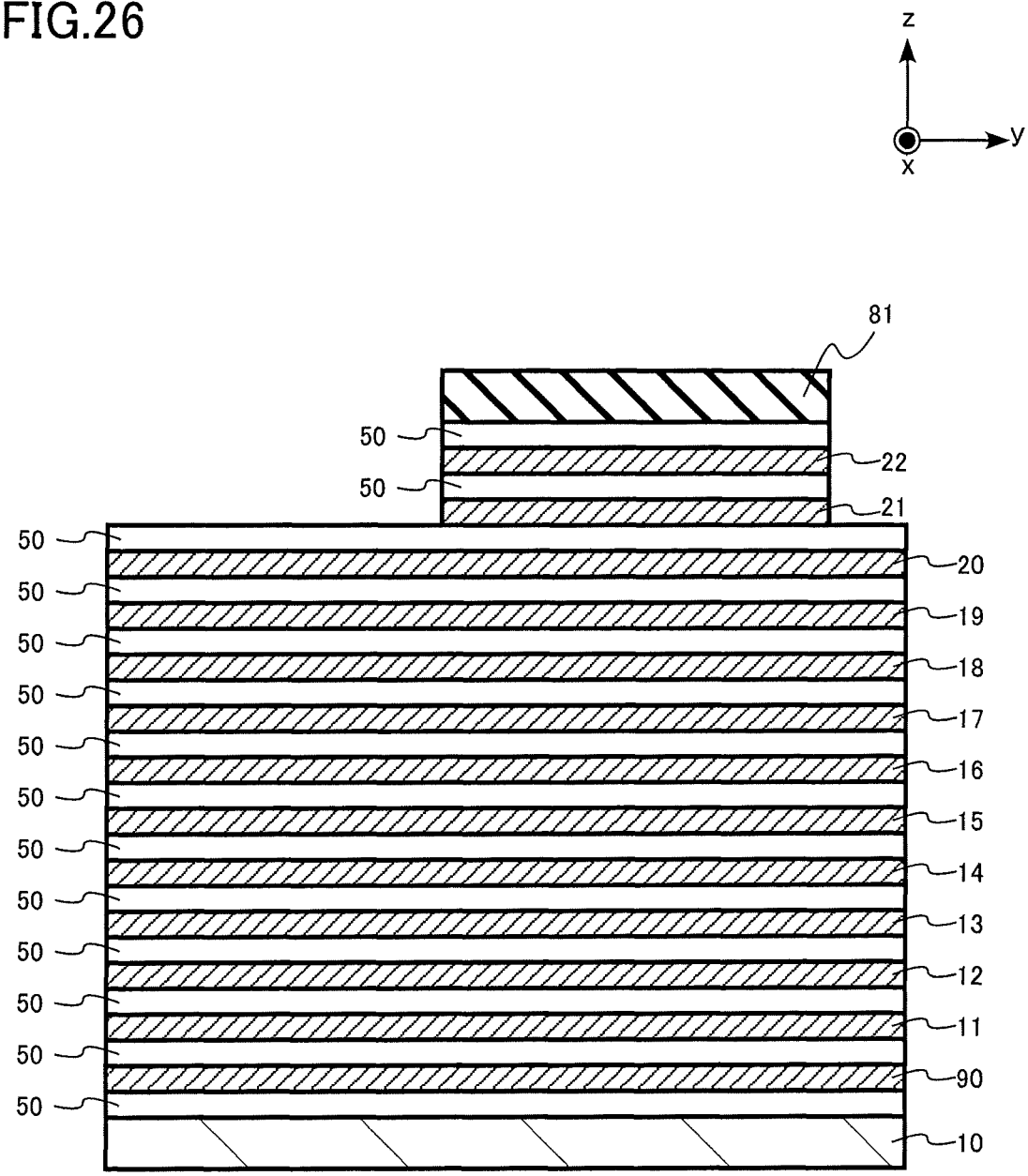
FIG. 26 is a schematic cross-sectional view in the process of manufacturing the storage device according to the second embodiment.

Next, in the etching process, the twelfth conductive layer 22 and the eleventh conductive layer 21 are etched by using the resist 81 as a mask (FIG. 26).

Figure 27:
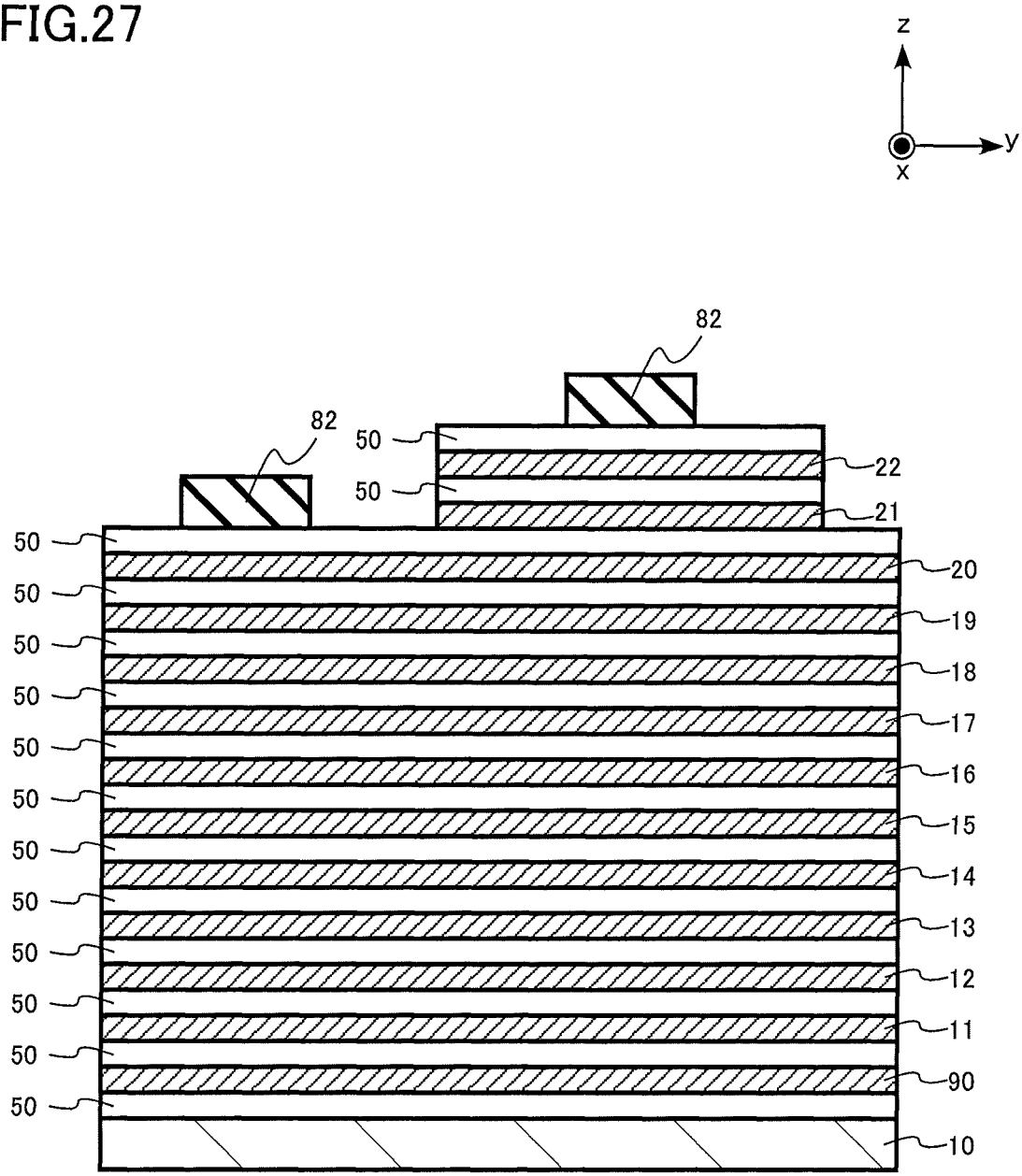
FIG. 27 is a schematic cross-sectional view in the process of manufacturing the storage device according to the second embodiment.

Next, in the lithography process, a resist 82 is patterned (FIG. 27).

Figure 28:
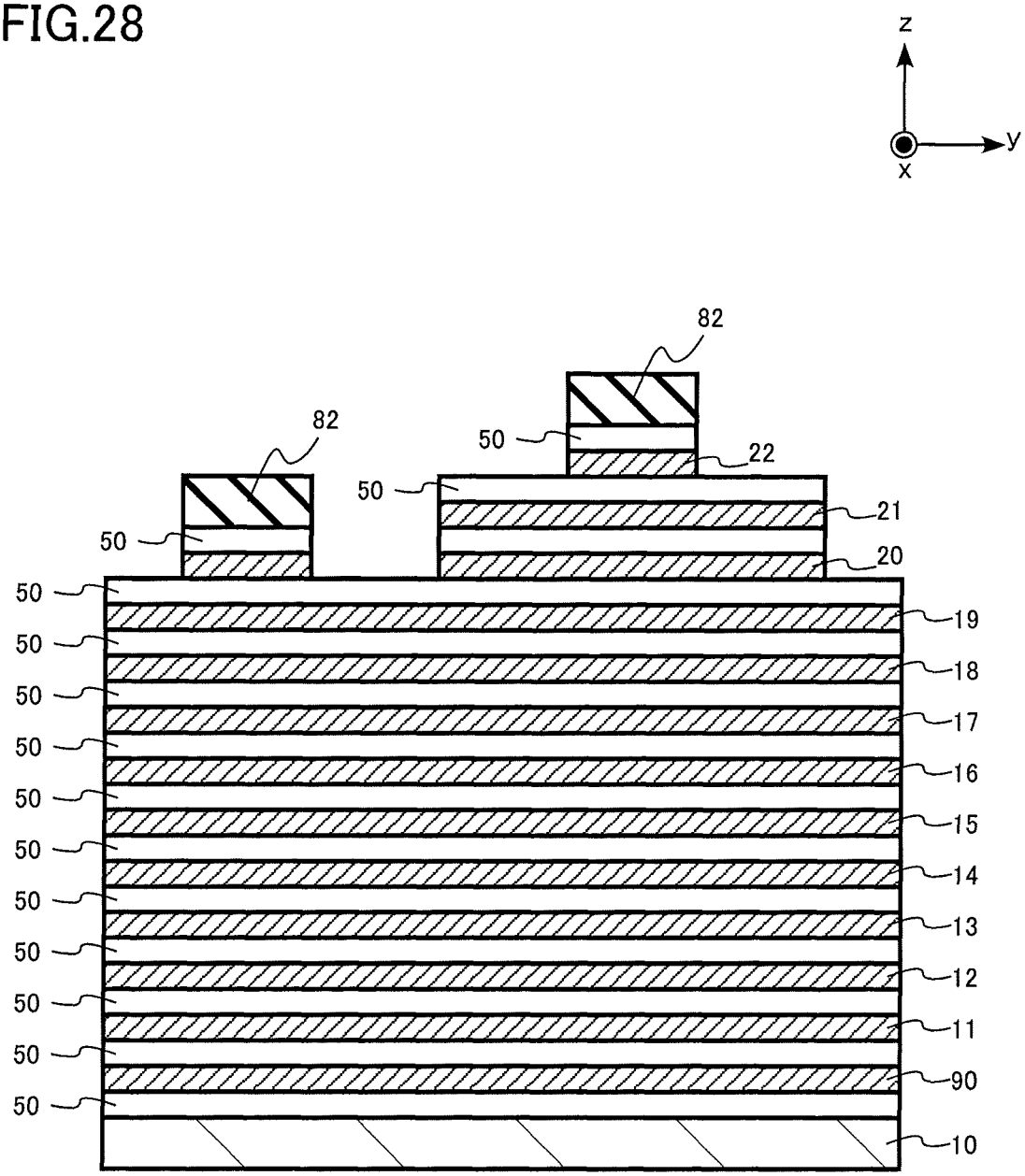
FIG. 28 is a schematic cross-sectional view in the process of manufacturing the storage device according to the second embodiment.
Figure 29:
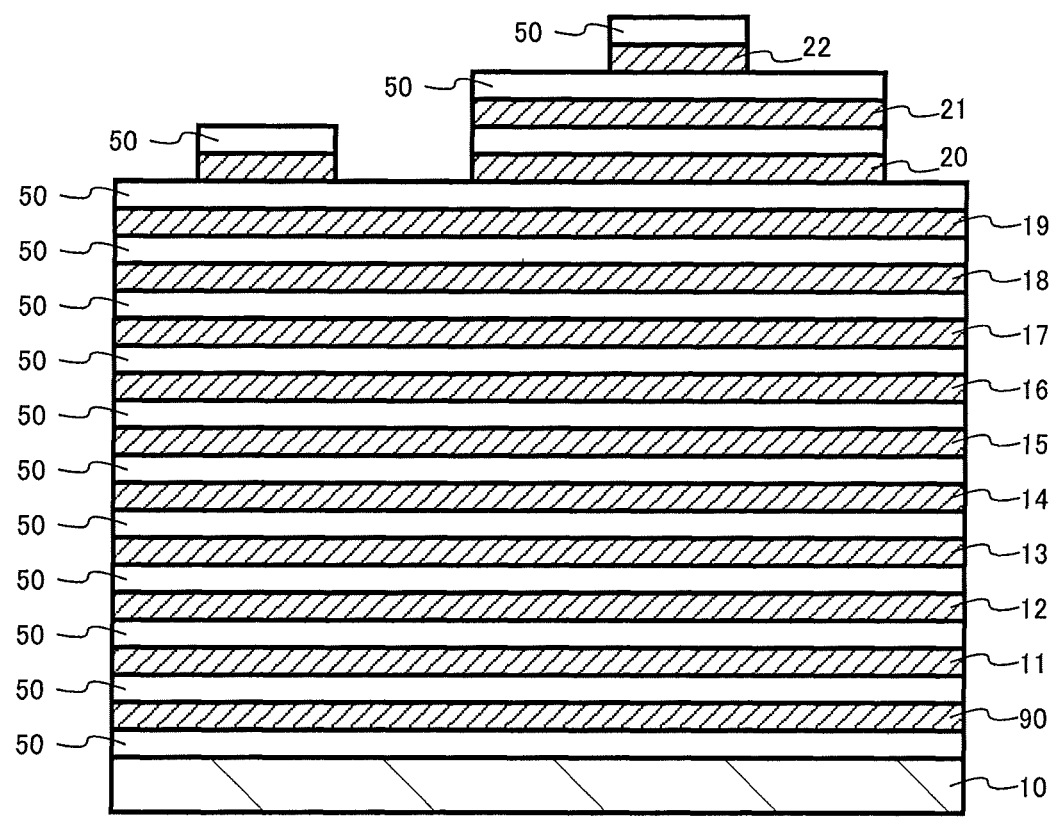
FIG. 29 is a schematic cross-sectional view in the process of manufacturing the storage device according to the second embodiment.

Next, in the etching process, the twelfth conductive layer 22 and the tenth conductive layer 20 are etched by using the resist 82 as a mask (FIG. 28).

Next, a terrace with four steps in the y direction is formed in the contact region 123 by two lithography processes and an etching process (FIG. 29) where the resist 82 is removed.

Figure 30:
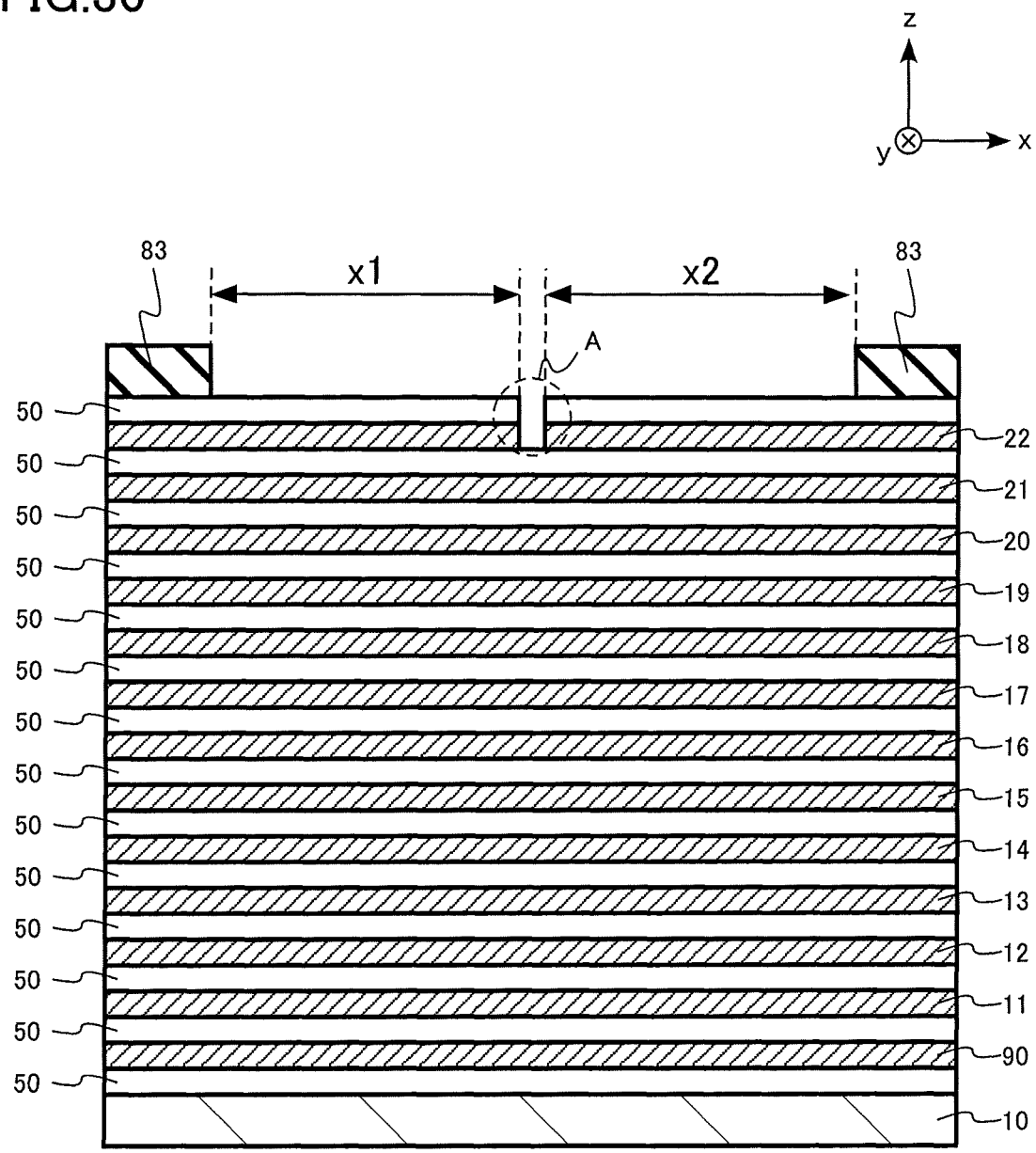
FIG. 30 is a schematic cross-sectional view in the process of manufacturing the storage device according to the second embodiment.

Next, a resist 83 is patterned on the twelfth conductive layer 22 in the lithography process (FIG. 30). The resist 83 covers a region to be the third region 123c. The mark region 125 including the recessed shape A is not covered with the resist 83.

Next, using a CD-SEM, for example, a distance x1 and a distance x2 between the recessed shape A and the resist 83 are measured. If the distance x1 and the distance x2 in design are equal, it is possible to calculate the misalignment amount between the recessed shape A and the resist 83 by, for example, $\Delta x/2=(x2-x1)/2$.

Further, a deviation amount of a resist dimension can be obtained from the design value from, for example, the designed distance x1 and the measured distance x1, and the designed distance x2 and the measured distance x2.

For example, when the misalignment amount or the deviation amount of the resist dimension exceeds an allowable range, the resist 83 is removed, and the lithography process is performed again. At the time of the lithography process again, the alignment or the exposure amount is corrected and optimized.

Figure 31:
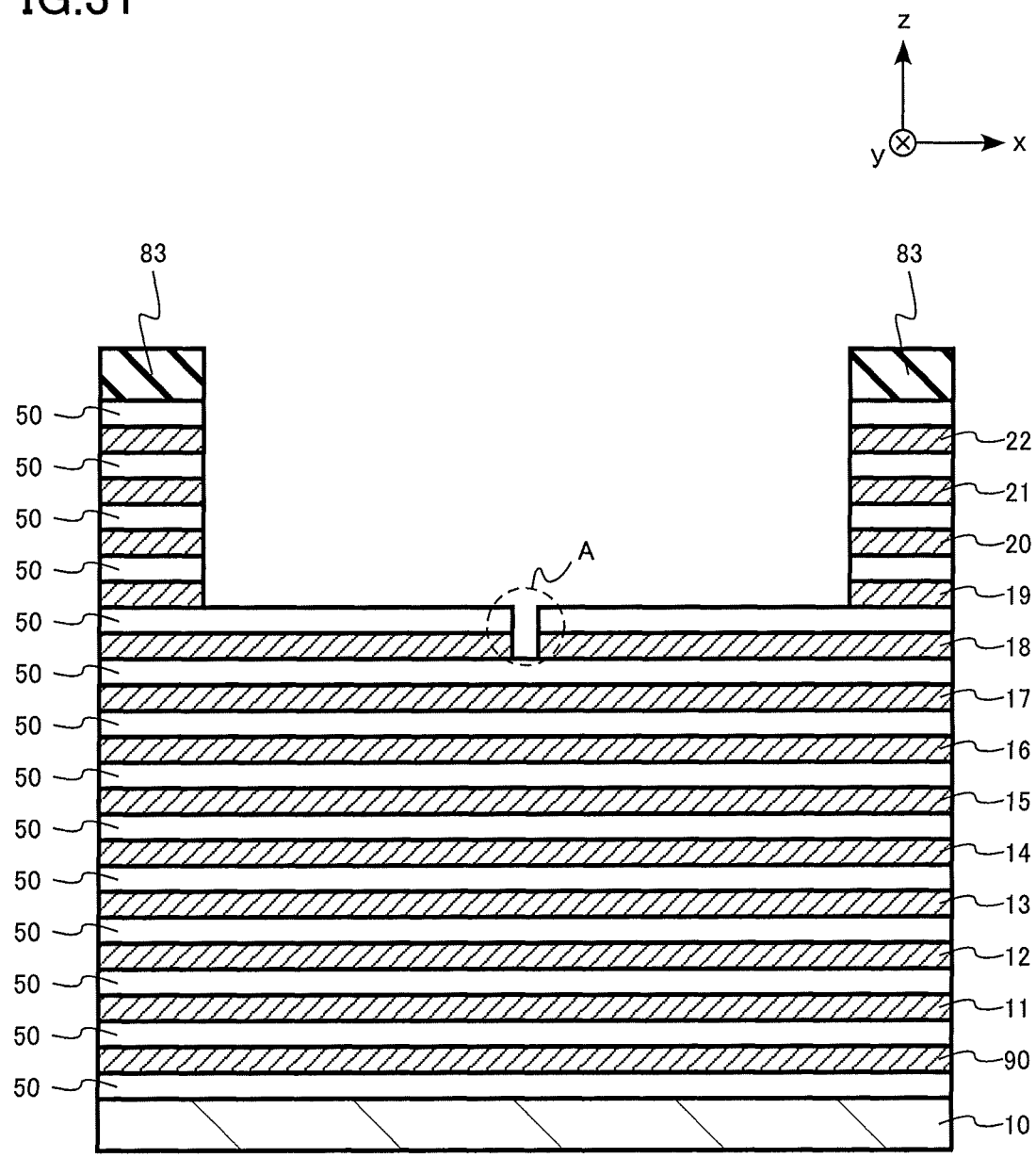
FIG. 31 is a schematic cross-sectional view in the process of manufacturing the storage device according to the second embodiment.

Next, in the etching process, the twelfth conductive layer 22, the eleventh conductive layer 21, the tenth conductive layer 20, and the ninth conductive layer 19 are etched by using the resist 83 as a mask (FIG. 31). At this time, the recessed shape A is transferred to the eighth conductive layer 18 and remains.

Figure 32:
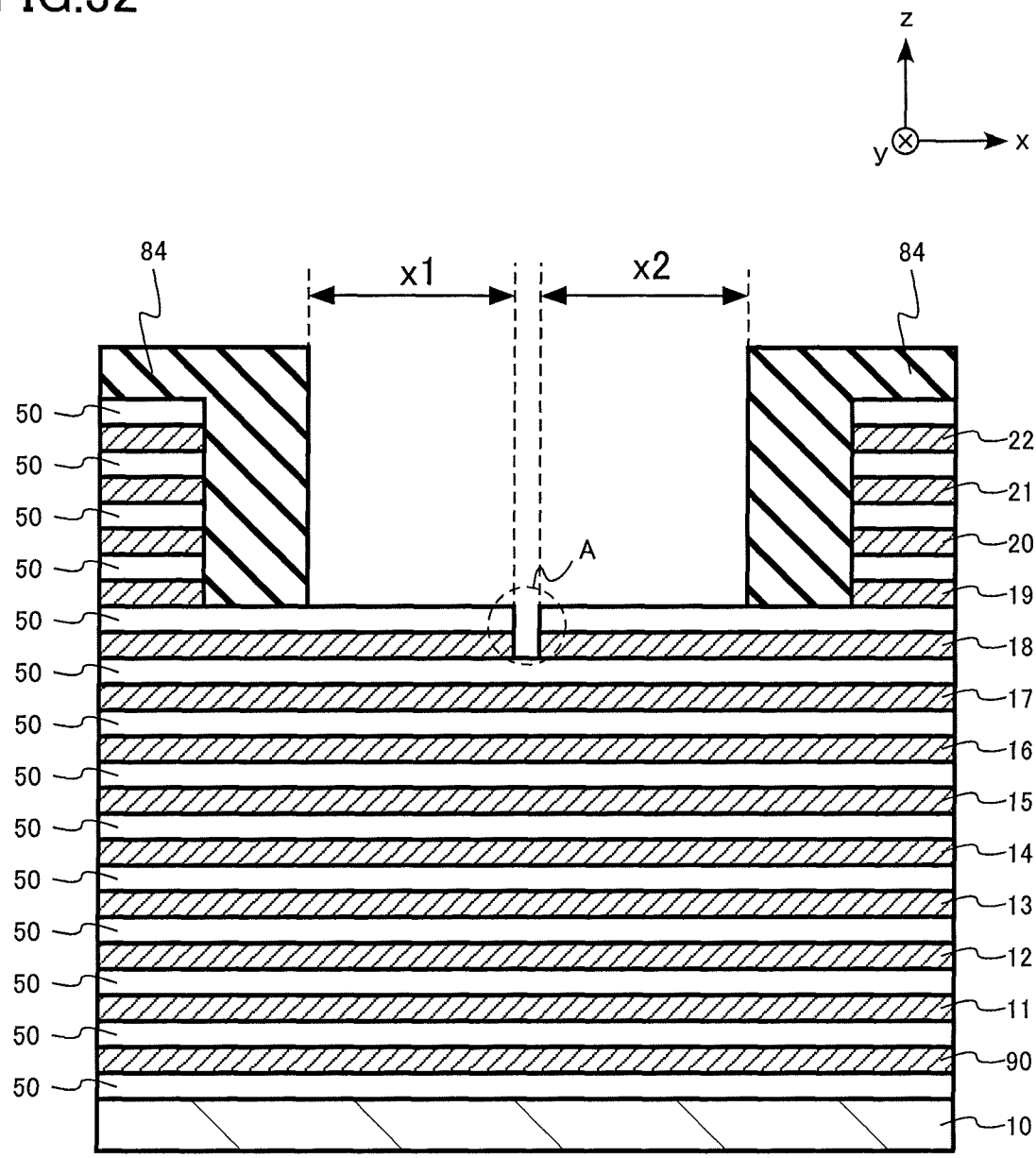
FIG. 32 is a schematic cross-sectional view in the process of manufacturing the storage device according to the second embodiment.

Next, the resist 83 is removed, and a resist 84 is patterned in a lithography process (FIG. 32). The resist 84 covers regions to be the third region 123c and the second region 123b. The mark region 125 including the recessed shape A is not covered with the resist 84.

Next, using a CD-SEM, for example, the distance x1 and the distance x2 between the recessed shape A and the resist 84 are measured. It is possible to obtain the misalignment amount between the recessed shape A and the resist 84 or the deviation amount of a resist dimension. For example, when the misalignment amount or the deviation amount of the resist dimension exceeds an allowable range, the resist 84 is removed, and the lithography process is performed again.

Figure 33:
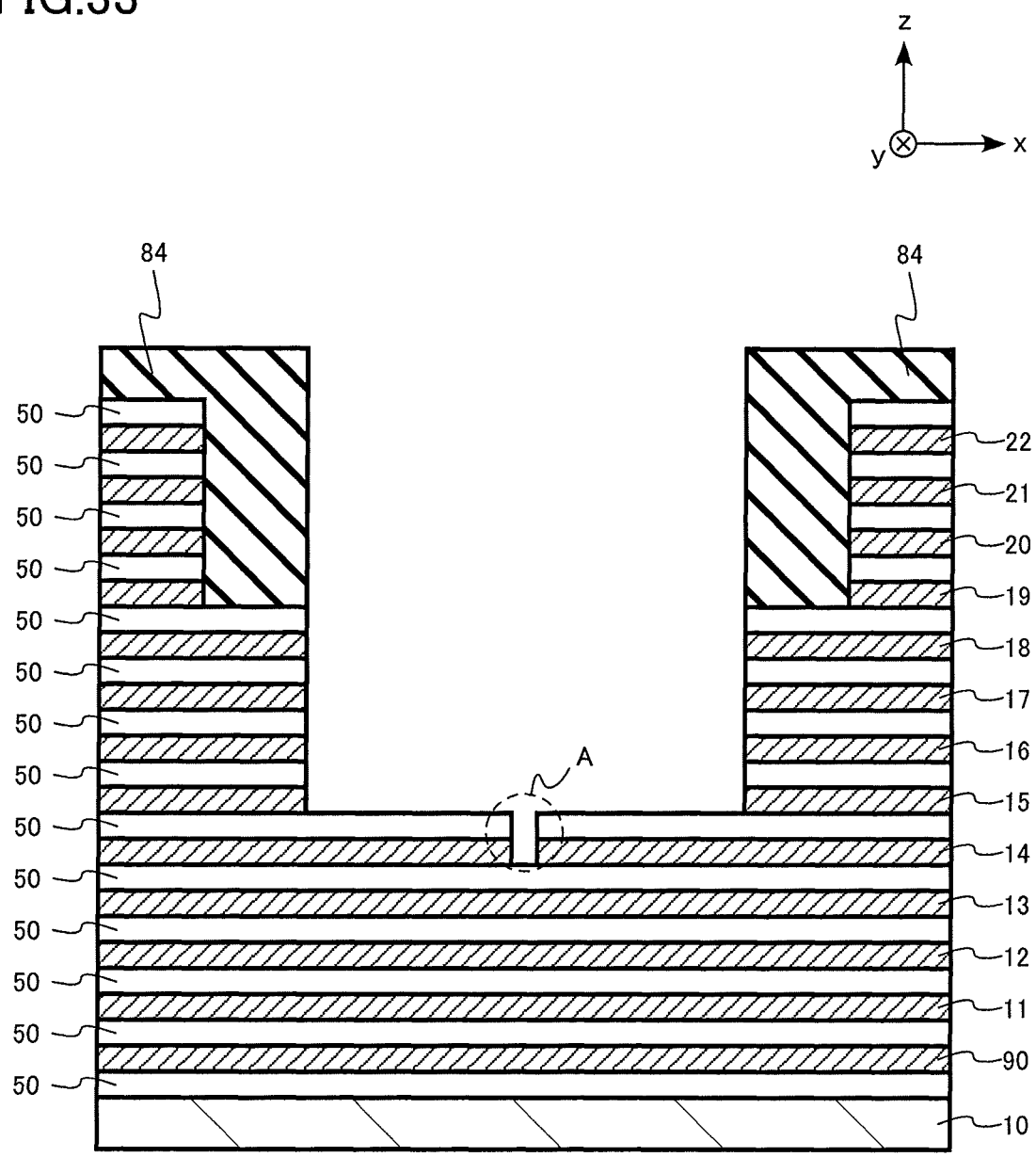
FIG. 33 is a schematic cross-sectional view in the process of manufacturing the storage device according to the second embodiment.

Next, in the etching process, the eighth conductive layer 18, the seventh conductive layer 17, the sixth conductive layer 16, and the fifth conductive layer 15 are etched by using the resist 84 as a mask (FIG. 33). At this time, the recessed shape A is transferred to the fourth conductive layer 14 and remains.

Figure 34:
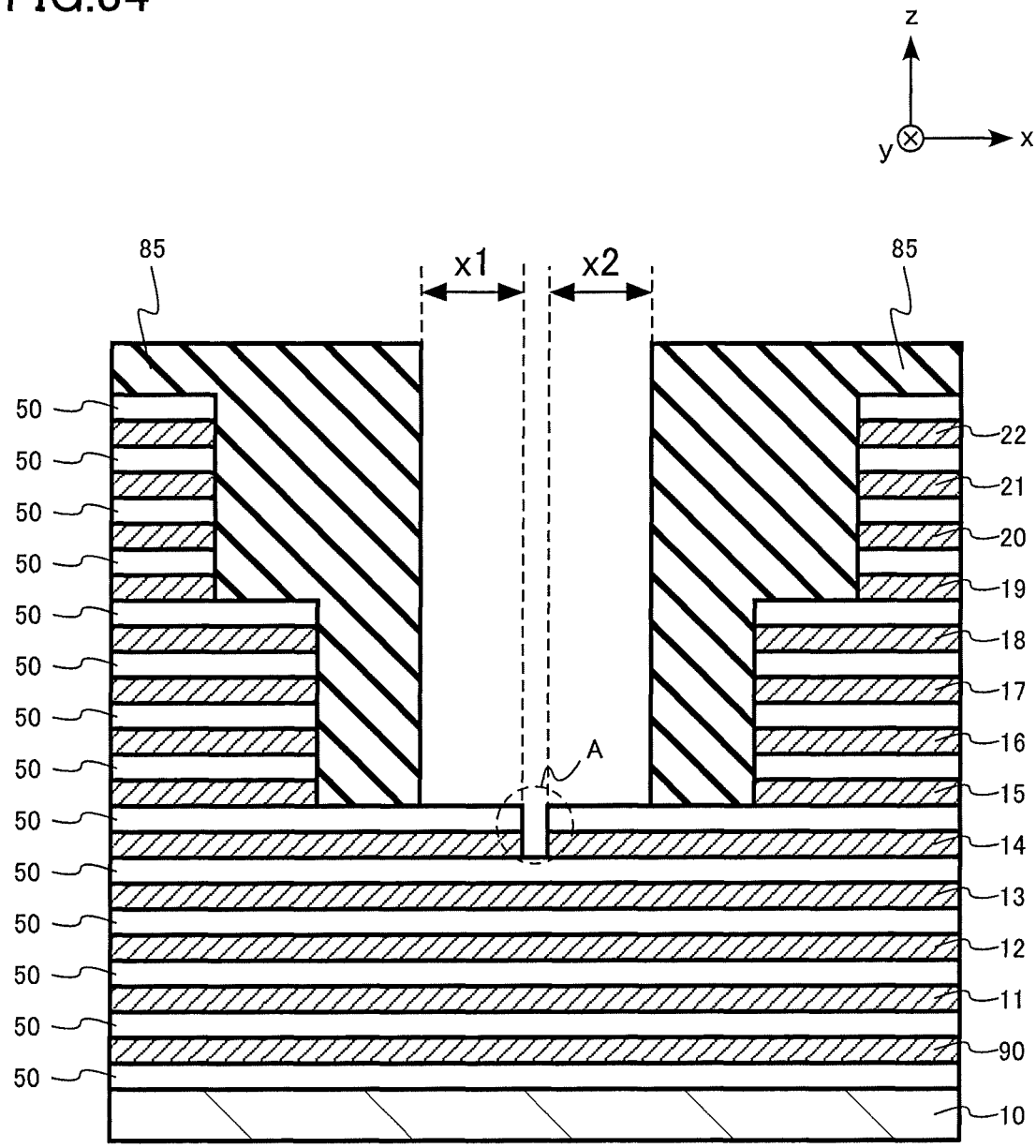
FIG. 34 is a schematic cross-sectional view in the process of manufacturing the storage device according to the second embodiment.

Next, the resist 84 is removed, and a resist 85 is patterned in the lithography process (FIG. 34). The resist 85 covers regions to be the third region 123c, the second region 123b, and the first region 123a. The mark region 125 including the recessed shape A is not covered with the resist 85.

Next, using a CD-SEM, for example, the distance x1 and the distance x2 between the recessed shape A and the resist 85 are measured. It is possible to obtain the misalignment amount between the recessed shape A and the resist 85 or the deviation amount of the resist dimension. For example, when the misalignment amount or the deviation amount of the resist dimension exceeds an allowable range, the resist 85 is removed, and the lithography process is performed again.

Figure 35:
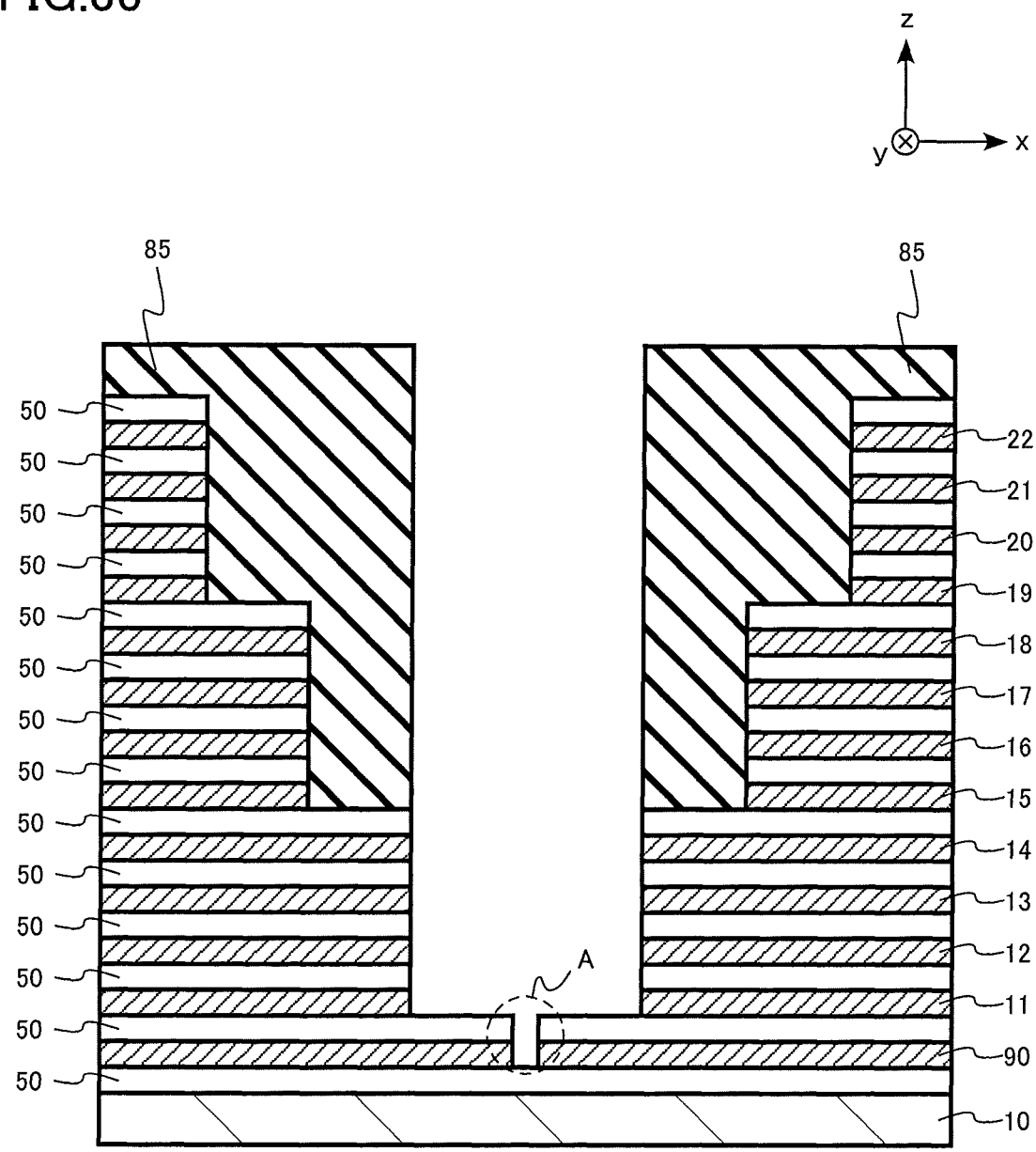
FIG. 35 is a schematic cross-sectional view in the process of manufacturing the storage device according to the second embodiment.

Next, in the etching process, the fourth conductive layer 14, the third conductive layer 13, the second conductive layer 12, and the first conductive layer 11 are etched by using the resist 85 as a mask (FIG. 35). At this time, the recessed shape A is transferred to the dummy conductive layer 90 and remains.

Figure 36:
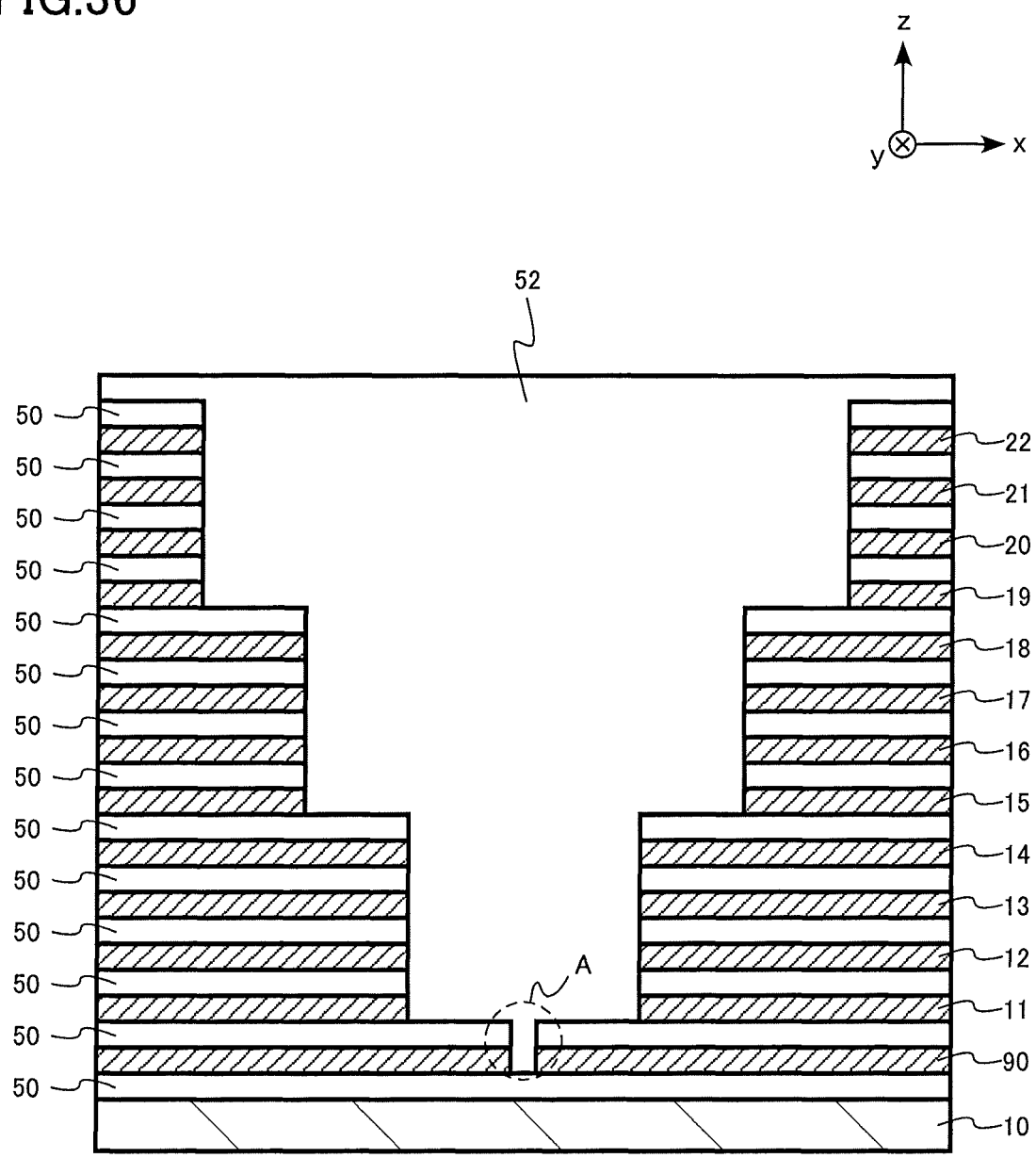
FIG. 36 is a schematic cross-sectional view in the process of manufacturing the storage device according to the second embodiment.

Next, the resist 85 is removed, and the second insulating layer 52 is deposited (FIG. 36). Thereafter, contact holes are formed in the second insulating layer 52 using a known process technique, and the first to twelfth contact electrodes 31 to 42 are formed.

According to the above-described manufacturing method, the contact region 123 having a step structure is formed on the first to twelfth conductive layers by using a plurality of lithography processes and a plurality of etching processes. Twelve terraces connecting the contact electrodes to the first to twelfth conductive layers can be formed in five lithography processes.

According to the above-described manufacturing method, the contact region 123 and the mark region 125 of the second embodiment indicated in FIGS. 17, 19, 20, 21, and 22 are formed.

Functions and effects according to the second embodiment will be described below.

As described in the first embodiment, in order to reduce the area of the contact region, it is important to precisely control alignment of the conductive layers forming the terraces in the lithography process and to form the terraces at a predetermined position.

In the second embodiment, it is possible to control the alignment and control the resist dimension by using the mark region 125 located near the contact region 123 in the lithography process of patterning the conductive layers forming the terraces.

Since the mark region 125 close to the contact region 123 is used, it is possible to control a misalignment amount of the contact region 123 with high accuracy.

Further, in a plurality of the lithography processes of patterning the conductive layers forming the terraces, it is possible to control the alignment and control the resist dimension using the common mark region 125. Therefore, the alignment accuracy of patterns to be patterned in a plurality of lithography processes is improved.

For example, as described above, in three lithography processes for forming the third region 123c, the second region 123b, and the first region 123a, the common recessed shape A is used as a measurement mark for controlling misalignment. Therefore, the alignment accuracy of end portions in the x direction of the third region 123c, the second region 123b, and the first region 123a is improved, and a terrace having a narrow width in the x direction can be formed.

Although the case where the pattern viewed from an upper surface of the recessed shape A is rectangular has been described, it is not limited to the rectangular shape, and other patterns may be used.

In addition, although the case where the mark region 125 is provided between the first stacked body 61 and the second stacked body 62 has been described as an example, the mark region 125 may be provided at any other position, for example, on the y direction side of the contact region 123.

Although the case of measuring the misalignment in the x direction using the mark region 125 has been described as an example, the misalignment in the y direction may be measured using the mark region 125.

The dummy conductive layer 90 may not be provided. In this case, the mark region 125 may not remain as a distinct shape in the final product.

Although the case where the dummy conductive layer 90 is provided between the first conductive layer 11 and the substrate 10 has been described as an example, it is also possible to provide the dummy conductive layer 90 on the twelfth conductive layer 22. In this case, first, the recessed shape A is provided in the dummy conductive layer 90.

In the case where the dummy conductive layer 90 is provided on the twelfth conductive layer 22, for example, the dummy conductive layer becomes the nth conductive layer, and the twelfth conductive layer 22 becomes the (n−1)th conductive Layer. The recessed shape A, for example, is finally transferred to and remains on the first conductive layer 11. The recessed shape A is provided on the same plane as the first conductive layer 11.

Although the case where the mark region 125 including the recessed shape A is not covered with a resist has been described as an example, for example, even if the mark region 125 is covered with a resist, it is possible to use the mark region 125 as a mark for measuring the misalignment amount or the deviation amount of a resist dimension if a sufficient step is formed on a resist surface.

As described above, according to the storage device and the storage device manufacturing method according to the second embodiment, it is possible to reduce the area of the contact region by precisely controlling the alignment and the dimension in the lithography process for forming a step structure of the contact region. Therefore, it is possible to provide a storage device capable of reducing chip area.

Third Embodiment

A storage device of a third embodiment is different from that of the second embodiment in that it includes a portion including a projected shape. Hereinafter, description of contents already described in the second embodiment may be omitted.

The storage device of the third embodiment is a resistance change type memory. A memory cell array 120 of the third embodiment has a three-dimensional structure in which memory cells MC are three-dimensionally disposed.

Figure 37:
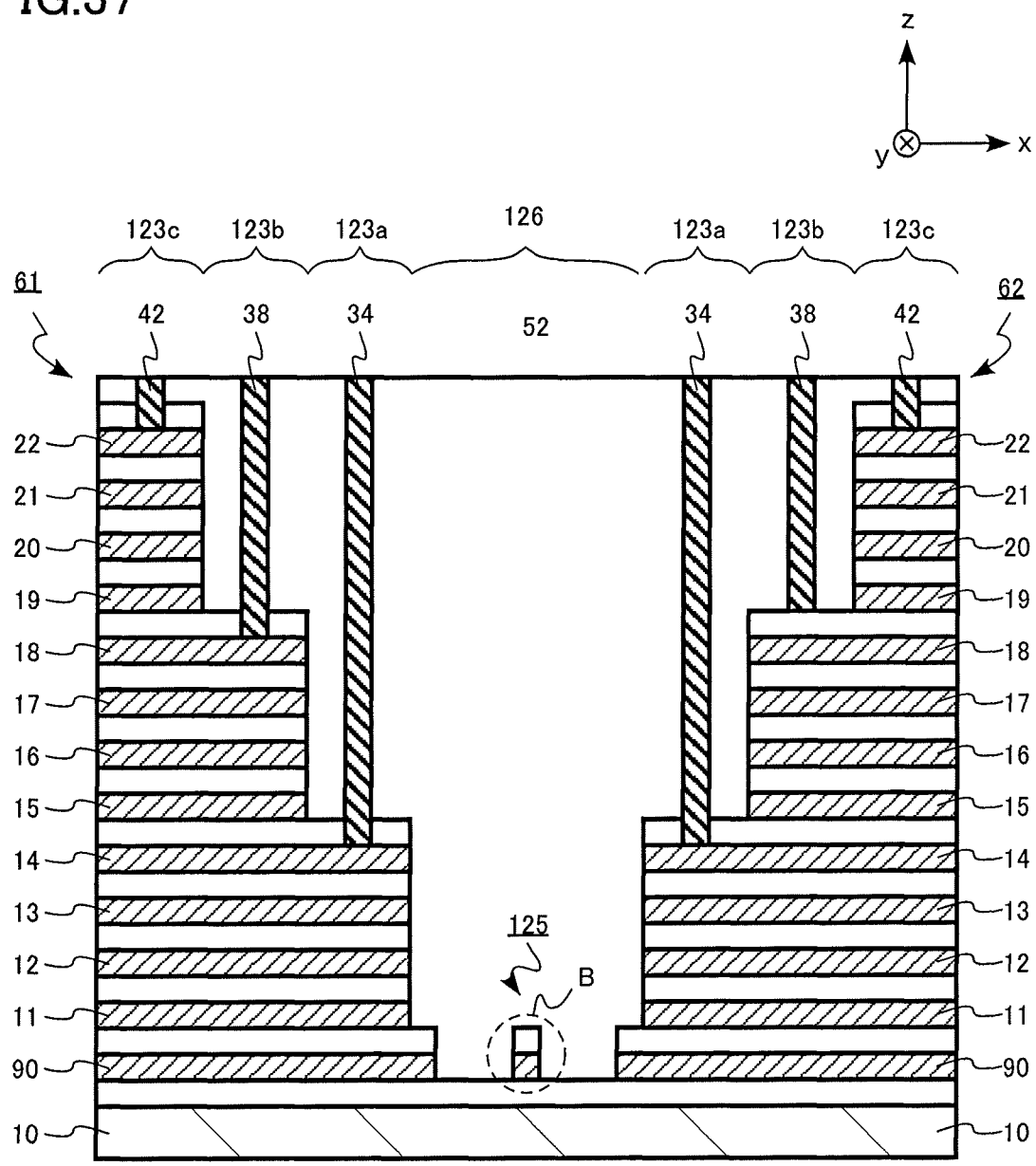
FIG. 37 is a schematic cross-sectional view of a contact region, a mark region, and a peripheral portion of a stacked body according to a third embodiment.

FIG. 37 is a schematic cross-sectional view of a contact region 123, a mark region 125, and a stacked body peripheral portion 126 according to the third embodiment. FIG. 37 corresponds to a cross-sectional view taken along line JJ' of FIG. 17.

The mark region 125 is provided in a peripheral portion of the first stacked body 61, that is, in the stacked body peripheral portion 126. The mark region 125 is provided between the first stacked body 61 and the second stacked body 62.

The mark region 125 has a projected shape B. The projected shape B is provided in a dummy conductive layer 90. The pattern seen from an upper surface of the projected shape B is, for example, a rectangular shape.

The dummy conductive layer 90 is present on a side of the projected shape B. The dummy conductive layer 90 is, for example, a conductor made of the same material as the first to twelfth conductive layers 11 to 22. A distance d between the contact region 123 and the mark region 125 is, for example, 10 μm or less.

The projected shape B is provided closer to a substrate 10 than the first conductive layer 11.

The projected shape B provided in the mark region 125 functions as a measurement mark. The projected shape B provided in the mark region 125 functions as, for example, an alignment measurement mark (overlay mark) or a dimension measurement mark in a lithography process.

Next, a storage device manufacturing method according to the third embodiment will be described.

FIGS. 38, 39, 40, 41, 42, 43, 44, and 45 are schematic cross-sectional views in the process of manufacturing the storage device of the third embodiment. FIGS. 38, 39, 40, 41, 42, 43, 44, and 45 are cross sections corresponding to JJ' cross section of FIG. 17.

The storage device manufacturing method according to the third embodiment includes, forming, on a substrate, first to nth (n is an integer of 4 or more) conductive layers stacked in a direction perpendicular to a surface of the substrate, forming a portion having a projected shape by processing the nth conductive layer, forming a region in which the first to (n−1)th conductive layers have a step structure by using a plurality of lithography processes and a plurality of etching processes, and forming the first to (n−1)th electrodes connected to the first to (n−1)th conductive layers in the region and extending in a direction perpendicular to the surface of the substrate, and the portion is not covered with a resist in a part of the lithography processes.

In the storage device manufacturing method according to the third embodiment, the region having a step structure is also formed in the nth conductive layer. In addition, the nth electrode is formed.

Hereinafter, the case where n=12 will be described as an example.

Among the manufacturing methods of a resistance change type memory according to the third embodiment, the methods of manufacturing the contact region 123 and the mark region 125 will be described in detail below.

First, the dummy conductive layer 90, the first to twelfth conductive layers 11 to 22 are stacked on the substrate 10 in the z direction perpendicular to the surface of the substrate 10 so as to interpose first insulating layers 50 between them.

Figure 38:
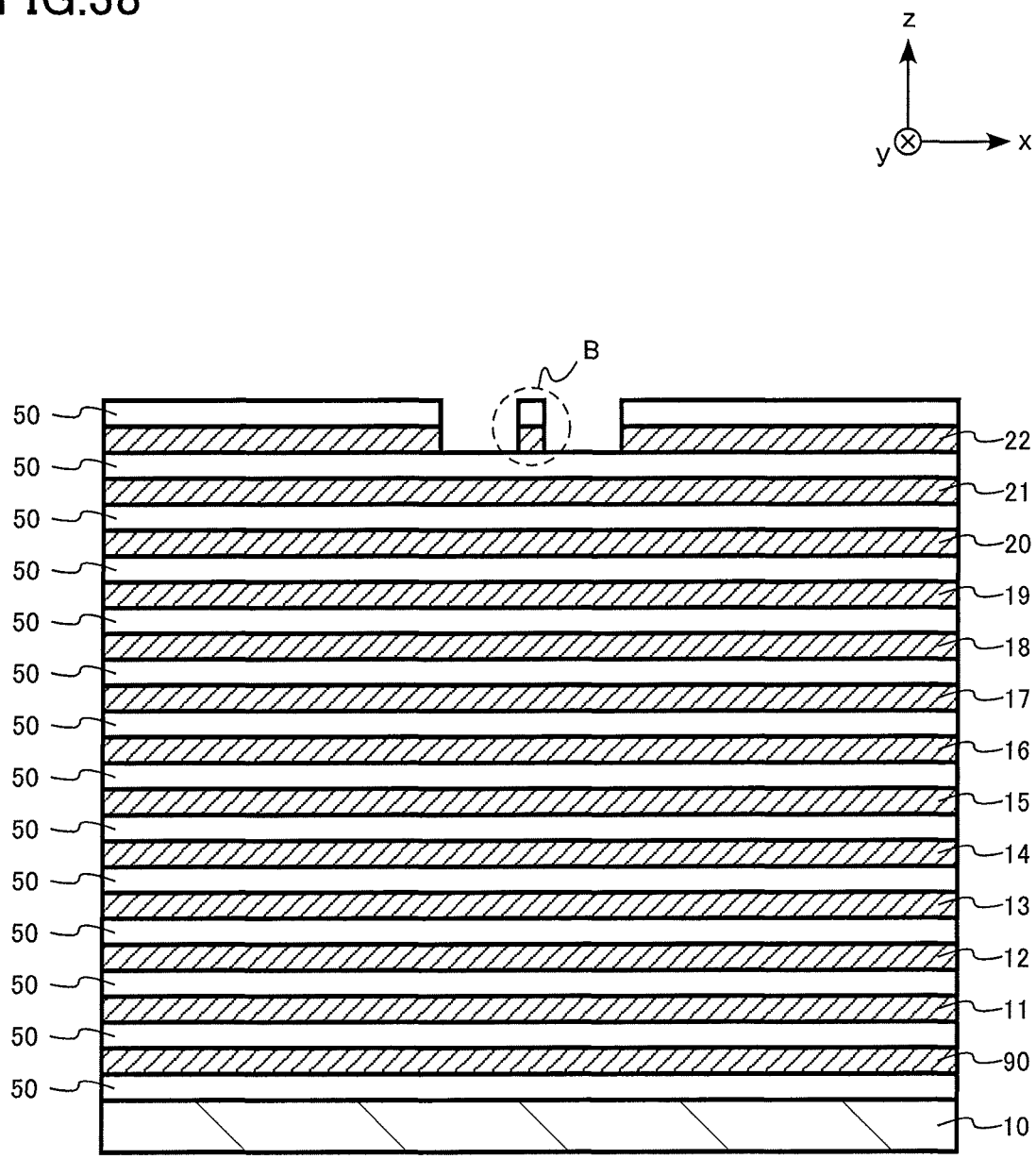
FIG. 38 is a schematic cross-sectional view in the process of manufacturing the storage device according to the third embodiment.

Next, a portion including the projected shape B is formed in the twelfth conductive layer 22 by a known lithography process and etching process (FIG. 38). The projected shape B is provided in a region to be the stacked body peripheral portion 126.

The method of forming terraces with four steps in the y direction in the contact region 123 is the same as the method in the second embodiment, and therefore description thereof will be omitted.

Figure 39:
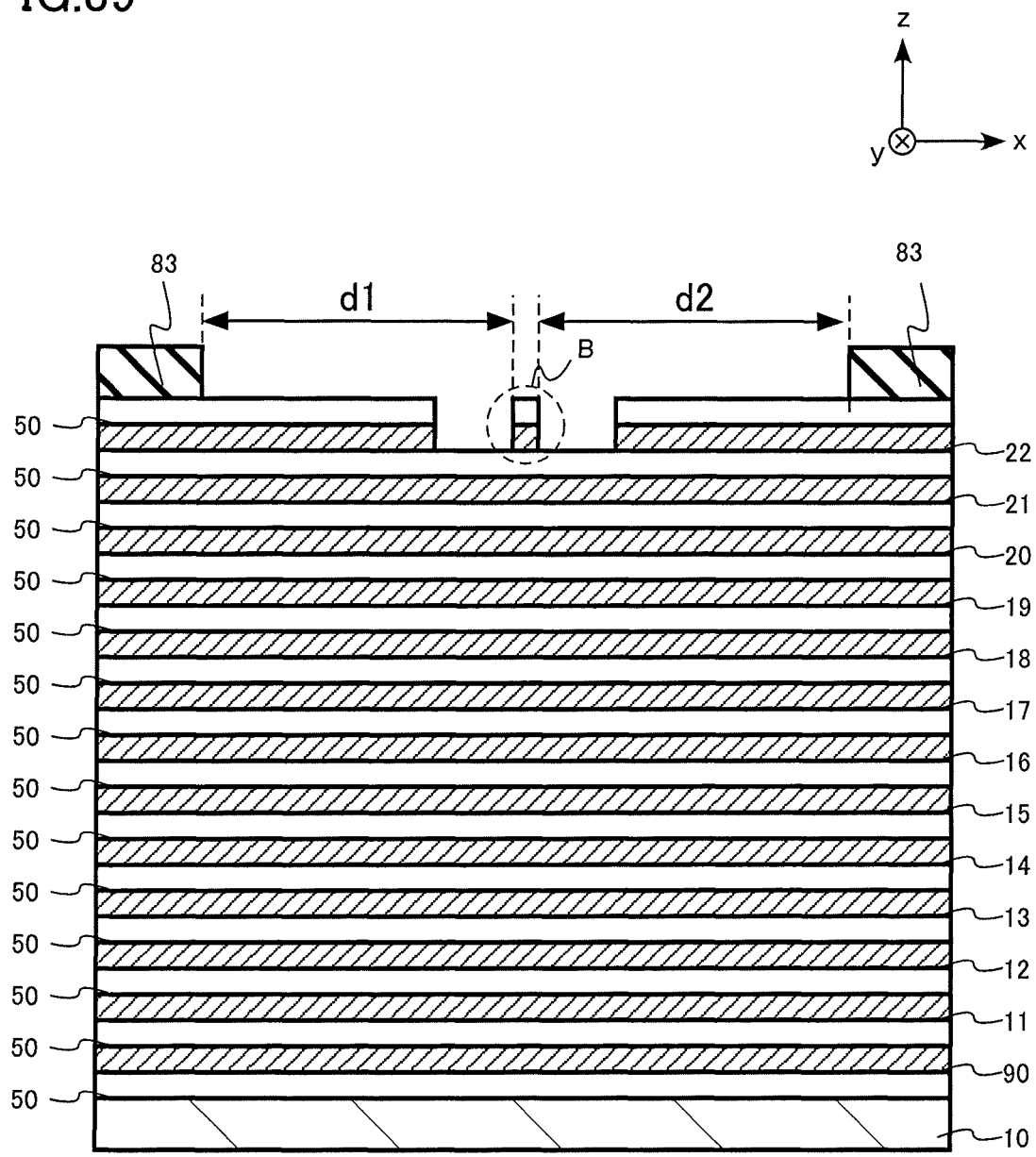
FIG. 39 is a schematic cross-sectional view in the process of manufacturing the storage device according to the third embodiment.

Next, a resist 83 is patterned on the twelfth conductive layer 22 in the lithography process (FIG. 39). The resist 83 covers a region to be the third region 123c. The mark region 125 including the projected shape B is not covered with the resist 83.

Next, using a CD-SEM, for example, a distance x1 and a distance x2 between the projected shape B and the resist 83 are measured. If the distance x1 and the distance x2 in design are equal, it is possible to calculate a misalignment amount between the projected shape B and the resist 83 by, for example, $\Delta x/2 = (x2-x1)/2$.

Further, a deviation amount of a resist dimension can be obtained from the design value from, for example, the designed distance x1 and the measured distance x1, and the designed distance x2 and the measured distance x2.

For example, when the misalignment amount or the deviation amount of the resist dimension exceeds an allowable range, the resist 83 is removed, and the lithography process is performed again. At the time of the lithography process again, the alignment or the exposure amount is reviewed.

Figure 40:
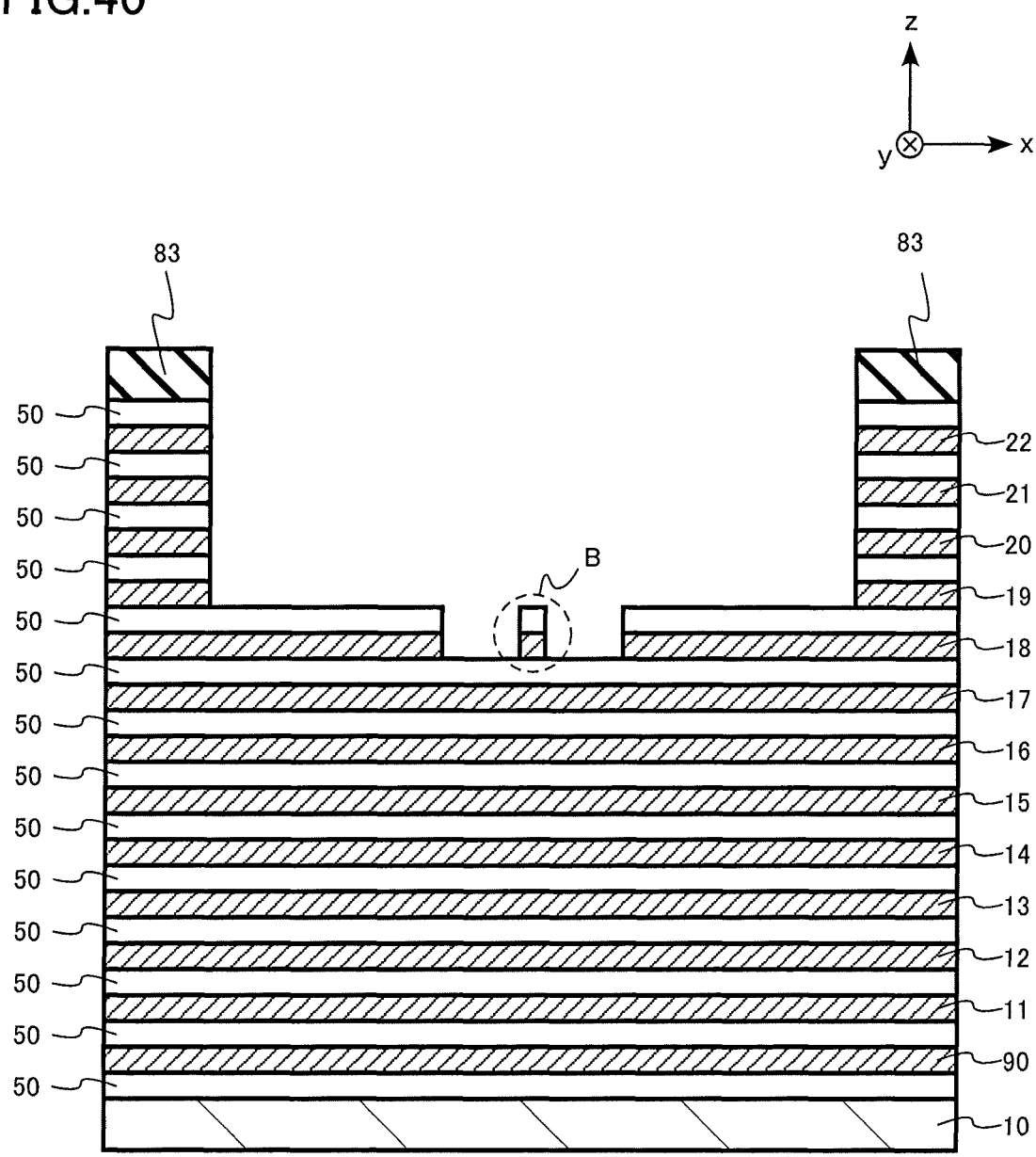
FIG. 40 is a schematic cross-sectional view in the process of manufacturing the storage device according to the third embodiment.

Next, in the etching process, the twelfth conductive layer 22, the eleventh conductive layer 21, the tenth conductive layer 20, and the ninth conductive layer 19 are etched by using the resist 83 as a mask (FIG. 40). At this time, the projected shape B is transferred to the eighth conductive layer 18 and remains.

Figure 41:
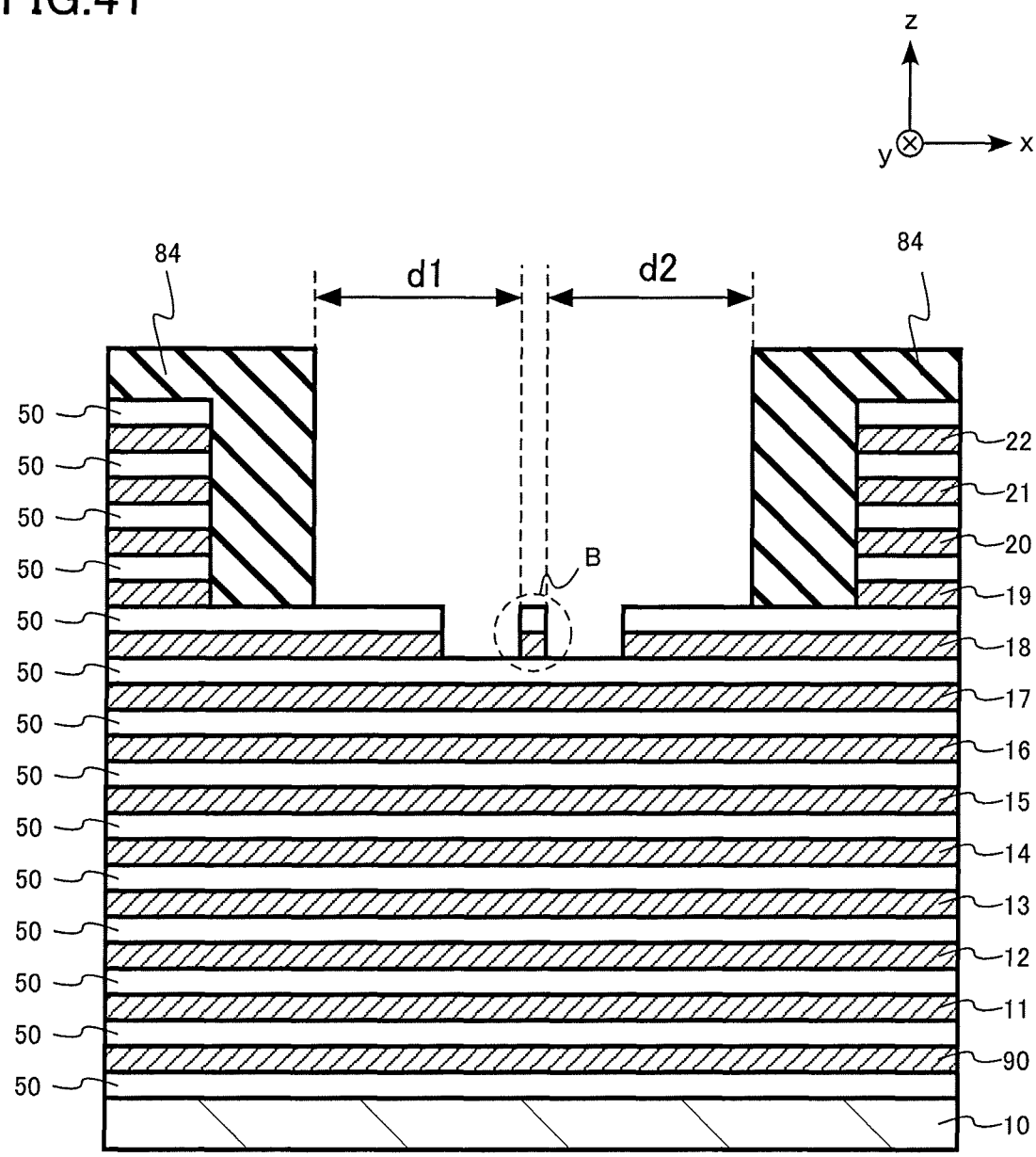
FIG. 41 is a schematic cross-sectional view in the process of manufacturing the storage device according to the third embodiment.

Next, the resist 83 is removed, and a resist 84 is patterned in the lithography process (FIG. 41). The resist 84 covers regions to be the third region 123c and the second region 123b. The mark region 125 including the projected shape B is not covered with the resist 84.

Next, using a CD-SEM, for example, the distance x1 and the distance x2 between the projected shape B and the resist 84 are measured. It is possible to obtain the misalignment amount between the projected shape B and the resist 84 or a deviation amount of a resist dimension. For example, when the misalignment amount or the deviation amount of the resist dimension exceeds an allowable range, the resist 84 is removed, and the lithography process is performed again.

Figure 42:
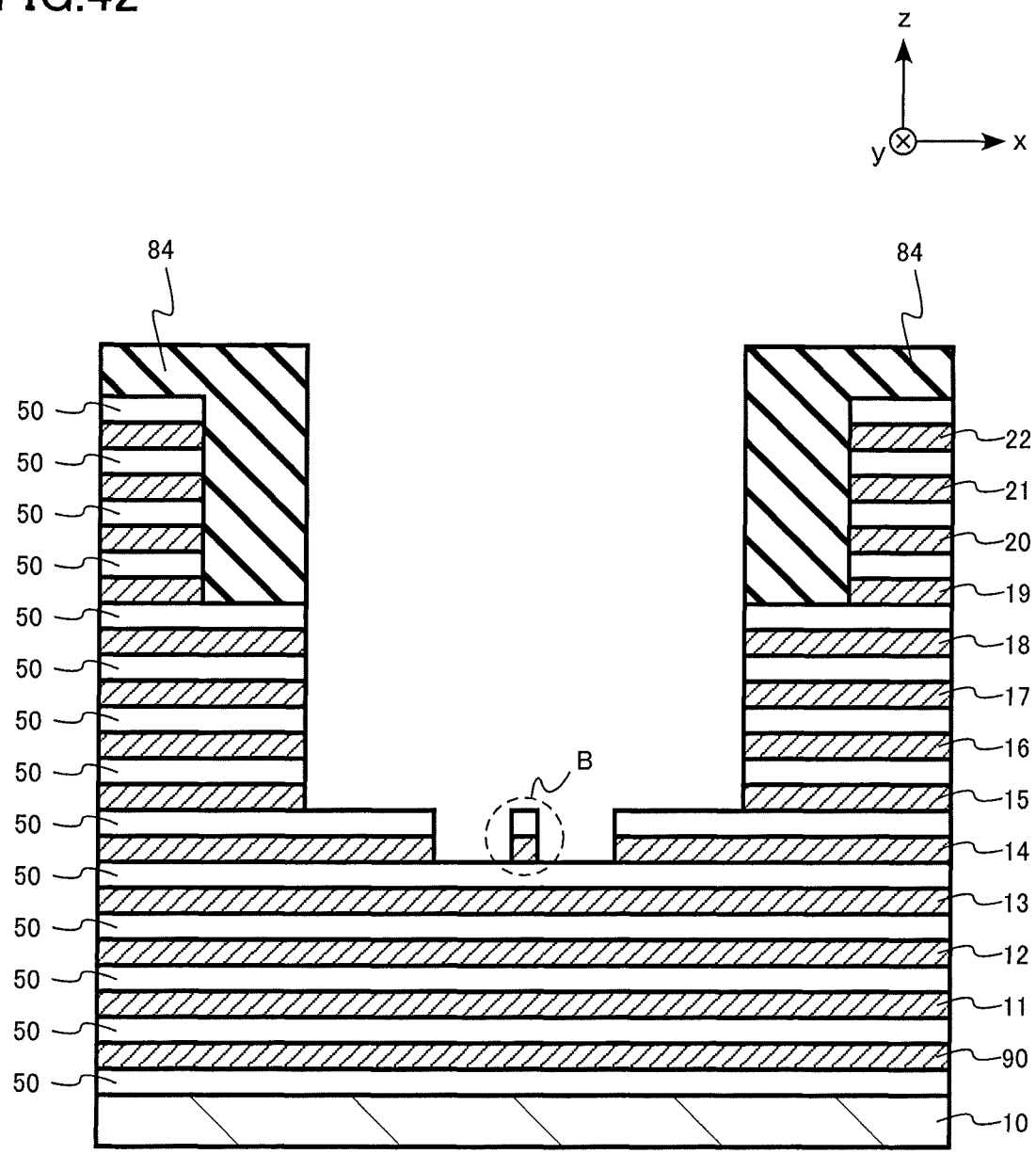
FIG. 42 is a schematic cross-sectional view in the process of manufacturing the storage device according to the third embodiment.

Next, in the etching process, the eighth conductive layer 18, the seventh conductive layer 17, the sixth conductive layer 16, and the fifth conductive layer 15 are etched by using the resist 84 as a mask (FIG. 42). At this time, the projected shape B is transferred to the fourth conductive layer 14 and remains.

Figure 43:
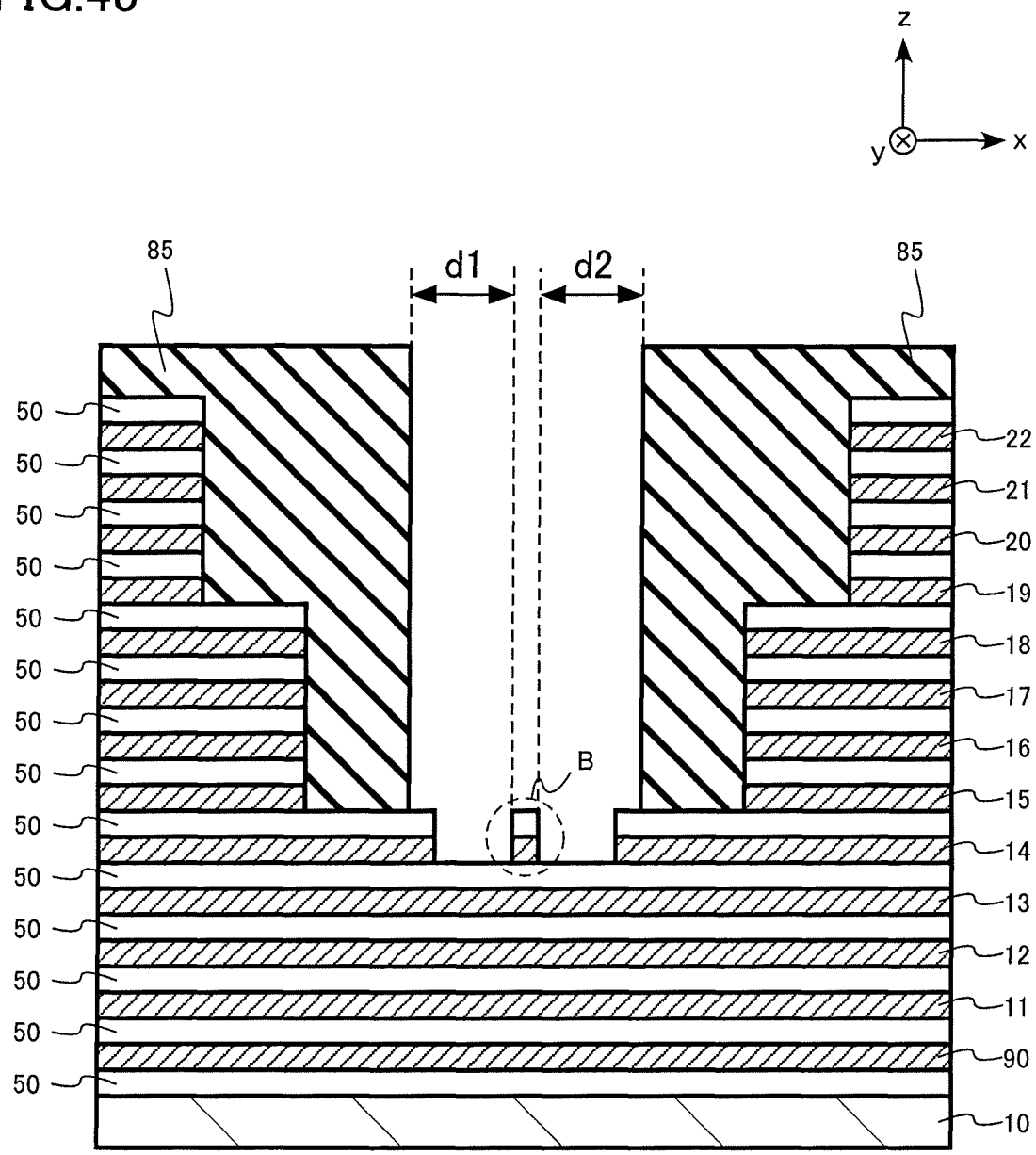
FIG. 43 is a schematic cross-sectional view in the process of manufacturing the storage device according to the third embodiment.

Next, the resist 84 is removed, and a resist 85 is patterned in the lithography process (FIG. 43). The resist 85 covers regions to be the third region 123c, the second region 123b, and the first region 123a. The mark region 125 including the projected shape B is not covered with the resist 85.

Next, using a CD-SEM, for example, the distance x1 and the distance x2 between the projected shape B and the resist 85 are measured. It is possible to obtain the misalignment amount between the projected shape B and the resist 85 or the deviation amount of the resist dimension. For example, when the misalignment amount or the deviation amount of the resist dimension exceeds an allowable range, the resist 85 is removed, and the lithography process is performed again.

Figure 44:
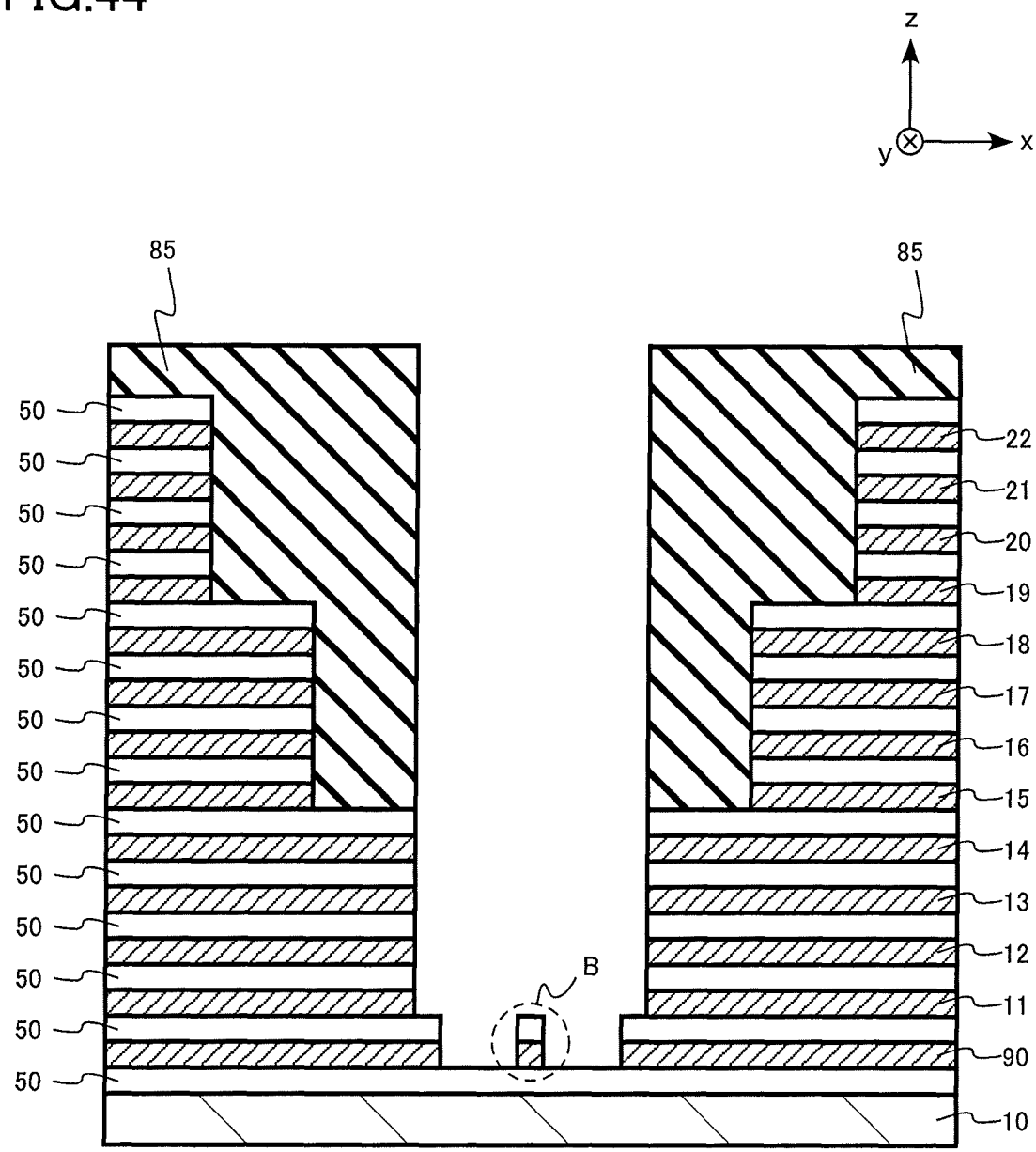
FIG. 44 is a schematic cross-sectional view in the process of manufacturing the storage device according to the third embodiment.

Next, in the etching process, the fourth conductive layer 14, the third conductive layer 13, the second conductive layer 12, and the first conductive layer 11 are etched by using the resist 85 as a mask (FIG. 44). At this time, the projected shape B is transferred to the dummy conductive layer 90 and remains.

Figure 45:
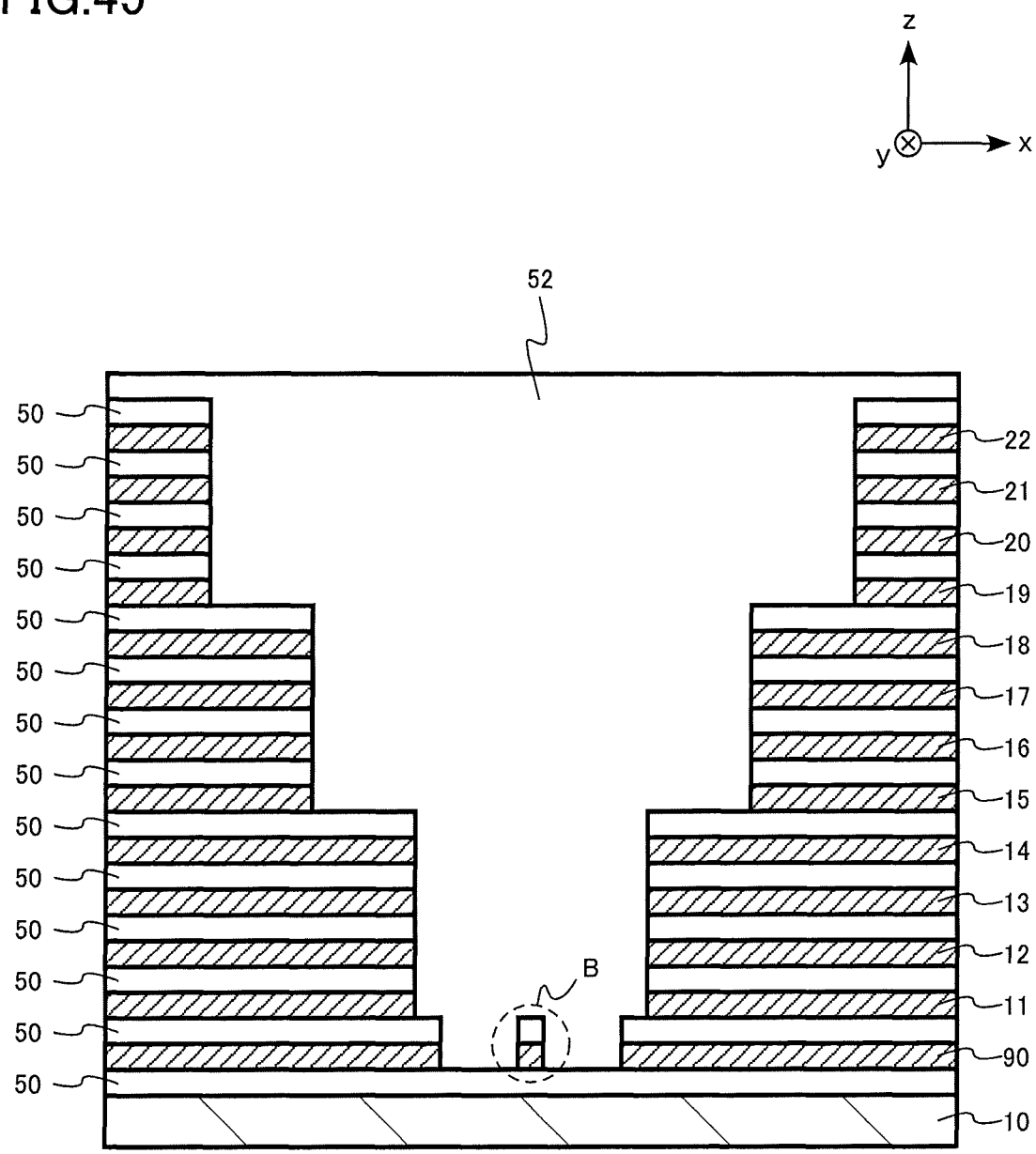
FIG. 45 is a schematic cross-sectional view in the process of manufacturing the storage device according to the third embodiment.

Next, the resist 85 is removed, and a second insulating layer 52 is deposited (FIG. 45). Thereafter, contact holes are formed in the second insulating layer 52 using a known process technique, and the first to twelfth contact electrodes 31 to 42 are formed.

According to the above-described manufacturing method, the contact region 123 having a step structure is formed on the first to twelfth conductive layers by using a plurality of lithography processes and a plurality of etching processes. It is possible to form twelve terraces connecting the contact electrodes to the first to twelfth conductive layers.

By the above-described manufacturing method, the contact region 123 and the mark region 125 of the third embodiment illustrated in FIG. 37 are formed.

Although the case where the pattern viewed from an upper surface of the projected shape B is rectangular has been described, it is not limited to the rectangular shape, and other patterns may be used.

In addition, although the case where the mark region 125 is provided between the first stacked body 61 and the second stacked body 62 has been described as an example, the mark region 125 may be provided at any other position, for example, on the y direction side of the contact region 123.

The dummy conductive layer 90 may not be provided. In this case, the mark region 125 may not remain as a distinct shape in the final product.

Although the case where the dummy conductive layer 90 is provided between the first conductive layer 11 and the substrate 10 has been described as an example, it is also possible to provide the dummy conductive layer 90 on the twelfth conductive layer 22. In this case, first, the projected shape B is provided in the dummy conductive layer 90.

In the case where the dummy conductive layer 90 is provided on the twelfth conductive layer 22, for example, the dummy conductive layer becomes the nth conductive layer, and the twelfth conductive layer 22 becomes the (n−1)th conductive Layer. For example, the projected shape B is finally transferred to and remains on the first conductive layer 11. The projected shape B is provided on the same plane as the first conductive layer 11.

As described above, according to the storage device and the storage device manufacturing method according to the third embodiment, as in the second embodiment, by precisely controlling the alignment and dimensions in the lithography process for forming a step structure of the contact region, the area of the contact region can be reduced. Therefore, it is possible to provide a storage device capable of reducing chip area.

In the first to third embodiments, the case where the contact electrodes are disposed in a direction (y direction) perpendicular to the extending direction (x direction) of the word lines WL, but the contact electrodes may be disposed in a direction (x direction) parallel to the extending direction (x direction) of the word lines WL.

However, in the case of the resistance change type memory as in the first to third embodiments, preferably the contact electrodes are arranged in a direction (y direction) perpendicular to the extending direction (x direction) of the word line WL. In other words, the contact region is preferably extended in a direction perpendicular to the extending direction of the word line WL.

For example, since the resistance change type memory is current driven, the wiring resistance of the word line WL has a large influence on the memory operation. Therefore, there is a limit to the length of the word line WL, and the size of the memory cell array tends to be longer in the y direction than in the x direction. Therefore, by extending the contact region in the y direction perpendicular to the extending direction of the word line WL, it is possible to effectively utilize the area inside a chip and to reduce chip area.

In the first to third embodiments, the case where the storage device is a resistance change type memory has been described as an example. However, a storage device having other three dimensional structures such as a three dimensional NAND flash memory in which a NAND string extends in the z direction can be applied to the present disclosure.

While certain embodiments have been described, these embodiments have been presented by way of example only, and are not intended to limit the scope of the inventions. Indeed, the storage device and the storage device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A storage device, comprising:
   a substrate;
   a stacked body provided on the substrate, the stacked body having first to nth (n is an integer of 3 or more) conductive layers stacked in a direction perpendicular to a surface of the substrate;
   a first region including one part of the stacked body, the first region having a first step structure including the first to the nth conductive layers;
   a second region including another part of the stacked body, the second region having a second step structure including at least a part of the first to the nth conductive layers, the second step structure being different from the first step structure; and
   first to nth electrodes provided in the first region, the first to nth electrodes connected to the first to nth conductive layers, the first to nth electrodes extending in a direction perpendicular to the surface of the substrate,
   wherein the second region is surrounded by the first region.

2. The storage device according to claim 1, wherein the second region has a kth ($1 \leq k < n-1$) conductive layer and a (k+1)th conductive layer having a width narrower than the kth conductive layer, and a distance between the (k+1)th conductive layer and the substrate is larger than a distance between the kth conductive layer and the substrate.

3. The storage device according to claim 2, wherein the second region does not include the (k+2)th to nth conductive layers, and the first region includes the (k+2)th to nth conductive layers.

4. The storage device according to claim 1, wherein the second region has a measurement mark.

5. A storage device, comprising:
   a substrate;
   a first stacked body provided on the substrate, the first stacked body having first to nth (n is an integer of 3 or more) conductive layers stacked in a direction perpendicular to a surface of the substrate;
   a region including a part of the first stacked body, the region having a step structure including the first to nth conductive layers;
   a portion provided in a peripheral portion of the first stacked body, the portion having a projected shape or a recessed shape provided on the same plane as a plane including the first conductive layer or on a side closer to the substrate than the plane including the first conductive layer;
   first to nth electrodes provided in the region, the first to nth electrodes connected to the first to nth conductive layers, the first to nth electrodes extending in a direction perpendicular to the surface of the substrate; and
   a conductor made of the same material as the first to nth conductive layers on a side of the portion.

6. The storage device according to claim 5, further comprising:
   a second stacked body provided on the substrate, the second stacked body having first to xth (x=n) conductive layers stacked in a direction perpendicular to a surface of the substrate,
   wherein the portion is located between the first stacked body and the second stacked body.

7. The storage device according to claim 5, wherein a distance between the region and the portion is 10 µm or less.

8. The storage device according to claim 5, wherein the portion has a measurement mark.

* * * * *